United States Patent
Hayashi et al.

(10) Patent No.: US 9,641,782 B2
(45) Date of Patent: *May 2, 2017

(54) METHOD OF VARYING GAIN, VARIABLE GAIN PHOTOELECTRIC CONVERSION DEVICE, VARIABLE GAIN PHOTOELECTRIC CONVERSION CELL, VARIABLE GAIN PHOTOELECTRIC CONVERSION ARRAY, METHOD OF READING OUT THEREOF, AND CIRCUIT THEREOF

(71) Applicant: NATIONAL INSTITUTE OF ADVANCED INDUSTRIAL SCIENCE AND TECHNOLOGY, Tokyo (JP)

(72) Inventors: Yutaka Hayashi, Tsukuba (JP); Yasushi Nagamune, Tsukuba (JP); Toshitaka Ota, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 681 days.

This patent is subject to a terminal disclaimer.

(21) Appl. No.: 14/027,326

(22) Filed: Sep. 16, 2013

(65) Prior Publication Data
US 2014/0008524 A1    Jan. 9, 2014

Related U.S. Application Data

(63) Continuation of application No. PCT/JP2012/056666, filed on Mar. 15, 2012.

(30) Foreign Application Priority Data

Mar. 17, 2011 (JP) ................... 2011-059884

(51) Int. Cl.
| | |
|---|---|
| H03F 3/08 | (2006.01) |
| H04N 5/378 | (2011.01) |
| H01L 27/146 | (2006.01) |
| H04N 5/355 | (2011.01) |
| H04N 5/374 | (2011.01) |

(52) U.S. Cl.
CPC ....... H04N 5/378 (2013.01); H01L 27/14609 (2013.01); H04N 5/355 (2013.01); H04N 5/374 (2013.01)

(58) Field of Classification Search
CPC .. H01L 27/14609; H04N 5/355; H04N 5/374; H04N 5/378
(Continued)

(56) References Cited

U.S. PATENT DOCUMENTS 5,218,201 A * 6/1993 Cormier .................. F23N 5/082
                                                    250/237 R
5,726,439 A   3/1998 Miyawaki et al.
(Continued)

FOREIGN PATENT DOCUMENTS

| CN | 101645454 A | 2/2010 |
| JP | 63-128666 A | 6/1988 |

(Continued)

OTHER PUBLICATIONS

International Search Report for PCT/JP2012/056666, Mailing Date of Apr. 17, 2012.
(Continued)

*Primary Examiner* — Thanh Luu
*Assistant Examiner* — Kevin Wyatt
(74) *Attorney, Agent, or Firm* — Westerman, Hattori, Daniels & Adrian, LLP

(57) ABSTRACT

Expansion of the dynamic range was difficult in conventional amplifying photoelectric conversion devices designed to have a large gain because, when used for high input light intensity, the electric current exceeds the electric current
(Continued)

capacity of a near-minimum sized transistor obtained with the design rules. Also, in conventional photoelectric conversion devices, techniques for varying the electric signal outputs in real-time at the device level are necessary for real-time import of observation targets or images having a high contrast ratio and for visualization of local areas in real-time. In order to solve this problem, the present invention provides a gain varying method, a variable gain photoelectric conversion device, a photoelectric conversion cell, a photoelectric conversion array, a read-out method thereof, and a circuit therefor in which amplifying photoelectric conversion devices and field-effect transistors are combined.

5 Claims, 37 Drawing Sheets

(58) Field of Classification Search
USPC .......................................... 250/208.1, 214 A
See application file for complete search history.

(56) References Cited

U.S. PATENT DOCUMENTS

| | | | |
|---|---|---|---|
| 5,886,343 A | 3/1999 | Miyawaki et al. | |
| 5,933,188 A | 8/1999 | Shinohara et al. | |
| 7,592,576 B1 | 9/2009 | Hayashi et al. | |
| 2002/0001037 A1 | 1/2002 | Miyawaki et al. | |
| 2009/0312987 A1* | 12/2009 | Uedaira | G01J 1/18 702/189 |
| 2010/0032548 A1 | 2/2010 | Murata | |
| 2010/0321755 A1 | 12/2010 | Cho et al. | |
| 2011/0079708 A1* | 4/2011 | Hsin | H01L 31/103 250/214 A |
| 2013/0187030 A1* | 7/2013 | Hayashi | H04N 5/378 250/208.2 |

FOREIGN PATENT DOCUMENTS

| | | | |
|---|---|---|---|
| JP | 01-288181 A | | 11/1989 |
| JP | 05-082828 A | | 4/1993 |
| JP | 05082828 A | * | 4/1993 |
| JP | 06-339079 A | | 12/1994 |
| JP | 08-116491 A | | 5/1996 |
| JP | 09-213986 A | | 8/1997 |

OTHER PUBLICATIONS

Extended European Search Report dated Feb. 13, 2015, issued in corresponding EP Application No. 12757851.6 (6 pages).
International Preliminary Report on Patentability (Form PCT/IB/373) of International Application No. PCT/JP2012/056666 dated Sep. 17, 2013, with Form PCT/ISA/237.

* cited by examiner

METHOD OF VARYING GAIN, VARIABLE GAIN PHOTOELECTRIC CONVERSION DEVICE, VARIABLE GAIN PHOTOELECTRIC CONVERSION CELL, VARIABLE GAIN PHOTOELECTRIC CONVERSION ARRAY, METHOD OF READING OUT THEREOF, AND CIRCUIT THEREOF

CROSS-REFERENCE TO RELATED APPLICATION

This application is a continuation application of International Application PCT/JP2012/056666, filed on Mar. 15, 2012, which claims the benefit of priority of the prior Japanese Patent Application No. 2011-059884, filed on Mar. 17, 2011, the entire contents of which are incorporated herein by reference.

FIELD

The present invention relates to a method of varying gain of an amplifying photoelectric conversion device for converting optical information input to electric signals, an amplifying photoelectric conversion cell therefor and an amplifying photoelectric conversion array using the device and cell, and relates to a variable gain photoelectric conversion device, a variable gain photoelectric conversion cell and a variable gain photoelectric conversion array. Further, the present invention relates to a method of reading out thereof and a circuit thereof.

BACKGROUND

It is known that a one-dimensional array (see FIG. 1 of patent document 1) which is configured using a Darlington photoelectric conversion cell, in which a transistor is connected to a phototransistor and a two-dimensional photosensor array (see FIG. 9 of patent document 2) having a plurality of transistor configurations are used as a photoelectric conversion device, a photoelectric conversion cell and a photoelectric conversion array for amplifying and obtaining photoelectric current.
[Patent document 1]
Japanese Lain-Open Patent Publication No. H01-288181
[Patent document 2]
U.S. Pat. No. 7,592,576

When the gain (amplification) of the photoelectric current of the photoelectric conversion device, cell and array becomes larger, the electric output (for example, output electric current and the like) at a low illuminance increases and the signal processing may be easily performed. However, in this case, when the illuminance becomes larger or the light intensity becomes larger, the electric output becomes larger (for example, the output electric current may exceed 100 μA). Thus, the electric resistance of a pixel address selecting transistor in the photoelectric conversion array becomes of an issue, and a problem occurs that correct signal read-out may be difficult. As a result, in conventional techniques, when the gain becomes larger, the dynamic range of detectable light intensity may not become larger.

In addition, in scientific experiments and special effects cinematography, it is required that brightness is partly changed in an image. In conventional techniques, software processing is employed to change brightness partly in an image. However, in the software processing, because signal outputs may not be obtained in real-time from the imaging array itself, a delay occurs corresponding to the time required for the information processing. Further, since the dynamic range of the imaging array is limited, problems arise such that the amount of information to be obtained has a certain limit.

SUMMARY

It is an object of the present invention in consideration of the above described points at least to (1) solve the problem that the signal processing with a low illuminance and the large electric current processing for large light intensity may not be compatible with each other, that is, a large dynamic range may not be achieved, or (2) achieve hardware for controlling the brightness partly in an image taken by a photoelectric conversion array.

According to an aspect of the present invention, a method of varying gain of a photoelectric conversion device, of a photoelectric conversion cell and of a photoelectric conversion array, a photoelectric conversion device with a variable gain feature, a photoelectric conversion cell with a variable gain feature, a photoelectric conversion array with a variable gain feature, and a method of reading out thereof and a circuit for reading out thereof are provided.

In the present invention, optical information including light intensity, light wavelength, light modulating frequency and the like is converted into electric variable by a photoelectric conversion element and provided for an amplifying section.

The photoelectric conversion element is, for example, an electric resistance element in which electric resistance is varied or modulated according to optical information input including light intensity, light wavelength, light modulating frequency and the like (hereafter referred to as "photoresistance element"), or a photodiode in which electric current and voltage are varied or modulated according to light intensity, light wavelength or light modulating frequency. When the electric resistance or electric current of such a photoelectric conversion element varies, the amount of electric charge stored in an electric capacitor which is associated with or connected to the photoelectric conversion element also varies.

In addition, the electric variable has an electric unit such as electric current, voltage, stored electric charge and frequency.

In the present invention, an amplifying section includes one or a plurality of transistors.

Also, in the present invention, the converted electric variable is amplified or transformed and amplified, and output as electric signals by the amplifying section. The present invention provides a method and the like of varying gain of an amplifying photoelectric conversion device including such an amplifying section, an amplifying photoelectric conversion cell including such an amplifying section and an amplifying photoelectric conversion array employing the device and cell.

The term "transforming and amplifying" as described above means as follows.

Example 1

When the electric resistance varies according to optical information input in the photoelectric conversion element, the variation of electric resistance itself is not amplified but the variation of the electric current which consequently flows through the photoelectric conversion element is amplified.

Example 2

When the photoelectric conversion element causes a voltage variation according to optical information input, the voltage variation is transformed to charging electric current or discharging electric current and amplified, and then the amplified electric current is used as amplified electric charge by storing the electric current again for the charging time or the discharging time although the amplified electric current may be used itself as electric signals.

Example 3

When electric charge is stored according to optical information input in an electric capacitor associated with the photoelectric conversion element or in an additional electric capacitor which is connected to the element as necessary, or when the stored electric charge is discharged, the stored electric charge is transformed to discharging electric current and amplified or the discharged electric charge is transformed into charging electric current and amplified, and then the amplified electric current is used as amplified electric charge by storing the electric current again for the charging time or the discharging time although the amplified electric current may be used itself as electric signals.

As some embodiments of the present invention there are described an example in which the electric current as electric variable is amplified and output as electric signals (electric current or stored electric charge) and an example in which the electric charge as electric variable or the resulting voltage variation is transformed and amplified and then output as electric signals (electric current or electric charge).

The details of a method of varying gain, a variable gain photoelectric conversion device, a variable gain photoelectric conversion cell, a variable gain photoelectric conversion array, a method of reading out thereof and a circuit therefor according to the present invention are described below.

(1)

According to the first embodiment of the present invention, it is provided a method of varying gain of an amplifying photoelectric conversion device, an amplifying photoelectric conversion cell or an amplifying photoelectric conversion array which includes:

an amplifying photoelectric conversion part including a photoelectric conversion element and one or a plurality of transistor(s) each having a collector, a base and an emitter, the photoelectric conversion element being connected to a base of a transistor selected from the one or plurality of transistor(s) (hereinafter, the selected transistor may be referred to as "first transistor". In addition, a collector, base and emitter of the first transistor are referred to as "first collector", "first base" and "first emitter" respectively. The same is applied to the other embodiments.), the photoelectric conversion element being an element which performs photoelectric conversion of optical information input including light intensity or light wavelength to an electric variable including electric current, electric charge, voltage or electric resistance variation, at least one of the collector(s) of the one or plurality of transistor(s) being a first output section, one of the emitter(s) of the one or plurality of transistor(s) being a second output section, the emitter(s) of the one or plurality of transistors except the one transistor case other than the second output section being connected to the base(s) of the other transistor(s) further excluding the selected transistor, to the base of which the photoelectric conversion element is connected, and the electric variable resulting from the photoelectric conversion being obtained from the first output section or the second output section as an electric signal in the form of an amplified electric current or electric charge, or transformed and amplified electric current or electric charge, the method comprising:

a step of providing the amplifying photoelectric conversion part with at least a first field-effect transistor having a first source, a first drain and a first gate, and the first source and the first drain of the first field-effect transistor being connected between the emitter of the one or plurality of transistor(s) and the base of the one or plurality of transistor(s), a step of applying a gain control electric potential to the first gate to vary gain (it may be referred to as "amplification") of the electric signal obtained from the first output section or the second output section.

Next, a variable gain photoelectric conversion element, a variable gain photoelectric conversion cell, a variable gain photoelectric conversion array, a method of reading out thereof and a circuit thereof in which the first embodiment of the method of varying gain are provided below.

(2)

According to the second embodiment of the present invention, it is provided a variable gain photoelectric conversion device comprising:

an amplifying photoelectric conversion part including a photoelectric conversion element and one or a plurality of transistor(s) each having a collector, a base and an emitter, the photoelectric conversion element being connected to a base of a transistor selected from the one or plurality of transistor(s), the photoelectric conversion element being an element which performs photoelectric conversion of optical information input including light intensity or light wavelength to an electric variable including electric current, electric charge, voltage or electric resistance variation, at least one of the collector(s) of the one or plurality of transistor(s) being a first output section, one of the emitter(s) of the one or plurality of transistor(s) being a second output section, the emitter(s) of the one or plurality of transistors except the one transistor case other than the second output section being connected to the bases of the other transistors further excluding the selected transistor, to the base of which the photoelectric conversion element is connected, and the electric variable resulting from the photoelectric conversion being obtained from the first output section or the second output section as an electric signal in the form of an amplified electric current or electric charge, or transformed and amplified electric current or electric charge; and at least a first field-effect transistor having a first source, a first drain and a first gate, the first source and the first drain of the first field-effect transistors being connected between the emitter of the one or plurality of transistor(s) and the base of the one or plurality of transistor(s), wherein a gain control electric potential is applied to the first gate to vary gain of the electric signal obtained from the first output section or the second output section.

(3)

According to the third embodiment of the present invention, it is provided the variable gain photoelectric conversion device according to the second embodiment as described in (2), wherein the photoelectric conversion element is a photodiode.

(4)

According to the fourth embodiment of the present invention, it is provided the variable gain photoelectric conversion device according to the second embodiment as described in (2), wherein the photoelectric conversion element is a photodiode including a collector and a base of the selected transistor.

(5)

According to the third embodiment of the present invention, it is provided the variable gain photoelectric conversion device according to the second embodiment as described in (2), wherein the photoelectric conversion element is a variable photoresistance element of which the electric resistance varies according to the optical information input.

Among the photoelectric conversion elements, the variable photoresistance element is a hydrogenated amorphous silicon (aSi:H) film, a hydrogenated amorphous silicon germanium (aGe:H) film, a compound semiconductor thin film such as a GaSb and InSb film and a photoconductive organic thin film and the like with electrodes on the either end of the each film and is integrated on an insulating film formed on the surface of the first transistor. One end of the electrode is connected to an electrode of the first base of the first transistor, and the other end of the electrode is connected to a bias electric potential of the photoelectric conversion element or the first collector of the first transistor and the like.

Electric current the value of which corresponds to a value obtained by dividing the potential difference between the bias electric potential of the photoelectric conversion element and the base electric potential of the selected transistor by the electric resistance of the variable photoresistance element is input to the base. Therefore, electric current amplified by the one or the plurality of transistors is obtained from the first output section or the second output section. The amplification without varying gain in the one or the plurality of transistors is determined by multiplying individual electric current amplification factor of the one or the plurality of transistors. Since the electric resistance of the variable photoresistance element varies according to the optical information input, this electric current varies according to the optical information. Namely, the electric resistance variation is "transformed and amplified" and then obtained as an electric current output.

Among the photoelectric conversion elements, the photodiode, when being formed on the same substrate of the transistor, may employ a configuration in which light is introduced into the rectifying junction of germanium, GaSb and InSb provided, if necessary, on an insulating film on a substrate or into the collector-base junction of the transistor.

In addition, when the input light has a spectrum distribution and the photoelectric conversion element has a spectrum sensitivity characteristic, there should be a difference between the electric variables of two input light rays obtained after photoelectric conversion if there is a difference between the spectrum distributions of the two input light rays even when the light intensities thereof are the same. Further, when the intensity or the wavelength of the input light is modulated with a frequency, signals with the modulating frequency may be obtained for the electric variable after the photoelectric conversion and for the electric signals to be output.

When electric current itself flows into and out of the photoelectric conversion element, the electric current is amplified and then obtained as electric signals from the first output section or the second output section.

When the electric signals are obtained from the first output section, the electric potential with which the first output section becomes the positive electric potential to the second output section in case that the first collector is n-type is provided for the second output section or the first output section, and the electric potential with which the first output section becomes the negative electric potential to the second output section in case that the first collector is p-type is provided for the second output section or the first output section.

When the electric signals are obtained from the second output section, the electric potential with which the second output section becomes the negative electric potential with respect to the first output section in case that the first collector is n-type is provided for the first output section or the second output section, and the electric potential with which the second output section becomes the positive electric potential with respect to the first output section in case that the first collector is p-type is provided for the first output section or the second output section.

Next, the signal outputs when the time for reading out the electric signals is shorter than the time during which the light input lasts before the reading out are described. This occurs when the read-out process is performed not only to the variable gain photoelectric conversion device but also to the variable gain photoelectric conversion cell and the variable gain photoelectric conversion array.

First, by using the electric current obtained by the photoelectric conversion of the optical information obtained during the time (integration time) between a succeeding read operations, electric charge is charged to the electric capacitor or discharged from an electric capacitor associated with the photoelectric conversion element or an electric capacitor (first electric capacitor) connected to the first base as necessary. When being obtained from the second output section through the first base, this electric charge is amplified.

Additionally, when the obtained electric signals are considered as electric current which is obtained from the first output section or from the second output section during the read-out time and the read-out process is performed during a time which is shorter than the light input time, electric current the amount of which corresponds to the time ratio (ratio of the light input time to the read-out time) flows into or out of the first base. Thus, the gain becomes even larger than the electric current amplification factor of the transistor related to the amplification (a product of individual electric current amplification factor of each transistor when the plurality of transistors is provided).

The electric capacitor associated with the photoelectric conversion element is for example a junction capacitor which is associated between the first base and the first collector of the first transistor and is commonly used as a junction capacitor of the photodiode or a photoelectric conversion element, or a junction capacitor which is associated between the first semiconductor region and the second semiconductor region and is commonly used as a photoelectric conversion element in an example as described below.

For example, electric charge may be charged to the electric capacitor associated with the photoelectric conversion element or the electric capacitor connected to the first base as necessary by driving the second output section from the floating state or the third electric potential to the fourth electric potential. In the present invention, this process is referred to as reset.

The direction of change from the third electric potential to the fourth electric potential is the direction in which the first base is biased in the forward direction to the first emitter. After the charging, the second output section is returned to the floating state or the third electric potential.

After the charging, the charged electric capacitor has been discharged until optical information is read out the next time by the electric current obtained through the photoelectric conversion by the photoelectric conversion element.

As for the electric capacitor which has been discharged until the next read-out process is performed, when the second output section is driven from the floating state or the third electric potential to the fourth electric potential, charging electric current for charging the electric capacitor associated with the photoelectric conversion element or the electric capacitor connected to the first base as necessary to the charge state at the time of the reset is input or output to the first base upon the read-out, and then the charging electric current is amplified and obtained from the first output section or the second output section.

At the times of the read-out and the reset, the first output section is driven from the floating state or the first electric potential to the second electric potential. The second electric potential is an electric potential with a direction in which the first base is biased in the forward direction to the first emitter with regard to the fourth electric potential.

The reset process and the read-out process may be performed by the first output section. In this case, the first output section is driven from the floating state or the first electric potential to the second electric potential. Upon the read-out and the reset, the second output section is driven from the floating state or the third electric potential to the fourth electric potential.

In order to read out electric current or electric charge from the first output section at the second electric potential, a differential amplifier circuit including a reference input and a signal input is preferably used. The second electric potential is provided for the reference input and the first output section is connected to the signal input.

In order to read out electric current or electric charge from the second output section at the fourth electric potential, a differential amplifier circuit including a reference input and a signal input is preferably used. The fourth electric potential is provided for the reference input and the second output section is connected to the signal input.

The variable gain photoelectric conversion devices as described in (6) to (10) below also employ the above described method of reading out electric signals corresponding to the optical information by charging and discharging electric charge. In addition, when the first output section is changed to the first cell output section and the second output section is changed to the second cell output section in the operations and methods as described above, the operations and methods in the variable gain photoelectric conversion cells as described in (11) to (17) and (22) to (27) below are the same as above. Further, when the first output section is changed to the first selection line and the second output section is changed to the second selection line in the operations and methods as described above, the operation and method in the variable gain photoelectric conversion array as described in (38) below are the same as above. Moreover, when the second output section is changed to the third cell output section, the fourth cell output section, the third output line and the fourth output line in the operations and methods as described above, the operations and methods in the variable gain photoelectric conversion cells and the variable gain photoelectric conversion arrays as described in (18) to (21), (28) to (37) and (39) to (40) below are the same as above.

When the electric potential difference between the gain control electric potential and the electric potential of the first source exceeds (in the positive direction in case of n channel and in the negative direction in case of p-channel) the first gate threshold voltage of the first field-effect transistor, a bypass electric current path is formed between the first source and the first drain of the first field-effect transistor so that the gain decreases.

Exactly speaking, the gain starts to decrease when the electric potential difference becomes a value with which subthreshold electric current flows before the electric potential difference exceeds the gate threshold voltage. The gain control electric potential with which the gain starts to decrease varies according to the light intensity and the position of the base to which the first source or the first drain is connected in case that a plurality of transistors are employed. Additionally, the gain control electric potential also varies according to the ratio of the channel width and the channel length of the first field-effect transistor. In order to decrease the gain even with very low level electric current, the gain control electric potential is set so that the difference between the gain control electric potential and the source electric potential does not exceed the gate subthreshold voltage with which subthreshold electric current above the level of the very low level electric current starts to flow.

When ordinary design parameters are used in the design of the first field-effect transistor and the electric potential difference becomes 2 to 3 V over the gate threshold voltage, the electric resistance of the bypass electric current path becomes small enough that the gain becomes constant at the lowest value.

In addition, the first source and the first drain of the first field-effect transistor may be connected between the base and the emitter of the same transistor. In case that a plurality of transistors are employed, the first source and the first drain may be connected between the base and the emitter of the same or another transistor, between the base and the base of different transistors or between the emitter and the emitter of different transistors.

Further, the following configuration may be provided for a variable gain photoelectric conversion element according to the present invention.

(6)

According to the sixth embodiment of the present invention, it is provided a variable gain photoelectric conversion device comprising:

an amplifying photoelectric conversion part including a plurality of bases each provided in contact with collectors which are continuous with or interconnected to each other and a plurality of emitters each provided in contact with the plurality of bases, the collectors being a first output section, one of the plurality of emitters being a second output section, one of the plurality of bases and the collectors performing photoelectric conversion of optical information input including light intensity or light wavelength to an electric variable including electric current, electric charge, voltage or electric resistance variation, the plurality of bases and the plurality of emitters excluding the bases which perform the photoelectric conversion and the emitter as the second output section being interconnected to each other, the electric variable resulting from the photoelectric conversion being obtained from the first output section or the second output section as an electric signal in the form of an amplified electric current or electric charge, or transformed and amplified electric current or electric charge; and at least a first field-effect transistor having a first source, a first drain and a first gate, one of the first source and the first drain being connected to one of the plurality of bases and the plurality of emitters, and the other of the first source and the first drain being connected to another one of the plurality of bases and the plurality of emitters, wherein a gain control potential is applied to the first gate to vary gain of the electric signal obtained from the first output section or the second output section.

When the electric signals are obtained from the first output section, an electric potential in which the first output section becomes positive electric potential with reference to the second output section is provided for the second output section or the first output section in case that the collector is n-type, and an electric potential in which the first output section becomes negative electric potential with reference to the second output section is provided for the second output section or the first output section in case that the collector is p-type.

When the electric signals are obtained from the second output section, an electric potential in which the second output section becomes negative electric potential with reference to the first output section is provided for the first output section or the second output section in case that the collector is n-type, and an electric potential in which the second output section becomes positive electric potential with reference to the first output section is provided for the first output section or the second output section in case that the collector is p-type.

(7)

According to the seventh embodiment of the present invention as a specific example of the configuration corresponding to (6) as described above, it is provided a variable gain photoelectric conversion device comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fifth region and sixth region each in contact with the first region;

a first insulating film formed on the first surface of the first semiconductor region at least sandwiched between the fifth region and sixth region; and a first gate formed on the first insulating film across the fifth region and sixth region, the first semiconductor region being a first output section, one of the plurality of third semiconductor regions being a second output section, one of the plurality of second semiconductor regions and the first semiconductor region converting optical information input including light strength or light wave length to an electric variable including electric current, electric charge, voltage or electric resistance variation, the second semiconductor region(s) excluding the one of plurality of second semiconductor regions relating photoelectric conversion and the third semiconductor region(s) excluding the one of the plurality of third semiconductor regions as the second output section being each interconnected, the electric variable resulting from the photoelectric conversion being obtained from the first output section or the second output section as an electric signal in the form of an amplified electric current or amplified electric charge or transformed and amplified electric current or transformed and amplified electric charge, one of the plurality of second semiconductor regions and one of the plurality of third semiconductor regions being connected to the fifth region, and another one of the plurality of second semiconductor regions and another one of the plurality of third semiconductor regions being connected to the sixth region, wherein a gain control potential is applied to the first gate to vary gain of the electric signal obtained from the first output section or the second output section.

When the electric signals are obtained from the first semiconductor region, an electric potential in which the first semiconductor region becomes positive electric potential with respect to the third semiconductor region as the second output section is provided for the third semiconductor region as the second output section or the first semiconductor region in case that the first semiconductor region is n-type, and an electric potential in which the first semiconductor region becomes negative electric potential with respect to the third semiconductor region as the second output section is provided for the third semiconductor region as the second output section or the first semiconductor region in case that the first semiconductor region is p-type.

When the electric signals are obtained from the third semiconductor region as the second output section, an electric potential in which the third semiconductor region as the second output section becomes negative electric potential with respect to the first semiconductor region is provided for the first semiconductor region as the first output section or the third semiconductor region as the second output section in case that the first semiconductor region is n-type, and an electric potential in which the third semiconductor region as the second output section becomes positive electric potential with respect to the first semiconductor region is provided for the first semiconductor region as the first output section or the third semiconductor region as the second output section in case that the first semiconductor region is p-type.

In the present invention, the relation between the "first conductivity type" and the "second conductivity type opposite to the first conductivity type" means that when the first conductivity type is n-type the second conductivity type is p-type and when the first conductivity type is p-type the second conductivity type is n-type.

In the present invention, the state of being "in contact with" a semiconductor region includes the "on" state of being in contact on the semiconductor region and the "in" state of being embedded in the semiconductor region.

In the configuration examples as described in (7) and below, the second thickness may differ among the plurality of second semiconductor regions. The third thickness may differ among the plurality of third semiconductor regions. The fifth region and sixth region are not necessarily semiconductor regions as long as the fifth region and sixth region form rectifying junctions with the first semiconductor region, and the fifth region and sixth region may be opposite conductivity type semiconductors, metal or silicide. When being provided so as to be in contact with a fourth semiconductor region as described below, the fifth region and sixth region may be the first conductivity type semiconductors, metal or silicide as long as the fifth region and sixth region have a rectifying characteristic with the fourth semiconductor region. For connecting each region with each other, a conductive layer may be formed on an insulating film formed on each region or metal wires may be connected by wire bonding in case that the two sides of the region to be connected are larger than tens of microns.

(8)

According to the eighth embodiment of the present invention, it is provided the variable gain photoelectric conversion device according to the seventh embodiment according to the present invention as described in (7), wherein the fifth region or the sixth region is continuous with and connected to one of the second semiconductor region.

In addition, although the fifth region or sixth region which is continuous with the second semiconductor region is a semiconductor region, the impurity concentration and the depths of these regions may differ from the impurity concentration and the depth of the second semiconductor region.

(9)

According to the ninth embodiment of the present invention, it is provided the variable gain photoelectric conversion device according to the seventh embodiment according to the present invention as described in (7), wherein the fifth region or the sixth region shares a part with one of the plurality of second semiconductor regions to be connected to the one of the plurality of second semiconductor regions.

Here, the fifth region or sixth region which is continuous with the second semiconductor region is a semiconductor region.

(10)

According to the tenth embodiment of the present invention as another specific example of the configuration corresponding to (6) as described above, it is provided a variable gain photoelectric conversion device comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fourth semiconductor region in contact with the first semiconductor region having the second conductivity type, a fourth surface and a fourth thickness;

a fifth region and sixth region each in contact with the fourth semiconductor region;

a fourth insulating film formed on the fourth surface of the fourth semiconductor region at least sandwiched between the fifth region and sixth region; and a first gate formed on the fourth insulating film across the fifth region and sixth region, the first semiconductor region being a first output section, one of the plurality of third semiconductor regions being a second output section, one of the plurality of second semiconductor regions and the first semiconductor region converting optical information input including light intensity or light wavelength to an electric variable including electric current, electric charge, voltage or electric resistance variation, the second semiconductor region(s) excluding the one of the plurality of second semiconductor regions relating photoelectric conversion and the third semiconductor region (s) excluding the one of the plurality of third semiconductor regions as the second output section being each interconnected, the electric variable resulting from the photoelectric conversion being obtained from the first output section or the second output section as an electric signal in the form of an amplified electric current or electric charge, or transformed and amplified electric current or electric charge, one of the second semiconductor regions and the third semiconductor regions being connected to the fifth region, and another one of the second semiconductor regions and the third semiconductor regions being connected to the sixth region, wherein a gain control potential is applied to the first gate to vary gain of the electric signal obtained from the first output section or the second output section.

In addition, the fifth region and sixth region as described in (10) is not necessarily the semiconductor region having the first conductivity type, and may be metal or metal silicide which forms a rectifying junction with the fourth semiconductor region as described in (10).

When the electric signals are obtained from the first semiconductor region, an electric potential in which the first semiconductor region becomes positive electric potential with reference to the third semiconductor region as the second output section is provided for the third semiconductor region as the second output section or the first semiconductor region in case that the first semiconductor region is n-type, and an electric potential in which the first semiconductor region becomes negative electric potential with reference to the third semiconductor region as the second output section is provided for the third semiconductor region as the second output section or the first semiconductor region in case that the first semiconductor region is p-type.

When the electric signals are obtained from the third semiconductor region as the second output section, an electric potential in which the third semiconductor region as the second output section becomes negative electric potential with reference to the first semiconductor region is provided for the first semiconductor region as the first output section or the third semiconductor region as the second output section in case that the first semiconductor region is n-type, and an electric potential in which the third semiconductor region as the second output section becomes positive electric potential with reference to the first semiconductor region is provided for the first semiconductor region as the first output section or the third semiconductor region as the second output section in case that the first semiconductor region is p-type.

(11)

According to the eleventh embodiment of the present invention, it is provided a variable gain photoelectric conversion cell comprising:

an amplifying photoelectric conversion part including a photoelectric conversion element and one or a plurality of transistor(s) each having a collector, a base and an emitter, the photoelectric conversion element being connected to a base of a transistor selected from the one or plurality of transistor(s), the photoelectric conversion element being an element which performs photoelectric conversion of optical information input including light intensity or light wavelength to an electric variable including electric current, electric charge, voltage or electric resistance variation, at least one of the collector(s) of the one or plurality of transistor(s) being a first cell output section, one of the emitter(s) of the one or plurality of transistor(s) being a second cell output section, the emitter(s) of the plurality of transistor(s) other than the second output section being connected to the bases of the other transistors further excluding the selected transistor, to the base of which the photoelectric conversion element is connected, and the electric variable resulting from the photoelectric conversion being obtained from the first cell output section or the second cell output section as an electric signal in the form of an amplified electric current or electric charge or transformed and amplified electric current and electric charge; and at least a first field-effect transistor having a first source, a first drain and a first gate, the first source and the first drain of the first field-effect transistors being connected between the emitter of the one or plurality of transistor(s) and the base of the one or plurality of transistor(s), wherein when the electric potential applied to the first cell output section is varied from a first electric potential to a second electric potential to obtain the electric signal from the second cell output section or the electric potential applied to the second cell output section is varied from a third electric potential to a fourth electric potential to obtain the electric signal from the first cell output section, a gain control electric potential is in advance applied to the first gate to vary gain of the electric signal obtained from the first cell output section or the second cell output section.

In addition, since the process described above for "a gain control electric potential is applied to the first gate" is generally performed before the variable gain photoelectric conversion cell is selected, the words "in advance" are added as follows: "a gain control electric potential is in advance applied to the first gate to vary the gain of the electric signals obtained from the first cell output section or the second cell output section". The same shall apply hereinafter.

The correlations between the first, second, third and fourth electric potentials are described as in the following twelfth embodiment according to the present invention.

(12)

According to the twelfth embodiment of the present invention, it is provided the variable gain photoelectric conversion cell according to the eleventh embodiment as described in (11), wherein the third electric potential includes a potential difference of a polarity for reverse-biasing the emitter as the second cell output section with reference to the first electric potential, and the fourth electric potential includes a potential difference of a polarity for forward-biasing the emitter as the second cell output section with reference to the second electric potential.

For the electric potential as described above, the correlations and the variation directions are more important than the absolute values thereof.

When the electric signals are obtained from the first cell output section, firstly the first cell output section is driven from the floating state or the first electric potential to the second electric potential and after pulse noise due to the voltage variation is decreased, the second cell output section is driven from the third electric potential to the fourth electric potential so that the rate with which pulse noise due to the cell selection overlaps the electric signals is improved.

When the electric signals are obtained from the second cell output section, firstly the second cell output section is driven from the floating state or the third electric potential to the fourth electric potential and after pulse noise due to the voltage variation is decreased, the first cell output section is driven from the first electric potential to the second electric potential so that the rate with which pulse noise due to the cell selection overlaps the electric signals may be improved.

At this time, the sense amplifier (electric current amplifier or electric charge amplifier) which is connected to the first cell output section or the second cell output section for obtaining the electric signals includes a signal input and a reference input. And when the electric signals are obtained from the first cell output section, the signal input is connected to the first cell output section and the second electric potential is provided for the reference input. On the other hand, when the electric signals are obtained from the second cell output section, the signal input is connected to the second cell output section and the fourth electric potential is provided for the reference input. Thus, the signal input is automatically adjusted to almost the same electric potential as the reference input, and then the sense amplifier senses the electric current or the electric charge of the electric signals.

A necessary electric potential, for example, the first cell electric potential (which is positive electric potential with reference to the fourth electric potential in case that the first transistor or the other transistors are npn-type, or which is negative electric potential with reference to the fourth electric potential in case that the first transistor or the other transistors are pnp-type) is provided for the first collector, the first collector among the other collectors which is not used for the cell selection, and the other collectors.

(13)

According to the thirteenth embodiment of the present invention, it is provided the variable gain photoelectric conversion cell according to the eleventh embodiment as described in (11), wherein the photoelectric conversion element is a photodiode.

(14)

According to the fourteenth embodiment of the present invention, it is provided the variable gain photoelectric conversion cell according to the eleventh embodiment as described in (11), wherein the photoelectric conversion element is a photodiode including a collector and a base of the selected transistor.

(15)

According to the fifteenth embodiment of the present invention, it is provided the variable gain photoelectric conversion cell according to the eleventh embodiment as described in (11), wherein the photoelectric conversion element is a variable photoresistance element the electric resistance of which varies according to the optical information input.

(16)

According to the sixteenth embodiment of the present invention, it is provided a variable gain photoelectric conversion cell comprising:

an amplifying photoelectric conversion part including a plurality of bases provided in contact with collectors which are continuous with or interconnected to each other and a plurality of emitters each provided in contact with respective of the plurality of bases, the collectors being a first cell output section, one of the plurality of emitters being a second cell output section, one of the plurality of bases and the collectors performing photoelectric conversion of optical information input including light intensity or light wavelength to an electric variable including electric current, electric charge, voltage or electric resistance variation, the plurality of bases and the plurality of emitters excluding the bases which perform the photoelectric conversion and the emitter as the second cell output section being interconnected to each other, the electric variable resulting from the photoelectric conversion being obtained from the first cell output section or the second cell output section as an electric signal in the form of an amplified electric current or electric charge, or transformed and amplified electric current or electric charge; and at least a first field-effect transistor having a first source, a first drain and a first gate, one of the first source and the first drain being connected to one of the plurality of bases and the plurality of emitters, and the other of the first source and the first drain being connected to another one of the plurality of bases and the plurality of emitters, wherein when the electric potential applied to the first cell output section is varied from a first electric potential to a second electric potential to obtain the electric signal from the second cell output section or the electric potential applied to the second cell output section is varied from a third electric potential to a fourth electric potential to obtain the electric signal from the first cell output section, a gain control electric potential is in advance applied to the first gate to vary gain of the electric signal obtained from the first cell output section or the second cell output section.

In addition, since the process described above for "a gain control electric potential is applied to the first gate" is generally performed before the variable gain photoelectric conversion cell is selected, the words "in advance" are added as follows: "a gain control electric potential is in advance applied to vary the gain of the electric signals obtained from the first output section or the second output section". The same shall apply hereinafter.

The correlations between the first, second, third and fourth electric potentials in (16) are described as in the following seventeenth embodiment according to the present invention.

(17)

According to the seventeenth embodiment of the present invention, it is provided the variable gain photoelectric conversion cell according to the sixteenth embodiment as described in (16), wherein the third electric potential includes a potential difference of a polarity for reverse-biasing the emitter as the second cell output section with reference to the first electric potential, and the fourth electric potential includes a potential difference of a polarity for forward-biasing the emitter as the second cell output section with reference to the second electric potential.

For the electric potential as described above, the correlations and the variation directions are more important than the absolute values thereof.

When the electric signals are obtained from the first cell output section, firstly the first cell output section is driven from the first electric potential to the second electric potential and after pulse noise due to the voltage variation is decreased, the second cell output section is driven from the third electric potential to the fourth electric potential so that the rate with which pulse noise due to the cell selection overlaps the electric signals may be improved.

When the electric signals are obtained from the second cell output section, firstly the second cell output section is driven from the third electric potential to the fourth electric potential and after pulse noise due to the voltage variation is decreased, the first cell output section is driven from the first electric potential to the second electric potential so that the rate with which pulse noise due to the cell selection overlaps the electric signals may be improved.

At this time, the sense amplifier (electric current amplifier or electric charge amplifier) which is connected to the first cell output section or the second cell output section for obtaining the electric signals includes a signal input and a reference input. And when the electric signals are obtained from the first cell output section, the signal input is connected to the first cell output section and the second electric potential is provided for the reference input. On the other hand, when the electric signals are obtained from the second cell output section, the signal input is connected to the second cell output section and the fourth electric potential is provided for the reference input. Thus, the signal input is automatically adjusted to almost the same electric potential as the reference input, and then the sense amplifier senses the electric current or the electric charge of the electric signals.

(18)

According to the eighteenth embodiment of the present invention as a configuration example in which a second field-effect transistor is provided as a cell selection element in a variable gain photoelectric conversion cell according to the present invention, it is provided the variable gain photoelectric conversion cell according to the eleventh embodiment as described in (11), wherein the variable gain photoelectric conversion cell further comprises:

a second field-effect transistor having a second source, a second drain and a second gate, the second output section being connected to one of the second source and the second drain, the other of the second source and the second drain being a third cell output section, and the second gate being a second cell selection section, wherein when an electric potential which varies from a first selection electric potential for blocking the second field-effect transistor to a second selection electric potential for making the second filed-effect transistor conductive is applied to the second cell selection section to select the variable gain photoelectric conversion cell and the electric signal is obtained from the third cell output section, a gain control potential is in advance applied to the first gate to vary gain of the electric signal obtained from the third cell output section.

A necessary electric potential, for example, the first cell electric potential (which is the same electric potential as that of the second output section or more positive electric potential than that of the second output section in case that the first transistor or the other transistors are npn-type, or which is the same electric potential as that of the second output section or more negative electric potential than that of the second output section in case that the first transistor or the other transistors are pnp-type) is provided for the first collector and the other collectors.

(19)

According to the nineteenth embodiment of the present invention as another configuration example in which a second field-effect transistor is provided as a cell selection element in a variable gain photoelectric conversion cell according to the present invention, it is provided the variable gain photoelectric conversion cell according to the sixth embodiment as described in (6), wherein the variable gain photoelectric conversion cell further comprises:

a second field-effect transistor having a second source, a second drain and a second gate, the second output section being connected to one of the second source and the second drain, the other of the second source and the second drain being a third cell output section, and the second gate being a second cell selection section, wherein when an electric potential which varies from a first selection electric potential for blocking the second field-effect transistor to a second selection electric potential for making the second filed-effect transistor conductive is applied to the second cell selection section to select the variable gain photoelectric conversion cell and the electric signal is obtained from the third cell output section, a gain control potential is in advance applied to the first gate to vary gain of the electric signal obtained from the third cell output section.

A necessary electric potential, for example, the first cell electric potential (which is positive electric potential to the third cell output section in case that the collector is n-type, or which is negative electric potential to the third cell output section in case that the collector is p-type) is provided for the collectors which are continuous or interconnected each other.

(20)

According to the twentieth embodiment of the present invention as a configuration example in which two (second and third) field-effect transistors are provided as cell selection elements in a variable gain photoelectric conversion cell according to the present invention, it is provided the variable gain photoelectric conversion cell according to the eleventh embodiment as described in (11), wherein the variable gain photoelectric conversion cell further comprises:

a second field-effect transistor having a second source, a second drain and a second gate; and a third field-effect transistor having a third source, a third drain and a third gate, the second output section being connected to one of the second source and the second drain, the other of the second source or the second drain being connected to one of the third source and the third drain, the other of the third source and the third drain being a fourth cell output section, the second gate being a second cell selection section, and the third gate being a third cell selection section, wherein when an electric potential which varies from a first selection electric potential for blocking the second field-effect transistor to a second selection electric potential for making the second filed-effect transistor conductive is applied to the second cell selection section and an electric potential which varies from a third selection electric potential for blocking the third field-effect transistor to a fourth selection electric potential for making the third filed-effect transistor conductive is applied to the third cell selection section to select the variable gain photoelectric conversion cell and the electric signal is obtained from the fourth cell output section, a gain control potential is in advance applied to the first gate to vary gain of the electric signal obtained from the fourth cell output section.

A necessary electric potential, for example, the first cell electric potential (which is positive electric potential with regard to the fourth cell output section in case that the first transistor is npn-type, or which is negative electric potential with regard to the fourth cell output section in case that the first transistor is pnp-type) is provided for the first collector and the other collectors.

(21)

According to the twenty-first embodiment of the present invention as another configuration example in which two (second and third) field-effect transistors are provided as cell selection elements in a variable gain photoelectric conversion cell according to the present invention, it is provided the variable gain photoelectric conversion cell according to the sixth embodiment as described in (6), wherein the variable gain photoelectric conversion device further comprises:

a second field-effect transistor having a second source, a second drain and a second gate; and a third field-effect transistor having a third source, a third drain and a third gate, the second output section being connected to one of the second source and the second drain, the other of the second source and the second drain being connected to one of the third source and the third drain, the other one of the third source and the third drain being a fourth cell output section, the second gate being a second cell selection section, and the third gate being a third cell selection section, wherein when an electric potential which varies from a first selection electric potential for blocking the second field-effect transistor to a second selection electric potential for making the second filed-effect transistor conductive is applied to the second cell selection section and an electric potential which varies from a third selection electric potential for blocking the third field-effect transistor to a fourth selection electric potential for making the third filed-effect transistor conductive is applied to the third cell selection section to select the variable gain photoelectric conversion cell and the electric signal is obtained from the fourth cell output section, a gain control potential is in advance applied to the first gate to vary gain of the electric signal obtained from the fourth cell output section.

A necessary electric potential, for example, the first cell electric potential (which is positive electric potential with regard to the fourth output section in case that the collector is n-type, or which is negative electric potential with regard to the fourth output section in case that the collector is p-type) is provided for the collectors which are continuous or interconnected together.

(22)

According to the twenty-second embodiment of the present invention, it is provided as a configuration example of the variable gain photoelectric conversion cell according to the sixteenth embodiment as described in (16) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fifth region and sixth region each in contact with the first region;

a first insulating film formed on the first surface of the first semiconductor region at least sandwiched between the fifth region and sixth region; and a first gate formed on the first insulating film across the fifth region and sixth region, the first semiconductor region being a first cell output section, one of the plurality of third semiconductor regions being a second cell output section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region(s) excluding the one of the plurality of third semiconductor regions as the second cell output section being each interconnected, the electric variable resulting from the photoelectric conversion being obtained from the first cell output section or the second cell output section as an electric signal in the form of an amplified electric current or electric charge, or transformed and amplified electric current or transformed and amplified electric charge, one of the plurality of second semiconductor regions or third semiconductor regions being connected to the fifth region, and another one of the plurality of second semiconductor regions or third semiconductor regions being connected to the sixth region, wherein when an electric potential applied to the first cell output section is varied from a first electric potential to a second electric potential to obtain the electric signal from the second cell output section or an electric potential applied to the second cell output section is varied from a third electric potential to a fourth electric potential to obtain the electric signal from the first cell output section, a gain control potential is in advance applied to the first gate to vary gain of the electric signal obtained from the first cell output section or the second cell output section.

The correlations between the first, second, third and fourth electric potentials as described in (22) are described as in the following twenty-third embodiment according to the present invention.

(23)

According to the twenty-third embodiment of the present invention, it is provided the variable gain photoelectric conversion cell according to the twenty-second embodiment as described in (22), wherein the third electric potential includes, with regard to the first electric potential, a potential difference and a polarity for reverse-biasing the third semiconductor region which is not interconnected to the second semiconductor region in contact with the third semiconductor region which is not interconnected, and the fourth electric potential includes, with regard to the second electric potential, a potential difference and a polarity for forward-biasing the third semiconductor region which is not interconnected to the second semiconductor region in contact with the third semiconductor region which is not interconnected.

For the electric potential as described above, the correlations and the variation directions are more important than the absolute values thereof.

When the electric signals are obtained from the first cell output section, firstly the first output section is driven from the first electric potential to the second electric potential and after pulse noise due to the voltage variation is decreased, the second cell output section is driven from the third electric potential to the fourth electric potential so that the rate with which pulse noise due to the cell selection overlaps the electric signals may be improved.

When the electric signals are obtained from the second cell output section, firstly the second cell output section is driven from the third electric potential to the fourth electric potential and after pulse noise due to the voltage variation is decreased, the first cell output section is driven from the first electric potential to the second electric potential so that the rate with which pulse noise due to the cell selection overlaps the electric signals may be improved.

At this time, the sense amplifier (electric current amplifier or electric charge amplifier) which is connected to the first cell output section or the second cell output section for obtaining the electric signals includes a signal input and a reference input. And when the electric signals are obtained from the first cell output section, the signal input is connected to the first cell output section and the second electric potential is provided for the reference input. On the other hand, when the electric signals are obtained from the second cell output section, the signal input is connected to the second cell output section and the fourth electric potential is provided for the reference input. Thus, the signal input is automatically adjusted to almost the same electric potential as the reference input, and then the sense amplifier senses the electric current or the electric charge of the electric signals.

(24)

According to the twenty-fourth embodiment of the present invention, it is provided the variable gain photoelectric conversion cell according to the twenty-second embodiment as described in (22), wherein the fifth region or the sixth region is continuous with and connected to one of the plurality of second semiconductor regions.

In addition, although the fifth region or sixth region which is continuous with the second semiconductor region is a semiconductor region, the impurity concentration and the depth of this region may differ from the impurity concentration and the depth of the second semiconductor region.

(25)

According to the twenty-fifth embodiment of the present invention, it is provided the variable gain photoelectric conversion cell according to the twenty-second embodiment as described in (22), wherein the fifth region or the sixth region shares a part with one of the plurality of second semiconductor regions to connect to the one of the plurality of second semiconductor regions.

Here, the fifth region or sixth region which is continuous with the second semiconductor region is a semiconductor region.

(26)

According to the twenty-sixth embodiment of the present invention, it is provided as another configuration example of the variable gain photoelectric conversion cell according to the sixteenth embodiment as described in (16) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fourth semiconductor region in contact with the first semiconductor region and separated from the plurality of second semiconductor regions having the second conductivity type, a fourth surface and a fourth thickness;

a fifth region and sixth region each in contact with the fourth semiconductor region;

a fourth insulating film formed on the fourth surface of the fourth semiconductor region at least sandwiched between the fifth region and sixth region; and a first gate formed on the fourth insulating film across the fifth region and sixth region, the first semiconductor region being a first cell output section, one of the plurality of third semiconductor regions being a second cell output section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region(s) excluding the one of the plurality of third semiconductor regions as the second cell output section being each interconnected, the electric variable resulting from the photoelectric conversion being obtained from the first cell output section or the second cell output section as an electric signal in the form of an amplified electric current or amplified electric charge, or transformed and amplified electric current or transformed and amplified electric charge, one of the plurality of second semiconductor regions and the plurality of third semiconductor regions being connected to the fifth region, and another one of the plurality of second semiconductor regions and the plurality of third semiconductor regions being connected to the sixth region, wherein when an electric potential applied to the first cell output section is varied from a first electric potential to a second electric potential to obtain the electric signal from the second cell output section or an electric potential applied to the second cell output section is varied from a third electric potential to a fourth electric potential to obtain the electric signal from the first cell output section, a gain control potential is in advance applied to the first gate to vary gain of the electric signal obtained from the first cell output section or the second cell output section.

When the electric signals are obtained from the first cell output section, firstly the first cell output section is driven from the floating state or the first electric potential to the second electric potential and after pulse noise due to the voltage variation is decreased, the second cell output section is driven from the third electric potential to the fourth electric potential so that the rate with which pulse noise due to the cell selection overlaps the electric signals may be improved.

On the other hand, when the electric signals are obtained from the second cell output section, firstly the second cell output section is driven from the floating state or the third electric potential to the fourth electric potential and after pulse noise due to the voltage variation is decreased, the first cell output section is driven from the first electric potential to the second electric potential so that the rate with which pulse noise due to the cell selection overlaps the electric signals may be improved.

At this time, the sense amplifier (electric current amplifier or electric charge amplifier) which is connected to the first cell output section or the second cell output section for obtaining the electric signals includes a signal input and a reference input. And when the electric signals are obtained from the first cell output section, the signal input is connected to the first cell output section and the second electric potential is provided for the reference input. On the other hand, when the electric signals are obtained from the second cell output section, the signal input is connected to the second cell output section and the fourth electric potential is provided for the reference input. Thus, the signal input is automatically adjusted to almost the same electric potential as the reference input, and then the sense amplifier senses the electric current or the electric charge of the electric signals.

(27)

According to the twenty-seventh embodiment of the present invention, it is provided the variable gain photoelectric conversion cell according to the twenty-sixth embodiment as described in (26), wherein the third electric potential includes, with respect to the first electric potential, a potential difference and a polarity for reverse-biasing the third semiconductor region to the second semiconductor region in contact with the third semiconductor region which is the second cell output section, and the fourth electric potential includes, with respect to the second electric potential, a potential difference and a polarity for forward-biasing the third semiconductor region to the second semiconductor region in contact with the third semiconductor region which is the second cell output section.

(28)

According to the twenty-eighth embodiment of the present invention, it is provided as a configuration example of the variable gain photoelectric conversion cell according to the nineteenth embodiment as described in (19) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fifth region and sixth region in contact with the first semiconductor region and separated from each other;

a first insulating film formed on the first surface of the first semiconductor region at least sandwiched between the fifth region and sixth region;

a first gate formed on the first insulating film across the fifth region and sixth region;

a seventh region and eight region in contact with the first semiconductor region and separated from each other;

a second insulating film formed on the first surface of the first semiconductor region at least sandwiched between the seventh region and eighth region; and a second gate formed on the second insulating film across the seventh region and eighth region, one of the plurality of third semiconductor regions being connected to the seventh region, the eighth region being a third cell output section, the second gate being a second cell selection section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region(s) excluding the one of the plurality of third semiconductor regions connected to the seventh region being each interconnected, one of the plurality of second semiconductor regions or the plurality of third semiconductor regions being connected to the fifth region, and another one of the plurality of second semiconductor regions and the plurality of third semiconductor regions being connected to the sixth region, wherein a second field-effect transistor includes the seventh region and eighth region as a second source and a second drain and the second gate as a second gate, and when an electric potential which varies from a first selection electric potential for blocking the second field-effect transistor to a second selection electric potential for making the second filed-effect transistor conductive is applied to the second cell selection section to select the variable gain photoelectric conversion cell and the electric signal is obtained from the third cell output section, a gain control potential is in advance applied to the first gate to vary gain of the electric signal obtained from the third cell output section.

(29)

According to the twenty-ninth embodiment of the present invention, it is provided the variable gain photoelectric conversion cell according to the twenty-eighth embodiment as described in (28), wherein the fifth region or the sixth region is continuous with and connected to the one of the plurality of second semiconductor regions.

In addition, although the fifth region or sixth region which is continuous with the second semiconductor region is a semiconductor region, the impurity concentration and the depths of these regions may differ from the impurity concentration and the depth of the second semiconductor region.

(30)

According to the thirtieth embodiment of the present invention, it is provided the variable gain photoelectric conversion cell according to the twenty-eighth embodiment as described in (28), wherein the fifth region or the sixth region shares a part with the one of the plurality of second semiconductor regions to connect to the one of the plurality of second semiconductor regions.

Here, the fifth region or sixth region which is continuous with the second semiconductor region is a semiconductor region.

Additionally, a necessary electric potential, for example, the first cell electric potential (which is positive electric potential with reference to the second output section in case that the first semiconductor region is n-type, or which is negative electric potential with reference to the second output section in case that the first semiconductor region is p-type) is provided for the first semiconductor region as described in the twenty-eighth embodiment (28) according to the present invention.

(31)

According to the thirty-first embodiment of the present invention, it is provided as a configuration example of the variable gain photoelectric conversion cell according to the twenty-first embodiment as described in (21) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fifth region and sixth region in contact with the first semiconductor region and separated from each other;

a first insulating film formed on the first surface of the first semiconductor region at least sandwiched between the fifth region and sixth region;

a first gate formed on the first insulating film across the fifth region and sixth region;

a seventh region and eight region in contact with the first semiconductor region and separated from each other;

a second insulating film formed on the first surface of the first semiconductor region at least sandwiched between the seventh region and eighth region;

a second gate formed on the second insulating film across the seventh region and eighth region;

a ninth region and tenth region in contact with the first semiconductor region and separated from each other;

a third insulating film formed on the first surface of the first semiconductor region at least sandwiched between the ninth region and tenth region; and a third gate formed on the third insulating film across the ninth region and tenth region;

one of the plurality of third semiconductor regions being connected to the seventh region, the eighth region being connected to the ninth region, the tenth region being a fourth cell output section, the second gate being a second cell selection section, the third gate being a third cell selection section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region(s) excluding the one of the plurality of third semiconductor regions connected to the seventh region being each interconnected, one of the plurality of second semiconductor regions and the plurality of third semiconductor regions being connected to the fifth region, and another one of the plurality of second semiconductor regions and the plurality of third semiconductor regions being connected to the sixth region, wherein a second field-effect transistor includes the seventh region and eighth region as a second source and a second drain and the second gate as a second gate, a third field-effect transistor includes the ninth region and tenth region as a third source and a third drain and the third gate as a third gate, and when an electric potential which varies from a first selection electric potential for blocking the second field-effect transistor to a second selection electric potential for making the second filed-effect transistor conductive is applied to the second cell selection section and an electric potential which varies from a third selection electric potential for blocking the third field-effect transistor to a fourth selection electric potential for making the third filed-effect transistor conductive is applied to the third cell selection section to select the variable gain photoelectric conversion cell and the electric signal is obtained from the fourth cell output section as an electric signal in the form of an amplified electric current or electric charge or transformed and amplified electric current or transformed and amplified electric charge, a gain control potential is in advance applied to the first gate to vary gain of the electric signal obtained from the fourth cell output section.

(32)

According to the thirty-second embodiment of the present invention, it is provided the variable gain photoelectric conversion cell according to the thirty-first embodiment as described in (31), wherein the fifth region or the sixth region is continuous with and connected to one of the plurality of second semiconductor regions.

In addition, although the fifth region or sixth region which is continuous with the second semiconductor region is a semiconductor region, the impurity concentration and the depths of this region may differ from the impurity concentration and the depth of the second semiconductor region.

(33)

According to the thirty-third embodiment of the present invention, it is provided the variable gain photoelectric conversion cell according to the thirty-first embodiment as described in (31), wherein the fifth region or the sixth region shares a part with one of the plurality of second semiconductor regions to connect to the one of the plurality of second semiconductor regions.

Here, the fifth region or sixth region which is continuous with the second semiconductor region is a semiconductor region.

(34)

According to the thirty-fourth embodiment of the present invention, it is provided the variable gain photoelectric conversion cell according to the thirty-first embodiment as described in (31), wherein the eighth region and the ninth region is continuous with and connected to each other.

(35)

According to the thirty-fifth embodiment of the present invention, it is provided the variable gain photoelectric conversion cell according to the thirty-first embodiment as described in (31), wherein the eight region and the ninth region share a part of a common region to connect to each other.

Additionally, a necessary electric potential, for example, the first cell electric potential (which is positive electric potential with reference to the third output section in case that the first semiconductor region is n-type, or which is negative electric potential with reference to the third output section in case that the first semiconductor region is p-type) is provided for the first semiconductor region as described in (31).

(36)

According to the thirty-sixth embodiment of the present invention, it is provided as a configuration example of the variable gain photoelectric conversion cell according to the nineteenth embodiment as described in (19) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fourth semiconductor region in contact with the first semiconductor region and separated from the plurality of second semiconductor regions, having the second conductivity type, a fourth surface and a fourth thickness;

a fifth region and sixth region in contact with the fourth semiconductor region and separated from each other;

a fourth insulating film formed on the fourth surface of the fourth semiconductor region at least sandwiched between the fifth region and sixth region;

a first gate formed on the fourth insulating film across the fifth region and sixth region;

a seventh region and eight region in contact with the fourth semiconductor region and separated from each other;

a fifth insulating film formed on the fourth surface of the fourth semiconductor region at least sandwiched between the seventh region and eighth region; and a second gate formed on the fifth insulating film across the seventh region and eighth region;

one of the plurality of third semiconductor regions being connected to the seventh region, the eighth region being a third cell output section, the second gate being a second cell selection section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region(s) excluding the one of the plurality of third semiconductor regions connected to the seventh region being each interconnected, one of the plurality of second semiconductor regions or one of the plurality of third semiconductor regions being connected to the fifth region, and another one of the plurality of second semiconductor regions or one of the plurality of third semiconductor regions being connected to the sixth region, wherein a second field-effect transistor includes the seventh region and eighth region as a second source and a second drain and the second gate as a second gate, when an electric potential which varies from a first selection electric potential for blocking the second field-effect transistor to a second selection electric potential for making the second filed-effect transistor conductive is applied to the second cell selection section to select the variable gain photoelectric conversion cell and the electric signal is obtained from the third cell output section as an electric signal in the form of an amplified electric current or electric charge or transformed and amplified electric current or transformed and amplified electric charge, a gain control potential is in advance applied to the first gate to vary gain of the electric signal obtained from the third cell output section.

Further, a necessary electric potential, for example, the first cell electric potential (which is positive electric potential with reference to the third cell output section in case that the first semiconductor region is n-type, or which is negative electric potential with reference to the third cell output section in case that the first semiconductor region is p-type) is provided for the first semiconductor region as described in (36).

(37)

According to the thirty-seventh embodiment of the present invention, it is provided as a configuration example of the variable gain photoelectric conversion cell according to the twenty-first embodiment as described in (21) a variable gain photoelectric conversion cell comprising:

a first semiconductor region having a first conductivity type, a first surface and a first thickness;

a plurality of second semiconductor regions in contact with the first semiconductor region, each having a second conductivity type opposite to the first conductivity type, a second surface and a second thickness;

a plurality of third semiconductor regions each in contact with one of the second semiconductor regions, each having the first conductivity type, a third surface and a third thickness;

a fourth semiconductor region in contact with the first semiconductor region and separated from the plurality of second semiconductor regions, having the second conductivity type, a fourth surface and a fourth thickness;

a fifth region and sixth region each in contact with the fourth semiconductor region;

a fourth insulating film formed on the fourth surface of the fourth semiconductor region at least sandwiched between the fifth region and sixth region; and a first gate formed on the fourth insulating film across the fifth region and sixth region;

a seventh region and eight region in contact with the fourth semiconductor region and separated from each other;

a fifth insulating film formed on the fourth surface of the fourth semiconductor region at least sandwiched between the seventh region and eighth region; and a second gate formed on the fifth insulating film across the seventh region and eighth region;

a ninth region and tenth region in contact with the fourth semiconductor region and separated from each other;

a sixth insulating film formed on the fourth surface of the fourth semiconductor region at least sandwiched between the ninth region and tenth region; and a third gate formed on the sixth insulating film across the ninth region and tenth region, one of the plurality of third semiconductor regions being connected to the seventh region, the eighth region being connected to the ninth region, the tenth region being a fourth cell output section, the second gate being a second cell selection section, the third gate being a third cell selection section, one of the plurality of second semiconductor regions and the first semiconductor region converting optical information input including light strength or light wave length to an electric variable including electric current, electric charge, voltage or electric resistance variation, the second semiconductor region(s) excluding the one of the plurality of second semiconductor regions relating photoelectric conversion and the third semiconductor region (s) excluding the one of the plurality of third semiconductor regions connected to the seventh region being each interconnected, one of the plurality of second semiconductor regions and the plurality of third semiconductor regions being connected to the fifth region, and another one of the plurality of second semiconductor regions and the plurality of third semiconductor regions being connected to the sixth region, wherein a second field-effect transistor includes the seventh region and eighth region as a second source and a second drain and the second gate as a second gate, a third field-effect transistor includes the ninth region and tenth region as a third source and a third drain and the third gate as a third gate, and when an electric potential which varies from a first selection electric potential for blocking the second field-effect transistor to a second selection electric potential for making the second filed-effect transistor conductive is applied to the second cell selection section and an electric potential which varies from a third selection electric potential for blocking the third field-effect transistor to a fourth selection electric potential for making the third filed-effect transistor conductive is applied to the third cell selection section to select the variable gain photoelectric conversion cell and the electric signal is obtained from the fourth cell output section as an electric signal in the form of an amplified electric current or electric charge or transformed and amplified electric current or transformed and amplified electric charge, a gain control potential is in advance applied to the first gate to vary gain of the electric signal obtained from the fourth cell output section.

Moreover, a necessary electric potential, for example, the first cell electric potential (which is positive electric potential with respect to the fourth cell output section in case that the first semiconductor region is n-type, or which is negative electric potential with respect to the fourth cell output section in case that the first semiconductor region is p-type) is provided for the first semiconductor region as described in (37).

(38)

According to the thirty-eighth embodiment of the present invention, it is provided as an example of a variable gain photoelectric conversion array using the variable gain photoelectric conversion cells as described in (11) or (16) or (22) or (26). A variable gain photoelectric conversion array comprising:

a plurality of first selection lines extending in a first direction;

a plurality of second selection lines extending in a second direction which intersects the first direction;

at lease a gain control line; and the plurality of variable gain photoelectric conversion cells as described in any one of (11), (16), (22) and (26), wherein each variable gain photoelectric conversion cell includes the first cell output section and the second cell output section, the plurality of variable photoelectric conversion cells are arranged in the first direction and the second direction, one of the first cell output sections for the plurality of variable gain photoelectric conversion cells which are arranged in the first direction to form a row is connected to one of the plurality of first selection lines, one of the second cell output sections for the plurality of variable gain photoelectric conversion cells which are arranged in the second direction to form a column is connected to one of the plurality of second selection lines, the first cell output sections connected to different first selection lines are electrically isolated from each other, and the first gates of the plurality of variable gain photoelectric conversion cells are connected to the at least a gain control line.

Biases to the first selection line and the second selection line for selecting variable gain photoelectric conversion cell from the variable gain photoelectric conversion array as described in (38) are described below.

The selection of the variable gain photoelectric conversion cell is made by selecting one of the plurality of second selection lines, varying the electric potential of the line from the third electric potential to the fourth electric potential, retaining the remaining second selection lines in the third electric potential, selecting one of the plurality of first selection lines, varying the electric potential of the line from the first electric potential to the second electric potential and retaining the remaining first selection lines in the first electric potential. In addition, the gain (amplification) of the electric signals obtained from the first selection line or the second selection line is controlled by the gain control electric potential provided in advance for the gain control line.

The combinations of the electric potentials applied to each selection line for performing the above selection method, namely selecting as described above is the combinations for selecting one of the variable gain photoelectric conversion cell which corresponds to the intersection point of the selected first selection line and the selected second selection line.

Further, when all the variable gain photoelectric conversion cells which are connected to the selected first selection line are selected simultaneously, a bias combination may be employed in which the plurality of second selection lines are driven from the floating state or the third electric potential to the fourth electric potential so that the electric signals are obtained from the plurality of second selection lines and then the plurality of second selection lines are returned to be in the floating state or the third electric potential. The first selection line is driven from the first electric potential to the second electric potential after the plurality of second selection lines are driven to the fourth electric potential. Sense amplifiers (each includes a signal input and a reference input, and the fourth electric potential is provided for the reference input) are each connected to the plurality of second selection lines necessary.

Moreover, when all the variable gain photoelectric conversion cells which are connected to the selected second selection line are selected simultaneously, a bias combination may be employed in which the plurality of first selection lines are driven from the floating state or the first electric potential to the second electric potential so that the electric signals are obtained from the plurality of first selection lines and then the plurality of first selection lines are returned to be in the floating state or the first electric potential. The selected second selection line is driven from the third electric potential to the fourth electric potential after the plurality of first selection lines are driven to the second electric potential. Sense amplifiers (each includes a signal input and a reference input, and the second electric potential is provided for the reference input) are each connected to the plurality of second selection lines necessary.

(39)

According to the thirty-ninth embodiment of the present invention, it is provided as an example of a variable gain photoelectric conversion array using the variable gain photoelectric conversion cells as described in (18) or (19) or (28) or (36). A variable gain photoelectric conversion array comprising:

a plurality of third selection lines extending in a first direction;

a plurality of third output lines extending in a second direction which intersects the first direction;

at least a gain control line; and the plurality of variable gain photoelectric conversion cells as described in any one of (18), (19), (28) and (36), wherein each variable gain photoelectric conversion cell includes the second cell selection section and the third cell output section, the plurality of variable photoelectric conversion cells are arranged in the first direction and the second direction, the second cell selection sections of the plurality of variable gain photoelectric conversion cells which are arranged in the first direction to form a row is each connected to one of the plurality of third selection lines, the third cell output sections of the plurality of variable gain photoelectric conversion cells which are arranged in the second direction to form a column is each connected to one of the plurality of third output lines, and the first gates of the plurality of variable gain photoelectric conversion cells are connected to the at least one gain control line.

In order to select a variable gain photoelectric conversion cell which is a component of a variable gain photoelectric conversion array as described in (39) from the variable gain photoelectric conversion array, the electric potential of a third selection line selected from the plurality of third selection lines is varied from the first selection electric potential to the second selection electric potential, the electric potentials of the remaining third selection lines are maintained at the first selection electric potential, and then the variable gain photoelectric conversion cell is selected. In this array, electric signals may be obtained simultaneously through the plurality of third output lines from all the variable gain photoelectric conversion cells which are connected to the selected third selection line.

A plurality of sense amplifiers (each includes a signal input and a reference input, and the "sixth electric potential" is provided for the reference input) are each connected to the plurality of third selection lines necessary. Here, in the variable gain photoelectric conversion cells provided in the variable gain photoelectric conversion array as described in (39) or (40), the sixth electric potential is an electric potential with which a forward bias is given between the emitter which is connected to either the second source or the second drain of the second field-effect transistor and the base of the transistor which has the emitter, or an electric potential with which a forward bias is given between the third semiconductor region which is connected to either the second source or the second drain of the second field-effect transistor and the second semiconductor region which is in contact with the third semiconductor region. In addition, the gain (amplification) of the electric signals obtained from the third output line is controlled by the gain control electric potential provided for the gain control line.

(40)

According to the fortieth embodiment of the present invention, it is provided as an example of a variable gain photoelectric conversion array using the variable gain photoelectric conversion cells as described in (20) or (21) or (31) or (37) a variable gain photoelectric conversion array comprising:

a plurality of third selection lines extending in a first direction;

a plurality of fourth selection lines extending in a second direction which intersects the first direction;

at least a fourth output line;

at least a gain control line; and the plurality of variable gain photoelectric conversion cells as described in any one of (20) or (21) or (31) or (37), wherein each variable gain photoelectric conversion cell includes the second cell selection section, the third cell selection section and the fourth cell output section, the plurality of variable photoelectric conversion cells are arranged in the first direction and the second direction, one of the second cell selection sections of the plurality of variable gain photoelectric conversion cells which are arranged in the first direction to form a row is each connected to one of the plurality of third selection lines, one of the third cell selection sections of the plurality of variable gain photoelectric conversion cells which are arranged in the second direction to form a column is each connected to one of the plurality of fourth selection lines, the fourth cell output sections of the variable gain photoelectric conversion cells are each connected to the at least one fourth output line, and the first gate of the variable gain photoelectric conversion cell is connected to the gain control line.

In order to select a variable gain photoelectric conversion cell which is a component of a variable gain photoelectric conversion array as described in (40) from the variable gain photoelectric conversion array, the electric potential of a third selection line selected from the plurality of third selection lines is varied from the first selection electric potential to the second selection electric potential, the electric potentials of the remaining third selection lines are maintained at the first selection electric potential, the electric potential of a fourth selection line selected from the plurality of fourth selection lines is varied from the third selection electric potential to the fourth selection electric potential, the electric potentials of the remaining fourth selection lines are maintained at the third selection electric potential, and then the variable gain photoelectric conversion cell is selected. The gain (amplification) of the electric signals obtained from the fourth output line is controlled (varied) by the gain control electric potential provided in advance for the gain control line.

Next, an exemplified method of performing read-out from a variable gain photoelectric conversion array according to the present invention and an exemplified circuit therefor are described below.

First, in the array constructed from the variable gain photoelectric conversion cell in (11), (16), (22) or (26), the following two methods may be selected for avoiding feedthrough noises of driving pulses generated upon the read-out.

(41)

According to the forty-first embodiment of the present invention, it is provided a method of reading out of the variable gain photoelectric conversion array according to the thirty-eighth embodiment as described in (38), the method comprising:

a step of varying an electric potential of a second selection line selected from the plurality of second selection lines from the third electric potential to the fourth electric potential and maintaining the remaining second selection lines at the third electric potential; and a step of varying an electric potential of a first selection line sequentially selected from the plurality of first selection lines from the first electric potential to the second electric potential and maintaining the remaining first selection lines at the first electric potential to sequentially obtain an electric signal from the selected second selection.

In this case, after the electric potential of the second selection line is varied to the fourth electric potential, an electric current sense amplifier or an electric charge sense amplifier is connected to the second selection line. The circuit for achieving this is described later. The sense amplifier has a signal input and a reference input and the fourth electric potential at the time of the read-out is provided for the reference input.

(42)

According to the forty-second embodiment of the present invention, it is provided a method of reading out of the variable gain photoelectric conversion array according to the thirty-eighth embodiment as described in (38), the method comprising:

a step of varying an electric potential of a first selection line selected from the plurality of first selection lines from the first electric potential to the second electric potential and maintaining the remaining first selection lines at the first electric potential; and a step of varying an electric potential of a second selection line sequentially selected from the plurality of second selection lines from the third electric potential to the fourth electric potential and maintaining the remaining second selection lines at the third electric potential to sequentially obtain an electric signal from the selected first selection.

In this case, after the electric potential of the first selection line is varied to the second electric potential, an electric current sense amplifier or an electric charge sense amplifier is connected to the first selection line. The circuit for achieving this is described later. The sense amplifier has a signal input and a reference input and the second electric potential at the time of the read-out is provided for the reference input.

A method of reading out from cell blocks in a variable gain photoelectric conversion array with different gains is achieved by the method (forty-third embodiment) as described below.

(43)

According to the forty-third embodiment of the present invention, it is provided a method of reading out of the variable gain photoelectric conversion array as described in any one of (38), (39) and (40), wherein the variable gain photoelectric conversion array further comprises a plurality of gain control lines, and different electric potentials are applied to at least two gain control lines so that the magnitudes of electric signals obtained in regard to similar light intensity from variable gain photoelectric conversion cells in each group connected to each gain control line differ from each other.

A method of reading out by varying the gain of a particular cell in a variable gain photoelectric conversion array is achieved by the method (forty-fourth embodiment) as described below.

(44)

According to the forty-fourth embodiment of the present invention, it is provided a method of reading out of the variable gain photoelectric conversion array as described in any one of (38), (39) and (40), wherein before at least one of the plurality of variable gain photoelectric conversion cells is selected, an electric potential which is different from an electric potential applied to the other variable gain photo electric conversion cell is applied to the gain control line connected to the at least one of the plurality of variable gain photoelectric conversion cells.

In the read-out method as described above, when an electric potential for switching off the first field-effect transistor is selected as the electric potential provided for the selected gain control line, the image from the cell block or individual cells which are connected to the gain control line has a maximum brightness, and during the course of varying the electric potential provided for the selected gain control line from the electric potential for switching off the first field-effect transistor to the electric potential for switching on the first field-effect transistor, the image starts to become dark when the electric potential comes to the (gate) subthreshold voltage and the brightness is at a minimum when the electric potential is overdriven to 2-3 V above the gate threshold voltage.

Thus, by the variable gain photoelectric conversion array according to the present invention, an image with a partly different brightness can be obtained by the hardware level.

In a variable gain photoelectric conversion array according to the present invention, the electric potential of the first selection line or the second selection line of the variable gain photoelectric conversion array as described in (38) which is selected upon the read-out or the electric potential of the third output line of the variable gain photoelectric conversion array as described in (39) or the fourth output line of the variable gain photoelectric conversion array as described in (40) which is selected upon the read-out is set in advance to the read-out electric potential (the second electric potential or the fourth electric potential in case of the variable gain photoelectric conversion array as described in (38), and the read-out electric potential to the sixth electric potential in case of the variable gain photoelectric conversion array as described in (39) or (40)), the electric potential is read out by a sense amplifier, and then the intra-array electric charge or the intra-cell electric charge which possibly remains after the read-out is discharged and reset through the selected first selection line or the selected second selection line, or alternatively, the third output line or the fourth output line by setting the selected first selection line or the selected second selection line, or alternatively, the third output line or the fourth output line to a reset voltage. Generally, the reset voltage may be the same as the electric potential set at the time of the read-out for the sake of simplification. According to the present invention, an electric potential setting circuit for this purpose is also provided.

The electric potential setting circuit as described below is an example (forty-fifth embodiment) of a circuit for setting the electric potential, when the process for reading out from the first selection line is performed, to the variable gain photoelectric conversion array as described in (38).

(45)

According to the forty-fifth embodiment of the present invention, it is provided a second electric potential setting circuit, comprising:

a plurality of sixth field-effect transistors; and a second electric potential providing means, wherein the plurality of sixth field-effect transistors each include a source and a drain used for outputs and a gate, one of the source and the drain used for outputs is connected to one of the plurality of first selection lines of the variable gain photoelectric conversion array as described in (38), and the other of the source and the drain is connected to the second electric potential providing means, a sixth switching-off control electric potential for switching off the sixth field-effect transistor is applied to the gates of the plurality of sixth field-effect transistors at least when the electric potential of the second selection line varies from the third electric potential to the fourth electric potential, and a sixth switching-on control electric potential for switching on the sixth field-effect transistor is applied to the gates of the plurality of sixth field-effect transistor at a point of the time when the electric potential of the second selection line is the third electric potential or the fourth electric potential excluding the time when the electric potential of the second selection line is being varied from the third electric potential to the fourth electric potential.

The set/reset circuit as the forty-sixth embodiment as described below is an example of a set/reset circuit for reading out electric signals from the second selection line of the variable gain photoelectric conversion array as described in (38).

(46)

According to the forty-sixth embodiment of the present invention, it is provided a fourth electric potential setting circuit, comprising:

a plurality of sixth field-effect transistors; and a fourth electric potential providing means, wherein the plurality of sixth field-effect transistors each include a source and a drain used for outputs and a gate, one of the source and the drain used for outputs is connected to one of the plurality of second selection lines of the variable gain photoelectric conversion array as described in (38), and the other of the source and the drain is connected to the fourth electric potential providing means, a sixth switching-off control electric potential for switching off the sixth field-effect transistor is applied to the gates of the plurality of sixth field-effect transistors at least when the electric potential of the first selection line varies from the first electric potential to the second electric potential, and a sixth switching-on control electric potential for switching on the sixth field-effect transistor is applied to the gates of the plurality of sixth field-effect transistors at a point of the time when the electric potential of the first selection line is the first electric potential or the second electric potential excluding the time when the electric potential of the first selection line is being varied from the first electric potential to the second electric potential.

The electric potential setting circuit as the forty-seventh embodiment as described below is an example of a circuit for setting the electric potential when the process for reading out from the photoelectric conversion array as described in (39) is performed.

(47)

According to the forty-seventh embodiment of the present invention, it is provided a sixth electric potential setting circuit, comprising:

a plurality of sixth field-effect transistors; and a sixth electric potential providing means, wherein the sixth field-effect transistor includes a sixth source and a sixth drain used for outputs and a sixth gate, one of the sixth source and the sixth drain used for outputs is connected to one of the plurality of third selection lines of the variable gain photoelectric conversion array as described in (39), and the other of the sixth source and the sixth drain is connected to the sixth electric potential providing means, a sixth switching-off control electric potential for switching off the sixth field-effect transistor is applied to the sixth gates of the plurality of sixth field-effect transistors at least when the electric potential of the third selection line varies from the first selection electric potential to the second selection electric potential, and a sixth switching-on control electric potential for switching on the sixth field-effect transistor is applied to the sixth gates of the plurality of sixth field-effect transistors at a point of the time when the electric potential of the third selection line is the first selection electric potential or the second selection electric potential excluding the time when the electric potential of the first selection line is being varied from the first selection electric potential to the second selection electric potential.

The sixth electric potential is an electric potential which is provided for the third output line or the fourth output line as described later when electric signals are read out from the variable gain photoelectric conversion array as described in (39). The first cell electric potential is an electric potential having a polarity and a magnitude for performing a forward bias to the junction between the first base and the first emitter, the junction between the base and the emitter in connection thereto which are shared with the photoelectric conversion element, and the junction between the second semiconductor region and the third semiconductor region which are shared with the photoelectric conversion element. For example, this sixth electric potential is lower than or equal to 3 V when the emitter and the third semiconductor region are n-type and the first cell electric potential is 5 V.

The electric potential setting circuit (forty-eighth embodiment) as described below is an example of a circuit for setting the electric potential when the process for reading out from the photoelectric conversion array as described in (40) is performed.

(48)

According to the forty-eighth embodiment of the present invention, it is provided a sixth electric potential setting circuit, comprising:

at least a sixth field-effect transistor; and
a sixth electric potential providing means,
wherein the sixth field-effect transistor includes a sixth source and a sixth drain used for outputs and a sixth gate,
one of the sixth source and the sixth drain used for outputs is connected to at least one of the fourth selection lines of the variable gain photoelectric conversion array as described in (40), and the other of the sixth source and the sixth drain is connected to the sixth electric potential providing means,
a sixth switching-off control electric potential for switching off the sixth field-effect transistor is applied to the sixth gate of the sixth field-effect transistor at least when the electric potential of the third selection line is the second selection electric potential and the electric potential of the fourth selection line varies from the third selection electric potential to the fourth selection electric potential or when the electric potential of the fourth selection line is the fourth selection electric potential and the electric potential of the third selection line varies from the first selection electric potential to the second selection electric potential, and
a sixth switching-on control electric potential for switching on the sixth field-effect transistor is applied to the sixth gate of the sixth field-effect transistor at a point of the time when the electric potentials of the third selection line and the fourth selection line are the second selection electric potential and the fourth selection electric potential respectively or when the electric potential of the third selection line is the first selection electric potential and/or the electric potential of the fourth selection line is the third selection electric potential.

The electric potential setting circuit according to the forty-eighth embodiment of the present invention as described below is an example of an electric potential setting circuit in which the timings for connecting and resetting a sense amplifier and the third output line when the reading out process is performed to the photoelectric conversion array as described in (26), (37) or (39) is brought into shape.

(49)

According to the forty-ninth embodiment of the present invention, it is provided a sixth electric potential setting circuit, comprising:

a plurality of fourth field-effect transistors;
a sixth field-effect transistor; and
a sixth electric potential providing means,
wherein the fourth field-effect transistor includes a fourth source and a fourth drain used for outputs and a fourth gate,
the sixth field-effect transistor includes a sixth source and a sixth drain used for outputs and a sixth gate,
one of the fourth sources and the fourth drains used for outputs of the plurality of fourth field-effect transistors are each connected to the plurality of third output lines of the variable gain photoelectric conversion array as described in (39), and the other of the fourth sources and the fourth drains are each connected to an input of a sense amplifier,
one of the sixth source and the sixth drain used for outputs of the sixth field-effect transistor is connected to the other of the fourth sources and the fourth drains used for outputs of the plurality of fourth field-effect transistors which are connected to the input of the sense amplifier, and the other of the sixth source and the sixth drain is connected to the sixth electric potential providing means,
a fourth control voltage pulse for sequentially switching off, on and off the plurality of fourth field-effect transistors is sequentially applied to the fourth gates of the plurality of fourth field-effect transistors, and
a sixth switching-off control electric potential for switching off the sixth field-effect transistor is applied to the sixth gate of the sixth field-effect transistor at least when the fourth field-effect transistor is switched from off to on.

The electric potential setting circuit according to the fiftieth embodiment of the present invention as described below is another example of an electric potential setting circuit in which the timings for connecting and resetting a sense amplifier and the third output line when the reading out process is performed to the photoelectric conversion array as described in (39) is brought into shape.

(50)

According to the fiftieth embodiment of the present invention, it is provided a sixth electric potential setting circuit, comprising:

a plurality of fourth field-effect transistors; and
a plurality of sixth field-effect transistors,
wherein the fourth field-effect transistor includes a fourth source and a fourth drain used for outputs and a fourth gate,
the sixth field-effect transistor includes a sixth source and a sixth drain used for outputs and a sixth gate,
one of the fourth sources and the fourth drains used for outputs of the plurality of fourth field-effect transistors are each connected to the plurality of third output lines of the variable gain photoelectric conversion array as described in (39), and the other of the fourth sources and the fourth drains are each connected to inputs of a plurality of sense amplifiers,
one of the sixth sources and the sixth drains used for outputs of the plurality of sixth field-effect transistors are each connected to the other of the fourth sources and the fourth drains used for outputs of the plurality of fourth field-effect transistors which are each connected to the inputs of the sense amplifiers, and the other of the sixth sources and the sixth drains are connected to a sixth electric potential providing means,
a fourth control voltage pulse for sequentially switching off, on and off the plurality of fourth field-effect transistors is sequentially applied to the fourth gates of the plurality of fourth field-effect transistors, and
a sixth switching-off control electric potential for switching off the sixth field-effect transistors which are each connected to the one of the fourth source and the fourth drain used for outputs of the fourth field-effect transistors is applied to the sixth gates of the sixth field-effect transistors at least when the fourth field-effect transistors is switched from off to on.

The electric signal sensing control circuit according to the fifty-first embodiment of the present invention as described below is a circuit in which the circuit related to the read-out process performed to the variable gain photoelectric conversion array as described in (38) is defined using a connection circuit, output deselect electric potential setting circuit and output select electric potential setting circuit.

(51)

According to the fifty-first embodiment of the present invention, it is provided an electric signal sensing control circuit, comprising:

a connection circuit;

an output deselect electric potential setting circuit; and an output select electric potential setting circuit, wherein the connection circuit is provided between the plurality of second selection lines of the variable gain photoelectric conversion array as described in 38 and an input of a sense amplifier, an electric resistance between one second selection line selected from the plurality of second selection lines and the input of the sense amplifier in the connection circuit is lower than an electric resistance between another second selection line and the input of the sense amplifier, the output deselect electric potential setting circuit is provided between the plurality of second selection lines and a third electric potential providing means, while the electric resistance between the one second selection line selected from the plurality of second selection lines and the third electric potential providing means is higher than an electric resistance between the other second selection line which is not selected and the third electric potential providing means, the output deselect electric potential setting circuit provides the third electric potential for the other second selection line which is not selected, the output select electric potential setting circuit is provided between the connection circuit at the sense amplifier side and a fourth electric potential providing means, the electric resistance of the output select electric potential setting circuit at a point of the time at least when an electric potential of one of the plurality of first selection lines of the variable gain photoelectric conversion array varies from the first electric potential to the second electric potential is higher than at another point of the time.

The electric signal sensing control circuit according to the fifty-second embodiment of the present invention is an example in which the electric signal sensing control circuit described in (51) is configured by use of field-effect transistors.

(52)

According to the fifty-second embodiment of the present invention, it is provided the electric signal sensing control circuit as described in (51), wherein the connection circuit at least includes a plurality of fourth transistors, the plurality of fourth transistors are field-effect transistors each having a fourth source and a fourth drain used for outputs, one of the fourth sources and the fourth drains used for outputs are each connected to the plurality of second selection lines, and the other of the fourth sources and the fourth drains are connected to the input of the sense amplifier, the output deselect electric potential setting circuit includes a plurality of fifth transistors, each of the plurality of fifth transistors includes a fifth source and fifth drain used for outputs, one of the fifth sources and the fifth drains used for outputs are each connected with the plurality of second selection lines, and the other of the fifth sources and the fifth drains are each connected with the third electric potential providing means, the output select electric potential setting circuit at least includes a sixth transistor, the sixth transistor is a field-effect transistor and includes a sixth source and a sixth drain used for outputs, one of the sixth source and the sixth drain used for outputs is connected with a fourth electric potential providing means, and the other of the sixth source and the sixth drain is connected with the other of the fourth sources and the fourth drains used for outputs of the plurality of fourth transistors which are connected with the input of the sense amplifier.

The sense amplifier which is connected to the electric potential setting circuit or the connection circuit as described in (43) to (50) have a reference input terminal in addition to a signal input terminal, and the second electric potential in case of (43), the fourth electric potential in case of (44), (49) and (50) and the sixth electric potential in case of (45) to (48) is provided for the reference input terminal.

The second, third, fourth and sixth electric potential providing means includes an electronic circuit (generally integrated on the same chip as the variable gain photoelectric conversion array as described above for various embodiments) for generating the second, third, fourth and sixth electric potential respectively, or includes thin film interconnection which is integrated on the same chip as the variable gain photoelectric conversion array as described above for various embodiments and is connected from an external terminal supplied with the second, third, fourth and sixth electric potential respectively.

According to the present invention, techniques can be provided for realizing that the gain of a part of a plurality of photoelectric conversion cells included in a photoelectric conversion array is different from the gain of the other parts thereof.

Thus, according to the present invention, a photoelectric conversion element or a photoelectric conversion cell and a two-dimensional photoelectric conversion array with a higher sensitivity and a larger dynamic range than before are obtained.

In addition, employing a method of varying gain according to the present invention can do without the need for dealing with an extremely large electric current output. Therefore, according to the present invention, enlarging the planar dimensions of the transistor is not required for decreasing the collector electric resistance of the transistor substantially. Further, the dimensions of a field-effect transistor for selecting a cell (for example, the second or third field-effect transistor) is not required to be larger than before. Therefore, according to the present invention, the planar dimensions of a photoelectric conversion cell with a large dynamic range and a photoelectric conversion array with a large dynamic range may be smaller and more dense than before.

Moreover, according to the present invention, the brightness of a two-dimensional image may be adjusted partly and in real time at the imaging hardware itself without sacrificing the accuracy of the information of the image.

DESCRIPTION OF EMBODIMENTS

Figure 1:
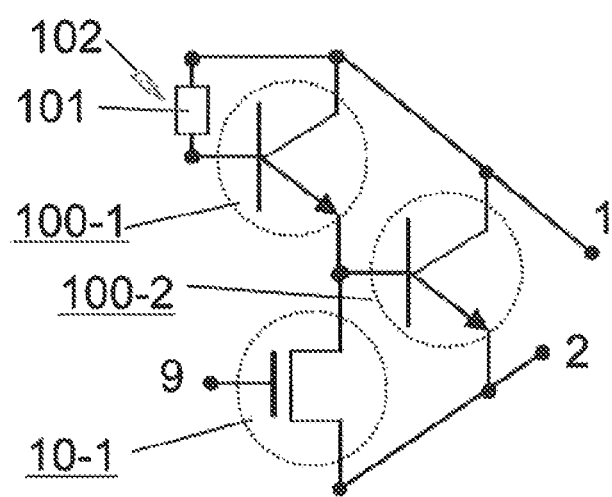
FIG. 1 is a circuit diagram of a variable gain photoelectric conversion device as described in (2) in an embodiment according to the present invention.

FIG. 1 is a circuit diagram illustrating a variable gain photoelectric conversion device as described in (2) in an embodiment according to the present invention.

The example illustrated in FIG. 1 shows a case in which an amplifying transistor is denoted by 100-1 and a case in which an amplifying transistor is denoted by 100-2. The base of the amplifying transistor 100-1 is connected to one end of a photoelectric conversion element 101. Additionally, in the diagram, the reference numeral 102 schematically indicates input light (the same shall apply to the following diagrams). The other end of the photoelectric conversion element 101 may be connected to a constant electric potential individually or may be used as a read-out control section for controlling the read-out process which is performed to a variable gain photoelectric conversion device according to the present invention. However, in the example illustrated in FIG. 1, the other end of the photoelectric conversion element 101 is connected to the collectors of the two transistors by a connection means. The collectors of the two transistors function as the first output section 1 of a variable gain photoelectric conversion device according to the present invention. In this circuit, the emitter of the amplifying transistor 100-1 is connected to the base of the amplifying transistor 100-2. Further, the amplifying transistors 100-1 and 100-2 form the amplifying part of the variable gain photoelectric conversion device. The amplifying part and the photoelectric conversion element connected therewith together are referred to as an amplifying photoelectric conversion part. Moreover, a first source or a first drain of a first field-effect transistor denoted by 10-1 is connected to the emitter and base of the amplifying transistor 100-2 (or the emitter of the amplifying transistor 100-1), and a first gate of the first field-effect transistor 10-1 forms a gain control section 9. The emitter of the amplifying transistor 100-2 functions as the second output section 2.

The method of varying gain as described in (1) according to the present invention is described below in regard to the specific example illustrated in FIG. 1.

The photoelectric current which flows through the photoelectric conversion element, the electric current generated by charging and discharging at the time of the read-out the electric charge discharged or accumulated by the photoelectric conversion element (meaning that electric charge is accumulated in an electric capacitor which is parasitic on or purposely connected to the photoelectric conversion element or the accumulated charge is discharged), or the voltage generated in the photoelectric conversion element is amplified by the amplifying transistor and flow into or out of the first output section 1 or the second output section 2. The flowing signal electric current or the flowing signal electric charge increase or decrease according to the electric potential of the gain control section. In the present invention, the signal electric current and the signal electric charge together are referred to as electric signals.

When an electric potential of the gain control section (gain control electric potential) is varied in the direction in which a channel of the first field-effect transistor is induced (switched on), an electric current path is formed for bypassing between the base and the emitter of the amplifying transistor 100-2. And the electric current which should flows between the base and the emitter thereof to be amplified is bypassed. Therefore, the amplification (gain) of the amplifying transistor in which the first field-effect transistor is connected between the base and the emitter thereof may decrease. That is, the gain may be varied by the gain control electric potential.

When the whole configuration illustrated in FIG. 1 is considered as a photoelectric conversion device, the gain of the signal electric current or the signal electric charge which flows into or flows out from the first output section or the second output section according to optical information input, namely the amplification (gain) of the electric signal varies according to the electric potential of the gain control section 9. This means that a variable gain photoelectric conversion device is achieved.

Additionally, here in the present invention, a transistor is referred to as an amplifying transistor when the amplification function of the transistor is emphasized and is referred to as merely a transistor when the amplifying transistor is restated or for the purpose of simplification in many cases. Further, when it is merely described as a transistor, this principally denotes a bipolar transistor in many cases.

In order to use the other end of the photoelectric conversion element as the read-out control section to prevent the read-out, the electric potential of the other end of the photoelectric conversion element is set to an electric potential which is in the direction from the base electric potential of the transistor 100-1 to the emitter electric potential thereof (at a negative electric potential with respect to the base electric potential in case that the transistor 100-1 is npn transistor, or at a positive electric potential with respect to the base electric potential in case that the transistor 100-1 is pnp transistor, namely a potential in the direction in which a reverse bias is applied between the base and the emitter). In order to allow the read-out, the other end of the photoelectric conversion element is set to an electric potential which is in the reverse direction from the base electric potential of the transistor 100-1 to the emitter electric potential thereof (at a positive electric potential with respect to the base electric potential in case that the transistor 100-1 is npn transistor, or at a negative electric potential with respect to the base electric potential in case that the transistor 100-1 is pnp transistor, namely a potential in the direction in which a forward bias is applied between the base and the emitter).

Figure 2:
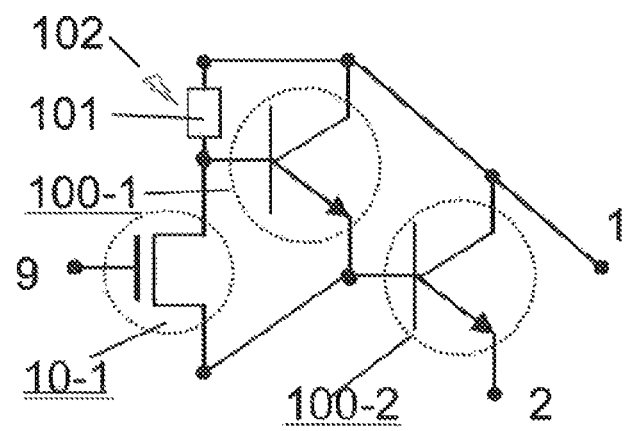
FIG. 2 is a circuit diagram of a variable gain photoelectric conversion device as described in (2) in another embodiment according to the present invention.

FIG. 2 is a circuit diagram illustrating another embodiment of the variable gain photoelectric conversion device as described in (2). The example illustrated in FIG. 2 is the same as the example illustrated in FIG. 1 except that the first source or the first drain of the first field-effect transistor 10-1 is connected to the base and the emitter of the transistor 100-1 (or the base of the transistor 100-2).

However, when the base of the transistor 100-1 is connected to the first source or the first drain of the first field-effect transistor, the leakage electric current from the first source or the first drain of the first field-effect transistor 10-1 overlap the base emitter leakage electric current of the transistor 100-1, and then the variable gain photoelectric conversion element may be less sensitive at low illumination. Therefore, a configuration is required to decrease the leakage electric current from the first source or the first drain of the first field-effect transistor by for example setting the impurity concentrations of the first source and the first drain which overlap the first gate lower than that of the contact part.

In addition, in the case of this the connection configuration of this first field-effect transistor, the gain control may be achieved in a circuit configuration without the transistor 100-2 in FIG. 2. In this case, the second output section is the emitter of the transistor 100-1.

Figure 3:
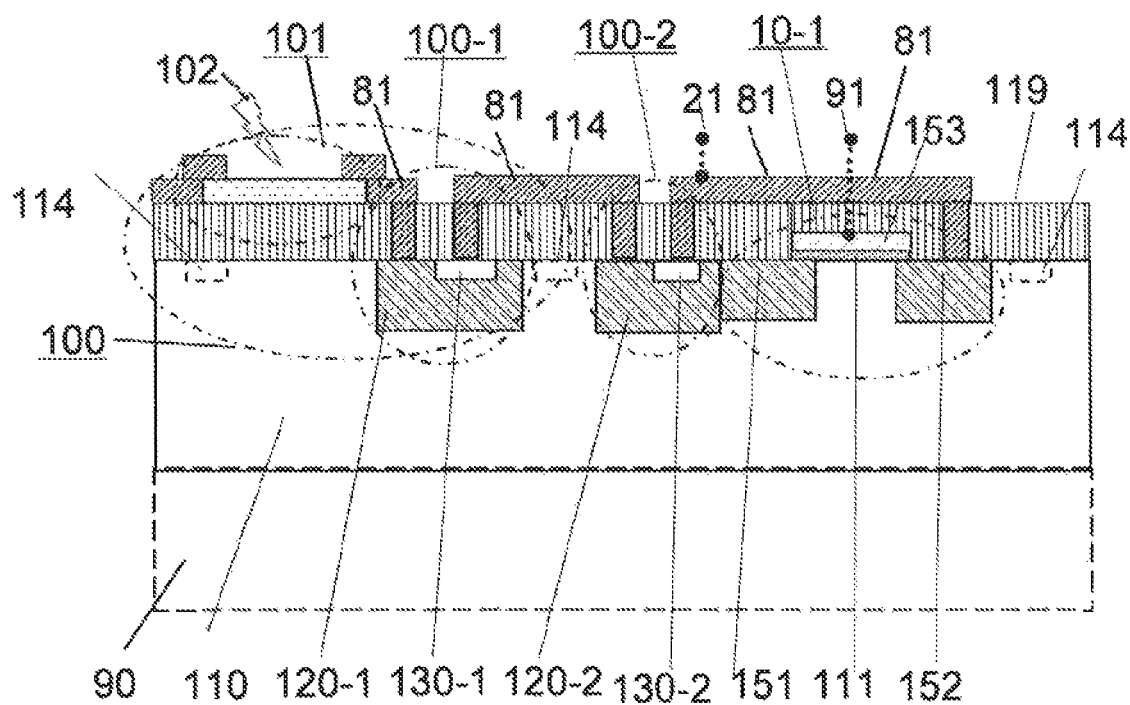
FIG. 3 is a sectional view in the embodiment illustrated in the circuit diagram of FIG. 1.

FIG. 3 is an example of a sectional view of an embodiment according to the present invention illustrated in the circuit diagram of FIG. 1, which is integrated on a semiconductor substrate. The reference numeral 110 denotes a first semiconductor region having a first conductivity type which functions as the collectors of the transistors 100-1 and 100-2. The reference numerals 120-1 and 120-2 denote a plurality of second semiconductor regions having a second conductivity type opposite to the first conductivity type provided so as to be in contact with the first semiconductor region 110 (in contact with the inside of the surface in the diagram) and functioning as the bases of the transistors 100-1 and 100-2. The reference numerals 130-1 and 130-2 denote a plurality of third semiconductor regions having the first conductivity type provided so as to be in contact with the second semiconductor regions 120-1 and 120-2 respectively (in contact with the inside of the surface in the diagram) and which function as the emitters of the transistors 100-1 and 100-2.

In FIG. 3, the reference numerals 151 and 152 denote the fifth and sixth region provided so as to be in contact with the first semiconductor region 110 (in contact with the inside of the surface in the diagram), which function as the first source and the first drain of the first field-effect transistor 10-1. (which は region 110 にほかからないのでカンマが必要。林) The fifth and sixth region form rectifying junctions with the first semiconductor region 110. The fifth region 151 and the sixth region 152 may be a semiconductor having the opposite conductivity type, or metal or metal silicide having a rectifying property with the first semiconductor region 110.

Further, a channel of the first field-effect transistor 10-1 is formed under a first insulating film 111 which is provided at least on the first surface of the first semiconductor region 110 between the fifth region 151 and the sixth region 152. The first surface of the first semiconductor region between the fifth region 151 and the sixth region 152 becomes a channel forming region.

The first gate 153 which is provided across the fifth region 151 and the sixth region 152 on the first insulating film 111 induces and depletes the channel with an electric potential applied to it. The first gate 153 increases the conductance or the electric current of the channel and decreases the gain by varying the electric potential in the direction to induce the channel.

In FIG. 3, since the fifth region 151 which is one of the first source and the first drain of the first field-effect transistor 10-1 is continuous with the base 120-2 of the transistor 100-2 and the sixth region 152 which is the other of the first source and the first drain of the first field-effect transistor 10-1 is connected to the emitter 130-2 of the transistor 100-2 via an interconnection conductive thin film 81, the channel of the first field-effect transistor 10-1 becomes a bypass electric current path between the base and the emitter of the transistor 100-2, and the variation of the conductance or the electric current varies the gain of the photoelectric conversion device illustrated in FIG. 3.

In FIG. 3, one end (the right edge of the element 101 in the diagram) of the photoelectric conversion element 101 formed on the insulating film 119 formed on the first surface of the first semiconductor region 110 is connected to the base 120-1 of the transistor 100-1 via the conductive film 81. In this diagram, the other end thereof (the left edge of the element 101 in the diagram) is provided with an independent bias electric potential or used as a read-out control section, which differs from the configuration illustrated in FIG. 1.

The first output section is the first semiconductor region 110 and is provided with an electrode as necessary. The second output section 21 is connected to the emitter 130-2 of the transistor 100-2. The gain control section 91 is connected to the first gate 153 of the first field-effect transistor.

Additionally, in FIG. 3, the reference numeral 114 denotes a region which is provided for cutting a parasitic channel which may be formed on the first surface of the first semiconductor region to prevent the generation of leakage electric current between the regions and of which an the impurity concentration is higher than that of the inside of the first semiconductor region 110.

Moreover, the first semiconductor region 110 may be a semiconductor substrate itself. Therefore, a plurality of photoelectric conversion elements as described above are integrated thereon and the photoelectric conversion elements may be arranged to be electrically isolated on the supporting substrate 90 when an independent electric potential is required to be provided independently from the first semiconductor region 110. In FIG. 3, the combination of the photoelectric conversion element 102 and the transistor 100-1, which is denoted by the reference numeral 100, is the minimum section of the amplifying photoelectric conversion part.

Figure 4:
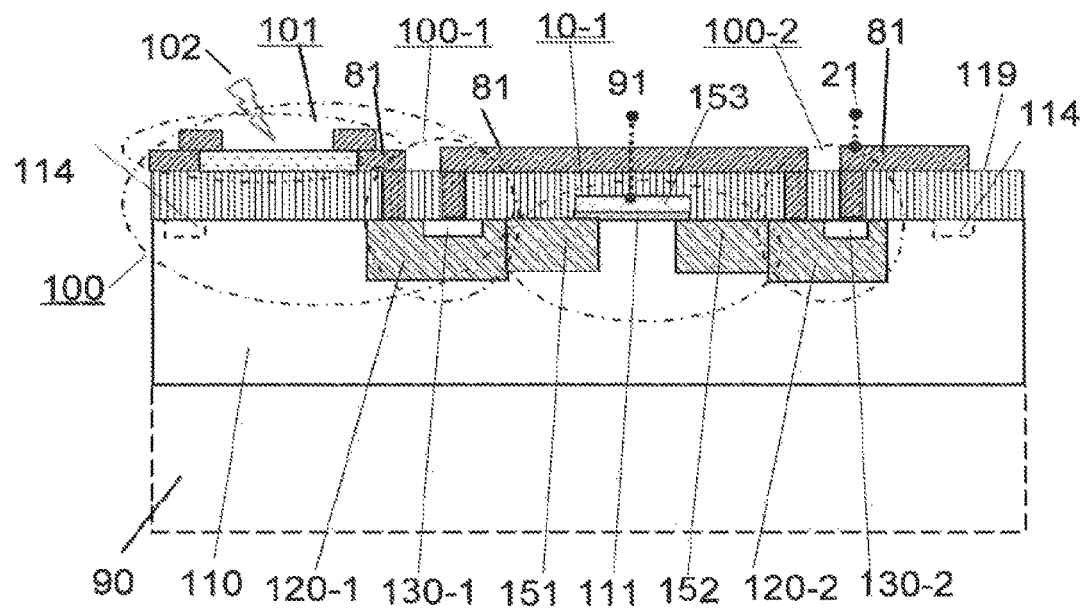
FIG. 4 a sectional view in the embodiment illustrated in the circuit diagram of FIG. 2.

FIG. 4 is an example of a sectional view of a structure for an embodiment as illustrated in the circuit diagram of FIG. 2. The same reference numbers as in FIG. 3 denote the same features. In FIG. 4, the second semiconductor regions 120-1 and 120-2 are continuous with the fifth region 151 and the sixth region 152, respectively. With this continuous configuration, the integration with a higher density may be achieved. The third semiconductor region 130-1 and the second semiconductor region 120-2 are connected to each other by the interconnection conductive thin film 81. As a result, the second semiconductor region 120-2 and the sixth region 152 which is continuous with the second semiconductor region 120-2 are electrically connected. That is, since the base (the second semiconductor region 120-1 in this example) of the transistor 100-1 is continuous and connected to one (the fifth region 151 in this example) of the first source and the first drain of the first field-effect transistor 10-1, and the emitter (the third semiconductor region 130-1 in this example) of the transistor 100-1 is connected to the other (the sixth region 152 in this example) of the first source and the first drain of the first field-effect transistor 10-1, then the first source and the first drain of the first field-effect transistor 10-1 are connected between the base and the emitter of the transistor 100-1 to control the gain of the photoelectric conversion device.

Similar to the example illustrated in FIG. 3, in the configuration illustrated in FIG. 4, the first output section is the first semiconductor region 110, the second output section 21 is from the third semiconductor region 130-2 and the gain control section 91 is the first gate 153. Additionally, the electrode extracted from each region corresponds to the terminal of the first output section, the second output section and the gain control section.

Figure 5:
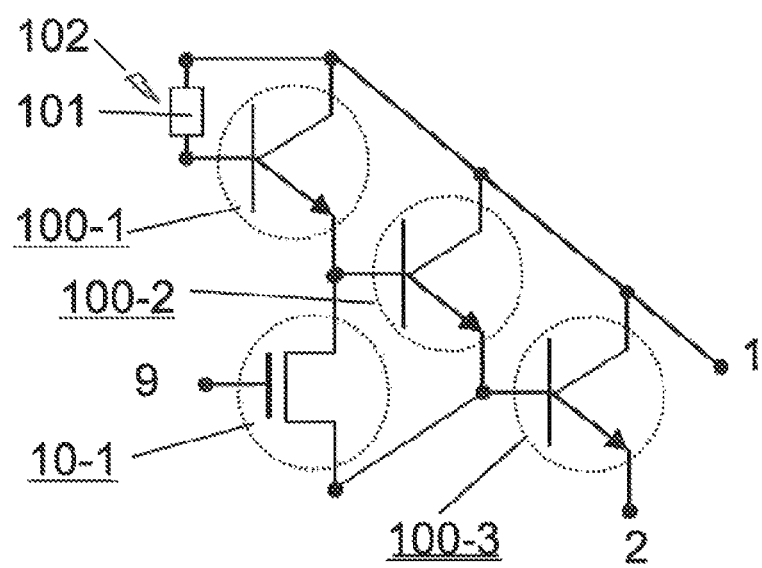
FIG. 5 is a circuit diagram in an embodiment in which a transistor is added to the configuration illustrated in FIG. 1.

FIG. 5 is a circuit diagram illustrating a configuration in which a transistor 100-3 is added to the configuration illustrated in FIG. 1. In the example illustrated in FIG. 5, the emitter of the transistor 100-2 is connected to the base of the transistor 100-3 and the emitter of the transistor 100-3 is the second output section 2 itself or is connected to the electrode of the second output section 2. The collector of the transistor 100-3 is connected to the collectors of other transistors 100-1 and 100-2, and further is connected to the first output section 1. The gain of this photoelectric conversion device is a product of the amplifications of the three transistors 100-1, 100-2 and 100-3, and is far larger than the gains of the photoelectric conversion devices illustrated in FIGS. 1 and 2 which is a product of the amplifications of the two transistors 100-1 and 100-2. By the first field-effect transistor 10-1, the amplification of the transistor 100-2 is made variable.

FIGS. 6 to 10 illustrate a configuration according to an example of the variable gain photoelectric conversion device as described in (6) according to the present invention. While the photoelectric conversion element 101 is illustrated in FIGS. 1, 2 and 5, the photoelectric conversion element 101 is not particularly illustrated in FIGS. 6 to 10 since these diagrams illustrate a case in which the base and the collector of the transistor 100-1 is used as a photoelectric conversion element. Since the photoelectric conversion element and the base is continuous with each other and the base terminal for interconnecting the amplifying transistors is not needed, the base terminal is not illustrated. However, a light input 102 to the base is illustrated.

Figure 6:
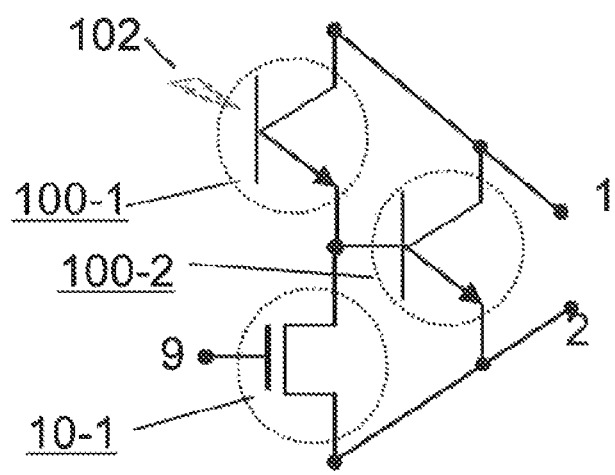
FIG. 6 is a circuit diagram of a variable gain photoelectric conversion device as described in (6) in an embodiment according to the present invention.

FIG. 6 exemplifies a two-transistor case in which the amplifying transistor is 100-1 or 100-2. In the example illustrated in FIG. 6, the collectors of the two transistors are interconnected, and there are a plurality of bases, that is, the bases of the two transistors and a plurality of emitters provided for the plurality of bases. The photoelectric current generated by the light input denoted by the reference numeral 102 which is input to the base of the amplifying transistor 100-1 or the charging or discharging electric current of the electric charge which is discharged or accumulated by the photoelectric current is amplified and read out. The base of the amplifying transistor 100-1 is shared with the photoelectric conversion element (not illustrated) and is not connected to the other bases and emitters. In the present invention, the electric current and the electric charge which is read out from the first output section 1 and the second output section 2 is referred to as signal electric current and signal electric charge. Additionally, these are referred to collectively as electric signal. In the example illustrated in FIG. 6, the collectors of the two amplifying transistor 100-1 and 100-2 are connected by an interconnection means, and form the first output section 1 of a variable gain photoelectric conversion device according to the present invention. Further, in this circuit, the emitter of the amplifying transistor 100-1 is connected to the base of the amplifying transistor 100-2. Moreover, the first source or the first drain of the first field-effect transistor denoted by the reference numeral 10-1 is connected to the emitter and the base of the amplifying transistor 100-2 (or the emitter of the transistor 100-1). Additionally, the first gate of the first field-effect transistor 10-1 is the gain control section 9. The emitter of the amplifying transistor 100-2 is not connected to the other bases and emitters, and is the second output section 2 of a variable gain photoelectric conversion device in the present embodiment. The amplifying transistors 100-1 and 100-2, and the base and the collector of the amplifying transistor 100-*i* which are used as a photoelectric conversion element form an amplifying photoelectric conversion part.

In addition, in the present invention, when the amplification effect of a transistor is stressed, it is described as amplifying transistor. However, it is referred to as merely a transistor when the amplifying transistor is restated or for the purpose of simplification in many cases.

The photoelectric current which flows through the base-collector junction of the transistor 100-1 as the photoelectric conversion element is amplified by the amplifying transistor and then flows into and from the first output section 1 or the second output section 2 as signal electric current and signal electric charge. Alternatively, the electric current for charging at the time of the read-out the amount which the charge accumulated in the junction (a junction electric capacitor or an electric capacitor which is connected in parallel with the junction) is discharged by the photoelectric current is amplified by the amplifying transistor and then flows into and from the first output section 1 and the second output section 2 as signal electric current or signal electric charge. The magnitudes of the electric signals increase and decrease according to the electric potential of the gain control section. When the electric potential of the gain control section varies in the direction in which the channel of the first field-effect transistor is induced (switched on), an electric current path is formed for bypassing between the base and the emitter of the transistor and then the amplification of a transistor with the base and the emitter decreases. Namely, when the whole configuration illustrated in FIG. 6 is considered as a photoelectric conversion device, the gain of the electric signal obtained according to optical information input varies according to the electric potential of the gain control section 9 (gain control electric potential). This means that a variable gain photoelectric conversion device is achieved.

Figure 7:
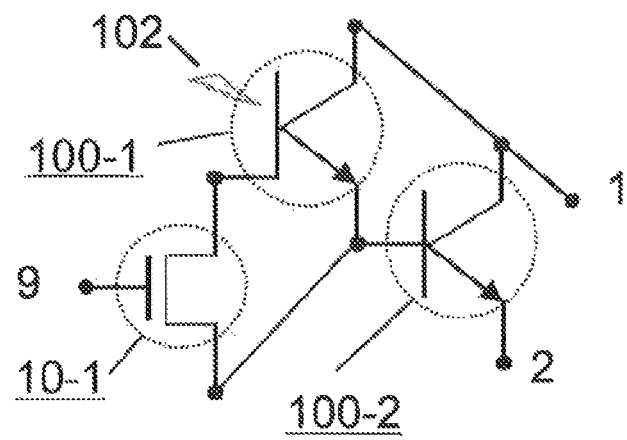
FIG. 7 a circuit diagram of a variable gain photoelectric conversion device as described in (6) in another embodiment according to the present invention.

The circuit exemplified in FIG. 7 is the same as the circuit illustrated in FIG. 6 except that the first source or the first drain of the first field-effect transistor 10-1 is connected to the base and the emitter of the amplifying transistor 100-1 (or the base of the transistor 100-2). The base terminal of the transistor 100-1 is illustrated since the base is connected to the first source or the first drain of the first field-effect transistor 10-1.

Figure 8:
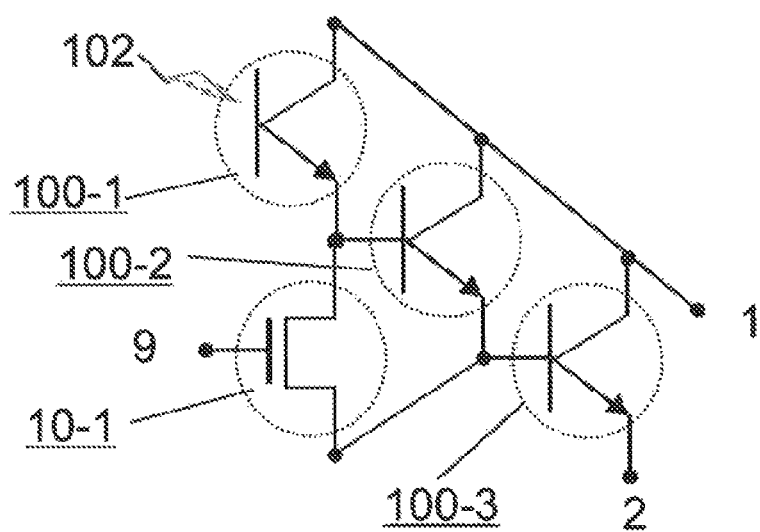
FIG. 8 a circuit diagram of a variable gain photoelectric conversion device as described in (6) in another embodiment according to the present invention.

The circuit exemplified in FIG. 8 is a circuit in which the base-collector junction of the transistor 100-1 is used as a photoelectric conversion element in the same configuration as the circuit illustrated in FIG. 5. In the circuit illustrated in FIG. 8, the collectors of the three transistors 100-1, 100-2 and 100-3 are interconnected together, and there are a plurality of bases formed by the bases of the three transistors and a plurality of emitters provided for the plurality of bases. In the example illustrated in FIG. 8, the collectors of the three transistors 100-1, 100-2 and 100-3 are connected by an interconnection means, and form the first output section 1 of a variable gain photoelectric conversion device according to the present invention. In this circuit, the emitter of the transistor 100-1 is connected to the base of the transistor 100-2 and the emitter of the transistor 100-2 is connected to the base of the transistor 100-3. In addition, the first source or the first drain of the first field-effect transistor denoted by the reference numeral 10-1 is connected to the emitter and the base of the amplifying transistor 100-2 (or the emitter of the transistor 100-1), and the first gate of the first field-effect transistor 10-1 is the gain control section 9. The emitter of the amplifying transistor 100-3 is not connected to the other bases and emitters, and is the second output section 2 of a variable gain photoelectric conversion device according to the present invention. The transistors 100-1, 100-2 and 100-3, and the base and the collector of the transistor 100-1 which are shared as photoelectric conversion elements form an amplifying photoelectric conversion part. The base of the transistor 100-1 is not interconnected to the plurality of bases or the plurality of emitters of the plurality of transistors in the amplifying photoelectric conversion part.

Figure 9:
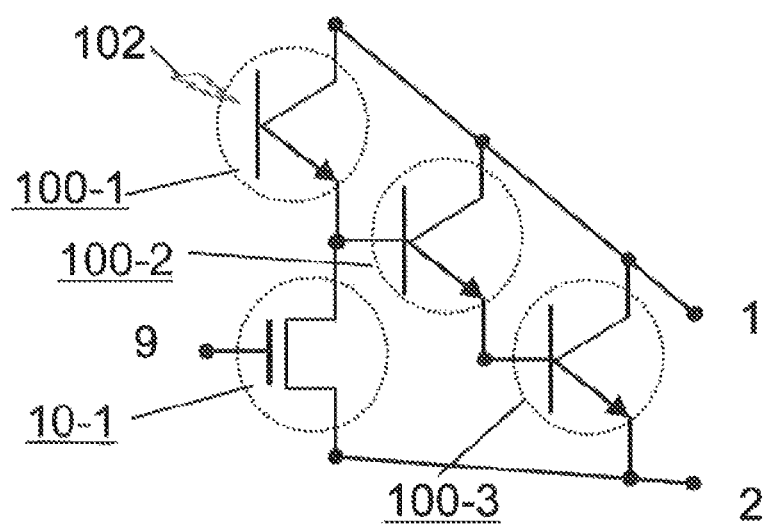
FIG. 9 is a circuit diagram of a variable gain photoelectric conversion device as described in (6) in another embodiment according to the present invention.

FIG. 9 exemplifies a configuration circuit diagram in case that the first source or the first drain of the first field-effect transistor 10-1 to which the emitter of the transistor 100-2 is connected in the circuit illustrated in FIG. 8 is connected to the emitter of the transistor 100-3 instead. In the circuit illustrated in FIG. 8, the first source or the first drain of the first field-effect transistor 10-1 bypasses between the base and the emitter of one transistor. To the contrary, in the circuit illustrated in FIG. 9, since the first field-effect transistor 10-1 is connected between the base and the emitter of the two transistors 100-2 and 100-3, the amount of the gain variation is not the amplification of one transistor but a product of the amplifications of two transistors. Thus, in the circuit illustrated in FIG. 9, the control range is remarkably larger than that of the circuit illustrated in FIG. 8.

Figure 10:
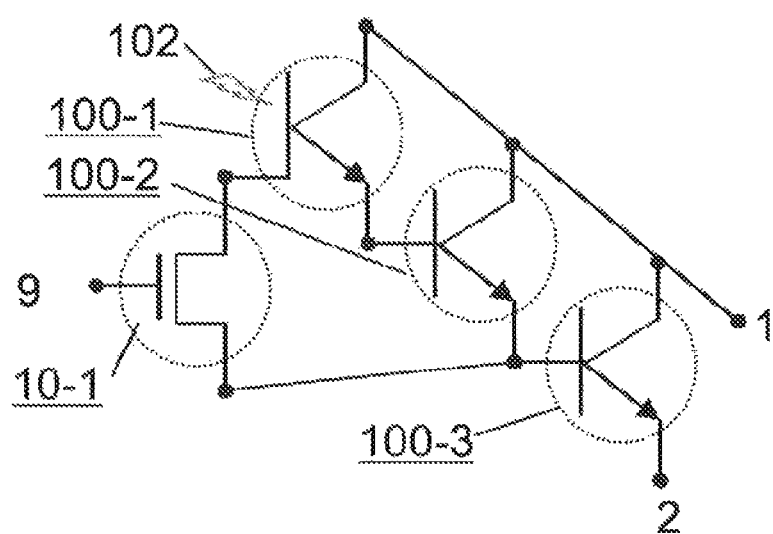
FIG. 10 is a circuit diagram of a variable gain photoelectric conversion device as described in (6) in another embodiment according to the present invention.

FIG. 10 exemplifies a configuration circuit diagram in case that the first source or the first drain of the first field-effect transistor 10-1 to which the base of the transistor 100-2 is connected in the circuit illustrated in FIG. 8 is connected to the base of the transistor 100-1 instead. In the circuit illustrated in FIG. 8, the first source or the first drain of the first field-effect transistor 10-1 bypasses between the base and the emitter of one transistor. To the contrary, in the circuit illustrated in FIG. 10, since the first field-effect transistor 10-1 is connected between the base and the emitter of the two transistors 100-1 and 100-2, the amount of the gain variation is not the amplification of one transistor but a product of the amplifications of two transistors. Thus, in the circuit illustrated in FIG. 10, the control range is remarkably larger than that of the circuit illustrated in FIG. 8.

In addition, when direct electric current read-out is performed, it is desirable that an electric potential polarity and a polarity of the channel conductivity type is selected so that the first source of the first field-effect transistor is connected to the base of the transistor 100-1 (when the transistor 100-1 is npn-type, the first field-effect transistor is p-channel). As for the case of the pulse operation for reading out discharging electric charge or accumulating electric charge, the reverse is true. Generally, the drain leakage electric current from a field-effect transistor is larger than the source leakage electric current.

Figure 11:
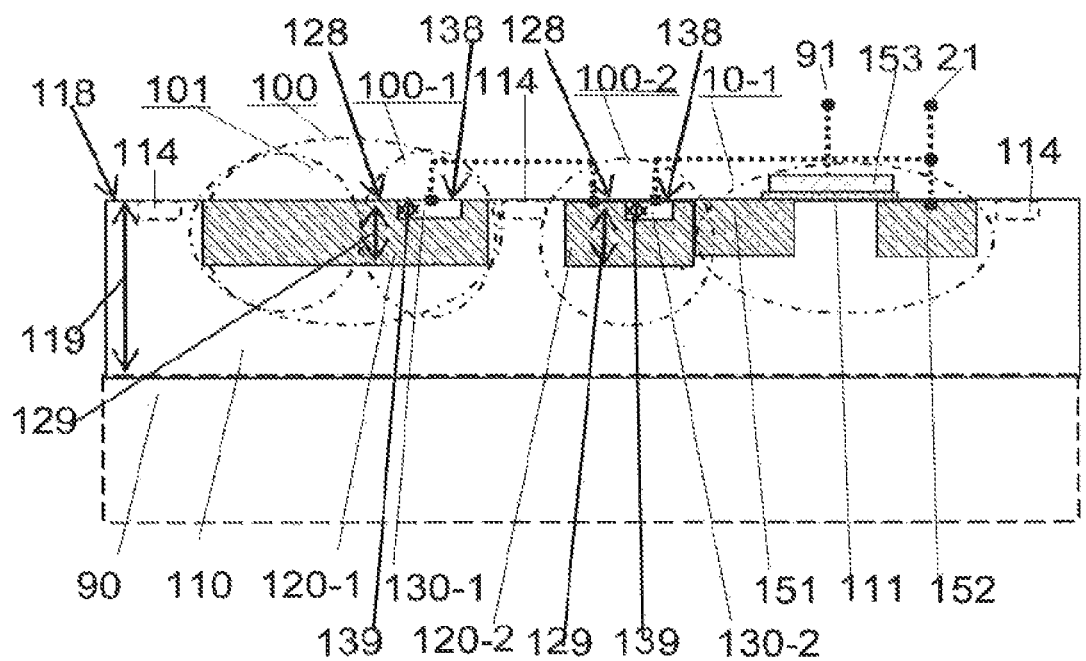
FIG. 11 is a sectional view of a variable gain photoelectric conversion device as described in (6) or (7) in an embodiment according to the present invention.

FIGS. 11 to 14 illustrate examples of sectional structure views of the variable gain photoelectric conversion devices as described in (6) and (7) in embodiments according to the present invention. Additionally, the sectional structure exemplified in FIG. 11 is an example of a sectional structure view of the configurations exemplified by the circuit diagram illustrated in FIG. 6 according to the present invention. The configuration illustrated in FIG. 11 is the same configuration illustrated in FIG. 3 except that the part denoted by the reference numeral 101 in the base region (120-1) and the collector region (110) of the transistor 110-1 are shared to form a photoelectric conversion element 101. Further, in sectional structure views referred hereinafter, the conductive thin films for interconnection which are illustrated in FIGS. 3 and 4 are not illustrated and instead broken lines are drawn between the regions to be interconnected to show the interconnections for simplification.

Explanation of FIG. 11 is made here although redundant explanations may be made since FIG. 3 has been already explained. In a part of the first surface of the first semiconductor region 110 having the first surface 118, the first thickness 119 and the first conductivity type, a plurality of second semiconductor regions 120-1 and 120-2 having the second surface 128, the second thickness 129 and the opposite conductivity type (second conductivity type) are provided in contact with the first semiconductor region 110 (in contact with the inside of the surface thereof in the diagram). In addition, In a part of the second surface 128 of the second semiconductor region, the third semiconductor regions 130-1 and 130-2 having the third surface 138, the third thickness 139 and the first conductivity type is provided in contact with the second semiconductor region (in contact with the inside of the surface thereof in the diagram). The third semiconductor region 130-1 is provided so as to be in contact with the part of the second surface of the second semiconductor region 120-1 (in contact with the inside of the surface thereof in the diagram), and the third semiconductor region 130-2 is provided in contact with the part of the second surface of the second semiconductor region 120-2 (in contact with the inside of the surface thereof in the diagram). The fifth region 151 and the sixth region 152 are provided in contact with a part of the first surface 118 of the first semiconductor region (in contact with the inside of the surface thereof in the diagram). The first insulating film 111 is formed on the first surface 118 between the fifth region and the sixth region of the first semiconductor region 110. The first insulating film 111 is extended to a part of the surface of the fifth region 151 and the sixth region 152. The first gate 153 is formed on the first insulating film 111 across the fifth region 151 and the sixth region 152.

The transistor 100-1 is configured so that the first semiconductor region 110 is the collector, the second semiconductor region 120-1 is the base and the third semiconductor region 130-1, which is provided in contact with the second semiconductor region 120-1, is the emitter. The transistor 100-2 is configured so that the first semiconductor region 110 is the collector, the second semiconductor region 120-2 is the base and the third semiconductor region 130-2, which is provided in contact with the second semiconductor region 120-2, is the emitter. The collectors of the two transistors are the first semiconductor region 110 and are electrically connected equivalently.

The first field-effect transistor 10-1 is configured so that the fifth region 151 and the sixth region 152, which is provided in contact with the part of the surface of the first semiconductor region 110, are the first source and the first drain, the first insulating film 111 is the gate insulating film and the first gate 153 is the first gate. According to the electric potential applied to the first gate, aA channel is induced and depleted in the part of the surface of the first semiconductor region between the fifth region and the sixth region under the first gate 153.

The photoelectric conversion element 101 includes the first semiconductor region 110 and the second semiconductor region 120-1. For this photoelectric conversion element 101, the initial amplifying transistor is the transistor 100-1. The photoelectric conversion element 101 inputs to the base of this transistor the photoelectric conversion electric current of the photoelectric conversion element 101, the discharging or charging electric current of the electric charge which is discharged or charged in the junction (capacitance) between the first semiconductor region 110 and the second semiconductor region 120-1 by the photoelectric conversion electric current, and then the amplified electric current as electric signals is obtained from the third semiconductor region 130-2, which is the emitter of the transistor 100-2. For this purpose, the photoelectric conversion element 101 and the second semiconductor region 120-1 for the electric connection to the base of the transistor 100-1 are continuous with each other or commonly configured.

In the circuit exemplified in FIG. 11, the second semiconductor region 120-2 and the third semiconductor region 130-1 are interconnected to each other out of the plurality of second semiconductor regions and the plurality of third semiconductor regions. On the other hand, the second semiconductor region 120-1 and the third semiconductor region 130-2 are not interconnected. The third semiconductor region 130-2 is used as the second output section of the variable gain photoelectric conversion device of the present embodiment. The second output section 21 may be connected to an electrode via conductive interconnection means in many cases. In the circuit exemplified in FIG. 11, the first semiconductor region 110 is used as the first output section of the variable gain photoelectric conversion device of the present embodiment, and the first output section may be connected to an electrode via conductive interconnection means in many cases.

The fifth region 151, which is one the first source and the first drain of the first field-effect transistor 10-1 is continuous and electrically connected to the second semiconductor region 120-2, which is the base of the transistor 100-2. In terms of employing this configuration, the circuit exemplified in FIG. 11 is also a variable gain photoelectric conversion device as described in (7) in an embodiment according to the present invention. The sixth region 152, which is the other of the first source and the first drain of the first field-effect transistor 10-1, is connected to the third semiconductor region 120-3, which is the emitter of the transistor 100-2, via a conductive thin film (schematically illustrated by broken lines in FIG. 11).

The electric variable amplified by the transistor 100-1 is input to the second semiconductor region 120-2 (the base of the transistor 100-2) from the third semiconductor region 130-1 which is interconnected to the second semiconductor region 120-2, amplified by the transistor 100-2, and then is output as electric signals from the third semiconductor region 130-2, which is the second output section of the variable gain photoelectric conversion device in the present embodiment.

As described above, one of the first source and the first drain of the first field-effect transistor is continuous and connected to the base (the second semiconductor region 120-2) of the transistor 100-2, the other thereof is connected to the emitter (the third semiconductor region 130-2) of the transistor 100-2, and thus the bypass path between the base and the emitter of the transistor 100-2 is formed. Therefore, the amplification of the transistor 100-2 may be varied by varying the conductance or the electric current between the first source and the first drain of the first field-effect transistor 10-1 by the gain control electric potential applied to the first gate 153, and therefore the gain of the variable gain photoelectric conversion device of the present embodiment may be varied. In addition, in the diagram, the first gate 153 itself may be used as the gain control section, or the conductive thin film or the terminal connected to the first gate 153 may be gain control section 91 (the same shall apply hereinafter).

Figure 12:
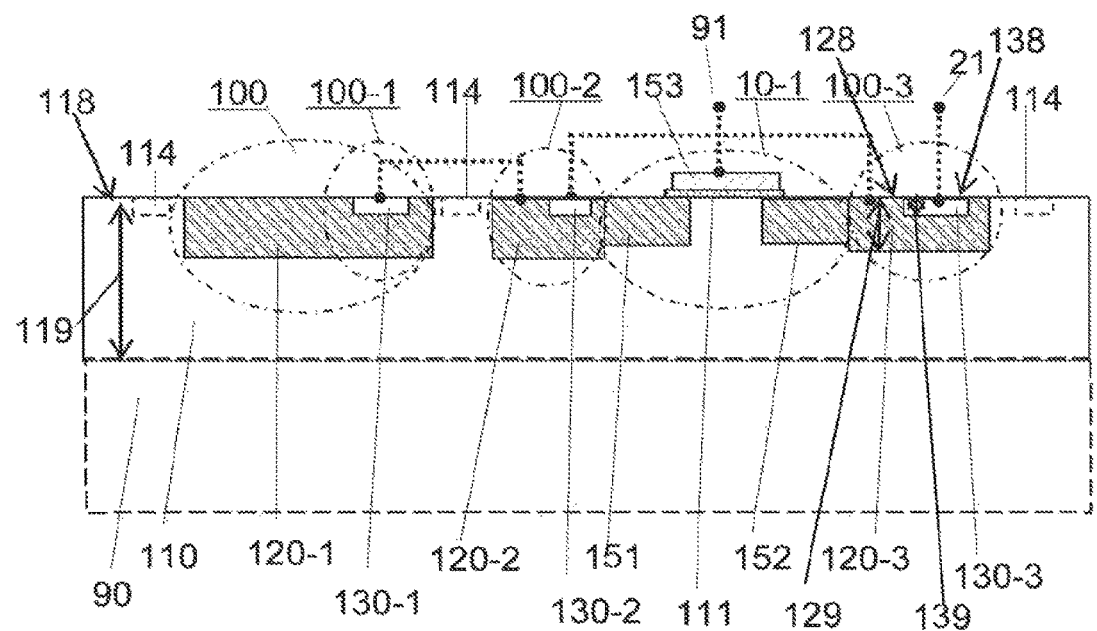
FIG. 12 is a sectional view of a variable gain photoelectric conversion device as described in (6) or (7) in another embodiment according to the present invention.

FIG. 12 also illustrates an example of the cross-section configuration of the embodiment illustrated in FIG. 8 and exemplifies a variable gain photoelectric conversion device as described in (6) and (7).

In the circuit illustrated in FIG. 12, the number of the second semiconductor regions and the number of the third semiconductor regions are three each, which are more than those in the circuit illustrated in FIG. 11. The added second semiconductor region 120-3 and the added third semiconductor region 130-3 have the second surface 128 and the second thickness 129 and the third surface 138 and the third thickness 139, and function as the base and the emitter of the transistor 100-3, respectively. The third semiconductor region 130-2, which is not interconnected in FIG. 11, is connected to the second semiconductor region 120-3 in this embodiment, and passes electric signals to the base of the transistor 100-3. Thus, the whole gain of the variable gain photoelectric conversion device in the present embodiment is increased by the amount of the amplification achieved by the transistor 100-3.

In the present embodiment, the third semiconductor region 130-3 is the third semiconductor region which is not interconnected and the second output section of the variable gain photoelectric conversion device in the present embodiment. In the circuit exemplified in FIG. 12, the sixth region 152, which is the other of the first source and the first drain of the first field-effect transistor, is continuous with the second semiconductor region 120-3 for the purpose of a high-density layout. In terms of employing this layout, the circuit exemplified in FIG. 12 is said to be another embodiment of a variable gain photoelectric conversion device as described in (7). The third semiconductor region 130-2 is connected to the other (the sixth region 152) of the first source and the first drain of the first field-effect transistor via the second semiconductor region 120-3 which is continuous with the sixth region 152. Namely, the base and the emitter of the transistor 100-2 are bypassed by the first source and the first drain of the first field-effect transistor 10-1. Similar to the circuit exemplified in FIG. 11, with this configuration, the circuit exemplified in FIG. 12 achieves a variable gain photoelectric conversion element. Additionally, the maximum gain in the present embodiment is larger by the amount of the amplification achieved by the transistor 100-3 than that in the circuit exemplified in FIG. 11.

Figure 13:
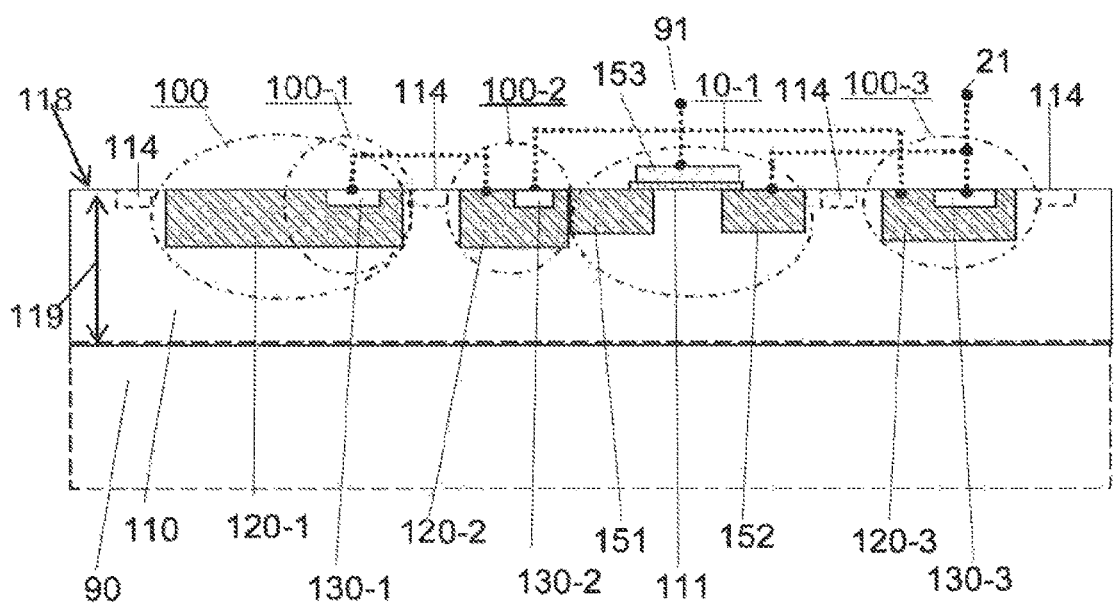
FIG. 13 is a sectional view of a variable gain photoelectric conversion device as described in (6) or (7) in another embodiment according to the present invention.

The circuit exemplified in FIG. 13 is a sectional view of the variable gain photoelectric conversion device as described in (6) and (7) in another embodiment, and is an example of the sectional view of the circuit exemplified in FIG. 9. Further, the circuit exemplified in FIG. 13 is an embodiment of the variable gain photoelectric conversion cell as described in (22).

In FIG. 13, the connection conditions between a plurality of the second semiconductor regions 120-1, 120-2 and 120-3 and a plurality of the third semiconductor regions 130-1, 130-2 and 130-3 are the same as in FIG. 12. However, the fifth region 151, which is one of the first source and the first drain of the first field-effect transistor 10-1, is continuous and electrically connected to the second semiconductor region 120-2, which is the base of the transistor 100-2. In addition, the sixth region 152, which is the other of the first source and the first drain of the first field-effect transistor 10-1, is connected to the third semiconductor region 130-3, which is the emitter of the transistor 100-3, via an interconnecting conductive thin film (illustrated by broken lines). Namely, the base of the transistor 100-2 and the emitter of the transistor 100-3 are bypassed by the first source and the first drain of the first field-effect transistor 10-1. Since the third semiconductor region 130-2, which is the emitter of the transistor 100-2, and the second semiconductor region 120-3, which is the base of the transistor 100-3, are interconnected to each other, the amplification at the amplifying stage which is configured by two transistors, transistor 100-2 and transistor 100-3, may be varied by the gain control electric potential applied to the first gate of the first field-effect transistor 10-1. Therefore, the variable gain photoelectric conversion device exemplified in FIG. 13 may achieve a variable gain which is order of magnitude higher than that of the variable gain photoelectric conversion devices having the cross-section configurations illustrated in FIGS. 11 and 12.

In terms that the fifth region 151, which is one of the first source and the first drain of the first field-effect transistor 10-1, is continuous with the second semiconductor region 120-2, which is the base of the transistor 100-2, the variable gain photoelectric conversion element exemplified in FIG. 13 is also a variable gain photoelectric conversion device as described in (8) in another embodiment.

Figure 14:
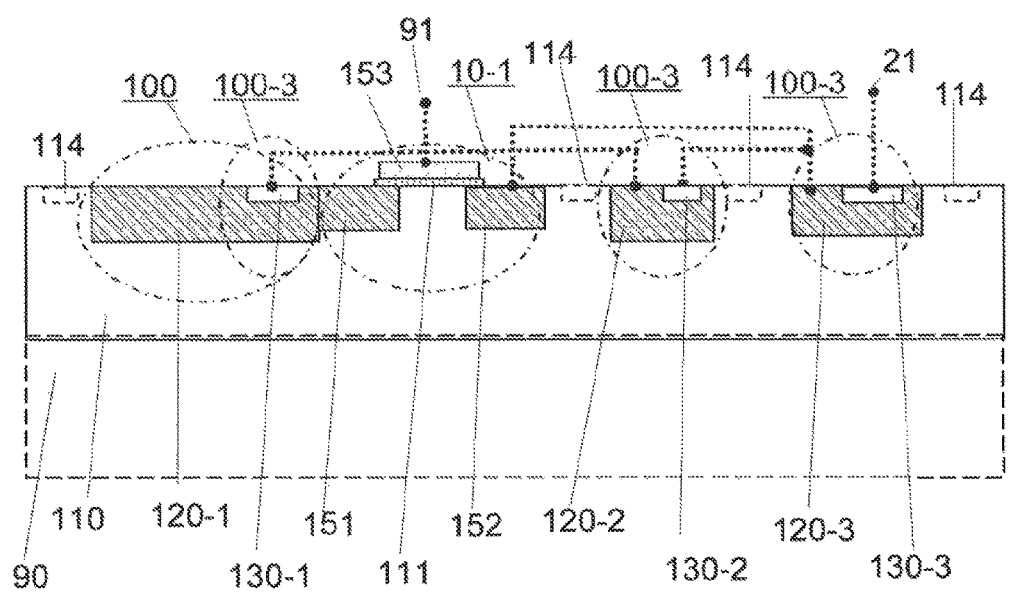
FIG. 14 is a sectional view of a variable gain photoelectric conversion device as described in (6) or (7) in another embodiment according to the present invention.

FIG. 14 exemplifies a sectional view of variable gain photoelectric conversion devices as described in (6) and (7) in another embodiment. Further, the circuit exemplified in FIG. 14 is an example of a sectional view of the circuit illustrated in FIG. 10 in an embodiment.

In FIG. 14, the connection conditions between a plurality of the second semiconductor regions 120-1, 120-2 and 120-3 and a plurality of the third semiconductor regions 130-1, 130-2 and 130-3 are the same as in FIG. 12. However, the fifth region 151, which is one of the first source and the first drain of the first field-effect transistor 10-1, is continuous with and electrically connected to the second semiconductor region 120-1, which is the base of the transistor 100-1. On the other hand, the sixth region 152, which is the other of the first source and the first drain of the first field-effect transistor 10-1, is connected to the third semiconductor region 130-2, which is the emitter of the transistor 100-2, via an interconnecting conductive thin film (illustrated by broken lines). Namely, the base of the transistor 100-1 and the emitter of the transistor 100-2 are bypassed by the first source and the first drain of the first field-effect transistor 10-1. In the present embodiment, the amplification at the amplifying stage which is configured by two transistors, transistor 100-1 and transistor 100-2, may be varied by the gain control electric potential applied to the first gate of the first field-effect transistor 10-1. Therefore, the variable gain photoelectric conversion device exemplified in FIG. 14 may achieve a variable gain which is order of magnitude higher than that of the variable gain photoelectric conversion devices having the cross-section configurations illustrated in FIGS. 11 and 12.

In terms that the fifth region 151, which is one of the first source and the first drain of the first field-effect transistor 10-1, is continuous with the second semiconductor region 120-1, which is the base of the transistor 100-1, the present embodiment is also another embodiment of a variable gain photoelectric conversion device as described in (8).

Figure 15:
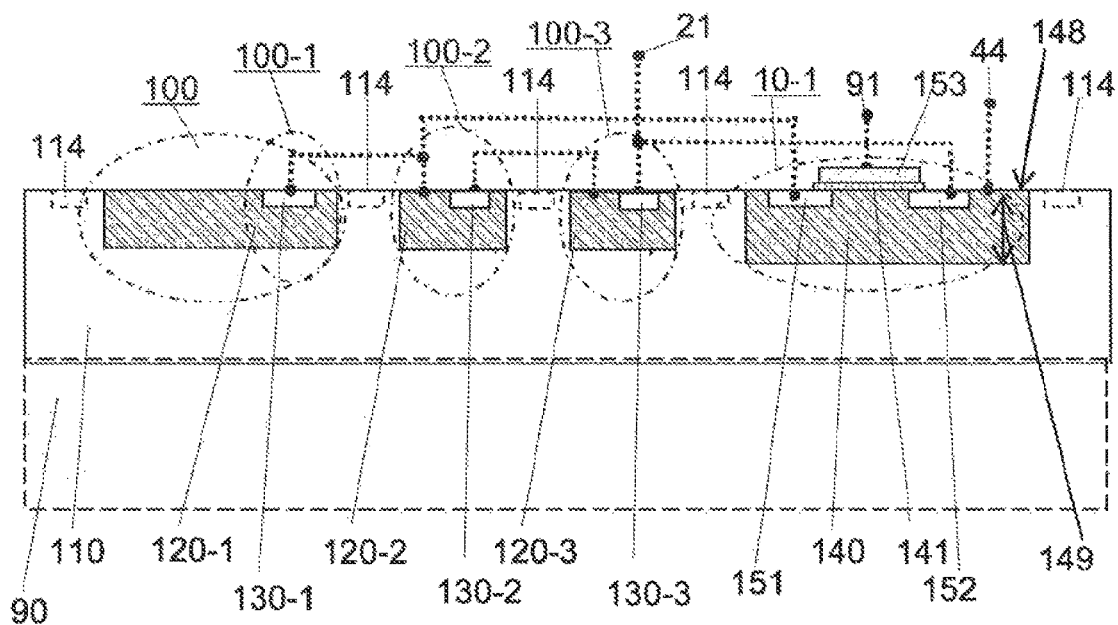
FIG. 15 is a sectional view of a variable gain photoelectric conversion device as described in (6) or (10) in another embodiment according to the present invention.

FIG. 15 exemplifies a sectional view of variable gain photoelectric conversion devices as described in (6) and (10) in another embodiment. Further, the circuit exemplified in FIG. 15 is an example of a sectional view of the circuit illustrated in FIG. 9 in an embodiment.

In FIG. 15, the interconnections between the transistors 100-1, 100-2 and 100-3, that is, the interconnections between the plurality of second semiconductor regions and the plurality of third semiconductor regions are the same as in FIG. 13. To the contrary, the cross-section configuration of the first field-effect transistor 10-1 in the circuit exemplified in FIG. 15 is different from that in the circuit exemplified in FIG. 13.

In FIG. 15, a fourth semiconductor region 140 having a fourth surface, a fourth thickness and the opposite conductivity type (the second conductivity type) is provided in contact with the first semiconductor region 110 (in contact with the inside of the surface thereof in the diagram).

The fifth region 151 and the sixth region 152 are provided in contact with a part of the fourth surface 148 of the fourth semiconductor region (in contact with the inside of the surface thereof in the diagram). In addition, the fifth region 151 and the sixth region 152 are configured by a material which forms a rectifying junction with the fourth semiconductor region such as a semiconductor having the first conductivity type, or metal or silicide which has a work function to form a Schottky junction with the fourth semiconductor region. Further, the fourth insulating film 141 is provided on a part of the fourth surface 148 of the fourth semiconductor between the fifth region 151 and the sixth region 152. And a fourth insulating film 141 is extended to a part of the surfaces of the fifth region 151 and the sixth region 152. A conductive thin film 153 is formed on the fourth insulating film across the fifth region 151 and the sixth region 152.

In the embodiment illustrated in FIG. 15, the fifth region 151 functions as one of the first source and the first drain of the first field-effect transistor 10-1. In addition, the sixth region 152 functions as the other of the first source and the first drain of the first field-effect transistor 10-1. Further, the conductive thin film 153 functions as the first gate of the first field-effect transistor 10-1. The fifth region 151, which is one of the first source and the first drain of the first field-effect transistor 10-1, is connected to the second semiconductor region 120-2. Moreover, the sixth region 152, which is the other of the first source and the first drain of the first field-effect transistor 10-1, is connected to the third semiconductor region 130-3. Namely, the fifth region 151, which is one of the first source and the first drain of the first field-effect transistor 10-1, is connected to the base of the transistor 100-2. Additionally, the sixth region 152, which is the other of the first source and the first drain of the first filed-effect transistor 101, is connected to the emitter of the transistor 100-3. Thus, the gain achieved by two amplifying stages which is configured by the transistor 100-2 and the transistor 100-3 can be varied by the gain control electric potential applied to the first gate 153.

The first gate 153 itself, the conductive thin film connected to it or the terminal configured thereby may be the gain control section 91. And, the emitter 130-3 itself of the third transistor, the conductive thin film connected to it or the terminal configured thereby may be the second output section 21.

In the embodiment illustrated in FIG. 15, although the surface area of the device is increased for the separation of the fourth semiconductor region, the increase of the leakage electric current between the first drain and the first source of the first field-effect transistor 10-1 which is caused by carriers generated by light in the first semiconductor region may be suppressed by the fourth semiconductor region to absorb the light-generated carriers, and therefore the decrease of the maximum gain may be prevented.

The structures and the cross-section configurations exemplified in FIGS. 1 to 15 can be applied to embodiments for a variable gain photoelectric conversion cell as described in (11) when the first output section is replaced to read the first cell output section and the second output section is replaced to read the second cell output section. (In FIGS. 5 to 15, the bases and the collectors of the transistors 100-1 share the first semiconductor regions 110 and the second semiconductor regions 120 of the photoelectric conversion elements). The structures and the cross-section configurations exemplified in FIGS. 5 to 15 can be applied to a variable gain photoelectric conversion cell as described in (16) in an embodiment when the first output section is replaced to read the first cell output section and the second output section is replaced to read the second cell output section. And, the cross-section configurations exemplified in FIGS. 11 to 14 can be applied to a variable gain photoelectric conversion cell as described in (22) in an embodiment when the first output section is replaced to read the first cell output section and the second output section is replaced to read the second cell output section. Further, the cross-section configurations exemplified in FIG. 15 can be applied to a variable gain photoelectric conversion cell as described in (26) in an embodiment.

In this case, when an array is configured by interconnecting the first cell output sections (the first semiconductor regions 110 or the conductive thin films connected to the regions) and the second cell output sections 21 of the plurality of variable gain photoelectric conversion cells, electric signals are read out from one or both of the first cell output sections and the second cell output sections through the wiring used for the interconnections. In order to configure a two-dimensional array by use of the above cells, it is required that the first semiconductor region 110 is formed on the supporting substrate 90 and is electrically isolated in the longitudinal direction or the lateral direction in the plane figure as illustrated in FIGS. 3, 4, 11 to 15.

Figure 26:
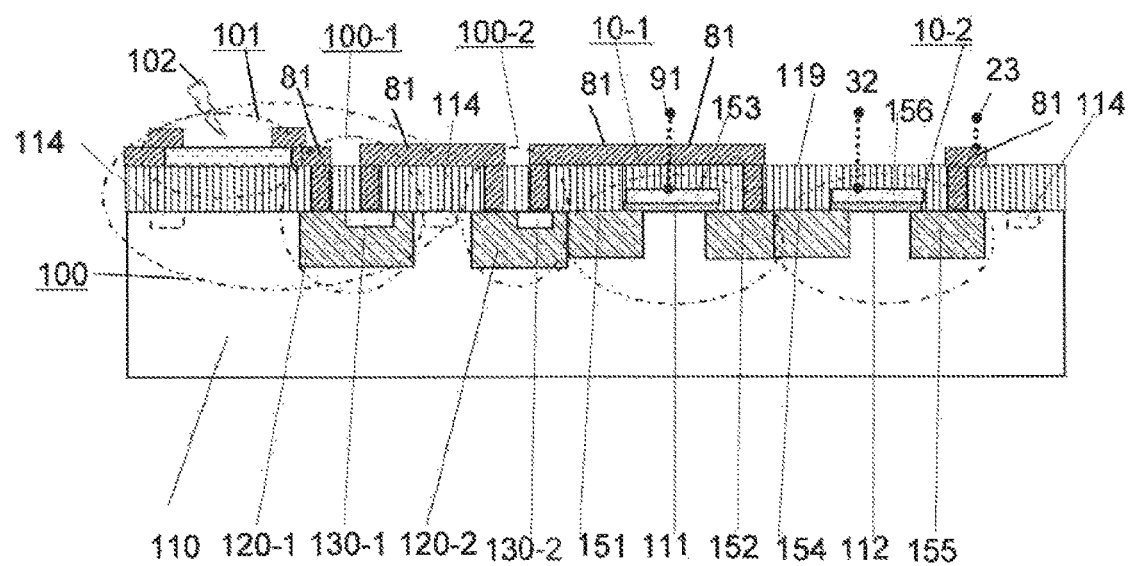
FIG. 26 is a sectional view of a variable gain photoelectric conversion cell as described in (18) or (28) in an embodiment according to the present invention.

FIGS. 16 to 23 and 26 to 28 illustrate variable gain photoelectric conversion cells as described in (18) in embodiments. In the embodiments, a second field-effect transistor 10-2 is added to a variable gain photoelectric conversion device as described in (2). In the present embodiments, the second output section is connected to one of a second source and a second drain of the second field-effect transistor 10-2, the other of the second source and the second drain is a third cell output section 23, and a second gate of the second field-effect transistor 10-2 is a second cell selection section 32. In addition, the embodiment illustrated in FIG. 26 is an example of a sectional view of the embodiment illustrated in FIG. 16. In FIG. 26, the second field-effect transistor 10-2 is added to the sectional view of the variable gain photoelectric conversion device illustrated in FIG. 3. In the present embodiments, the sixth region 152 which is a part of the second output section is continuous and electrically connected to the region 154 out of the second source 154 and the second drain 155 of the second field-effect transistor, the region 155 is the third cell output section 23, and the second gate 156 is the second cell selection section 32. FIG. 26 illustrates a configuration in which the third cell output section 23 is extended from the region 155 to an electrode by the conductive thin film 81.

When the configuration as described in (18) is employed, the second field-effect transistor functions as a cell selection element, and therefore while the cell area increases, the collector of the transistor is not required to be separated by column or by row in order to configure an array. Thus, this configuration increases the compatibility with MOSLSI manufacturing processes.

Figure 27:
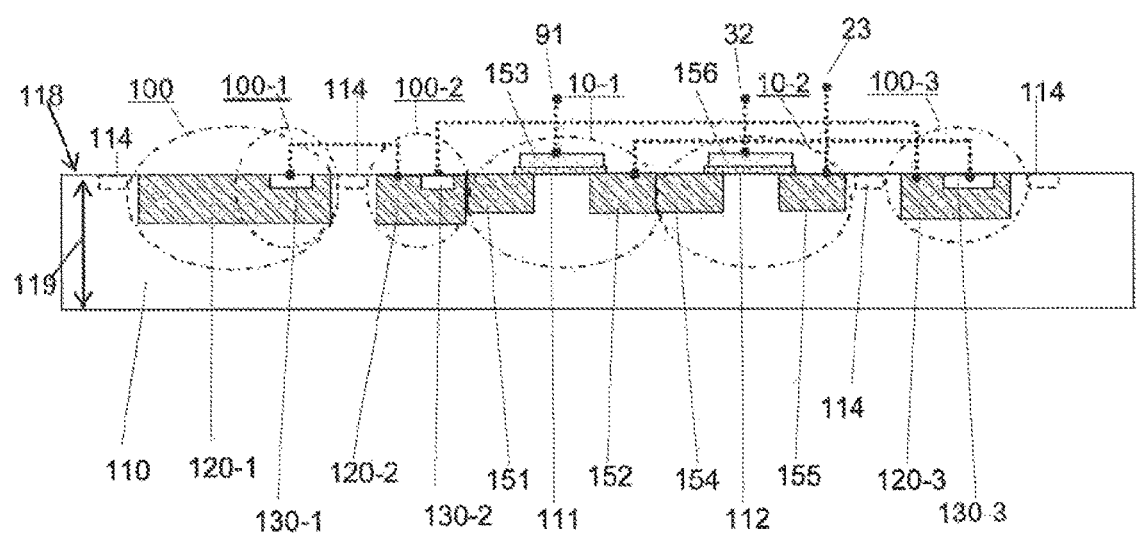
FIG. 27 is a sectional view of a variable gain photoelectric conversion cell as described in (18) or (19) or (28) in another embodiment according to the present invention.
Figure 28:
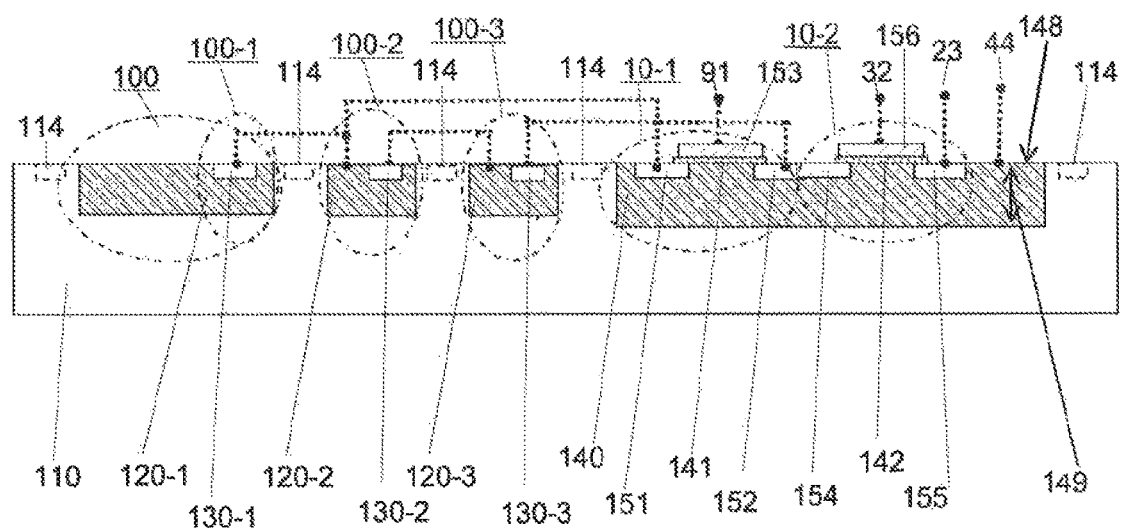
FIG. 28 is a sectional view of a variable gain photoelectric conversion cell as described in (18) or (19) or (36) in another embodiment according to the present invention.

FIGS. 19 to 23, 27 and 28 also illustrate variable gain photoelectric conversion cells as described in (19) in embodiments. In each diagram, the second output section of the variable gain photoelectric conversion device as described in (6) is connected to one of the second source and the second drain of the second field-effect transistor 10-2, the other of the second source and the second drain is the third cell output section 23 and the second gate of the second field-effect transistor 10-2 is the second cell selection section 32. In addition, the embodiment illustrated in FIG. 27 is an embodiment of a variable gain photoelectric conversion cell as described in (28). And the embodiment illustrated in FIG. 27 is an embodiment in which the second field-effect transistor 10-2 is added to the embodiment illustrated in FIG. 13. In the present embodiment, the sixth region 152 which is a part of the second output section is continuous and connected to the region 154 out of the second source 154 and the second drain 155 of the second field-effect transistor, the region 155 is the third cell output section 23, and the second gate 156 is the second cell selection section 32. FIG. 28 illustrates a variable gain photoelectric conversion cell as described in (36) in an embodiment and illustrates an embodiment in which the second field-effect transistor 10-2 is added to the embodiment illustrated in FIG. 15. The sixth region 152 which is a part of the second output section is connected to the region 154 out of the second source 154 and the second drain 155 of the second field-effect transistor, the region 155 is the third cell output section 23, and the second gate 156 is the second cell selection section 32.

When the configurations as described in (19), (28) and (36) are employed, the second field-effect transistor functions as a cell selection element, and therefore while the cell area increases the collector of the transistor is not required to be separated by row or by column in order to configure an array. Thus, this configuration increases the compatibility with MOSLSI manufacturing processes.

Figure 16:
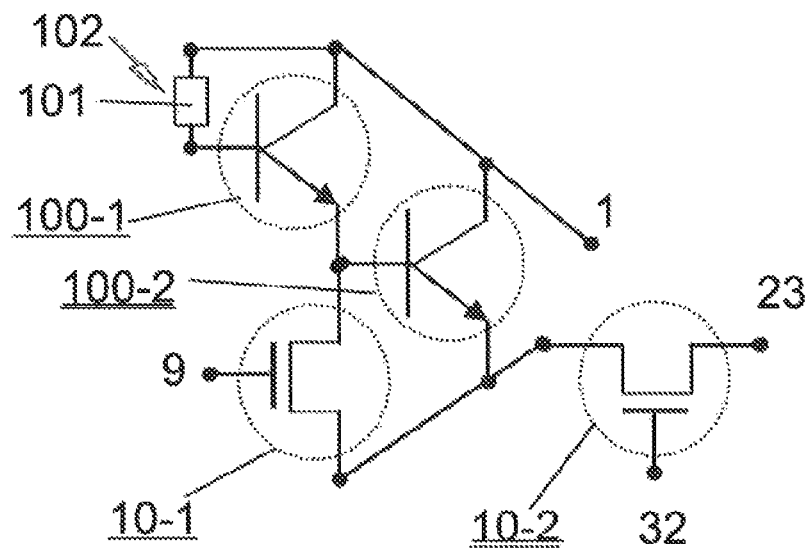
FIG. 16 is a circuit diagram of a variable gain photoelectric conversion cell as described in (18) in an embodiment according to the present invention.
Figure 17:
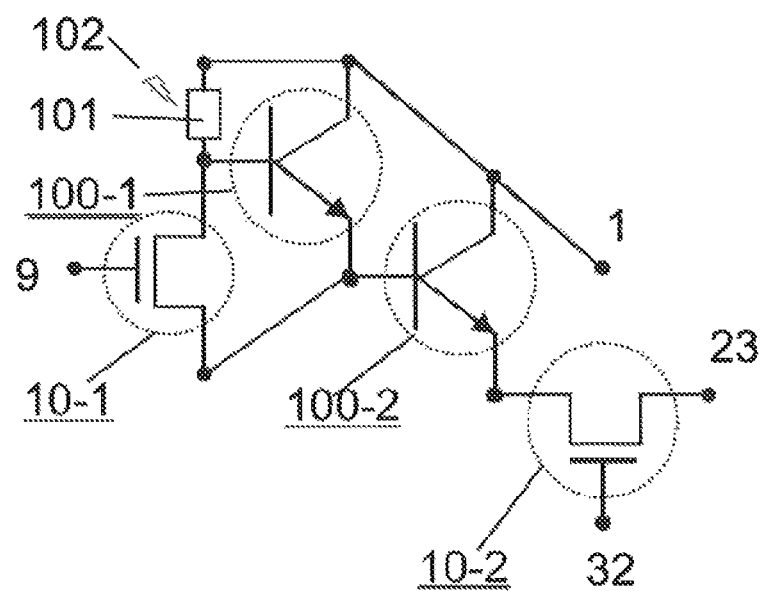
FIG. 17 is a circuit diagram of a variable gain photoelectric conversion cell as described in (18) in another embodiment according to the present invention.
Figure 18:
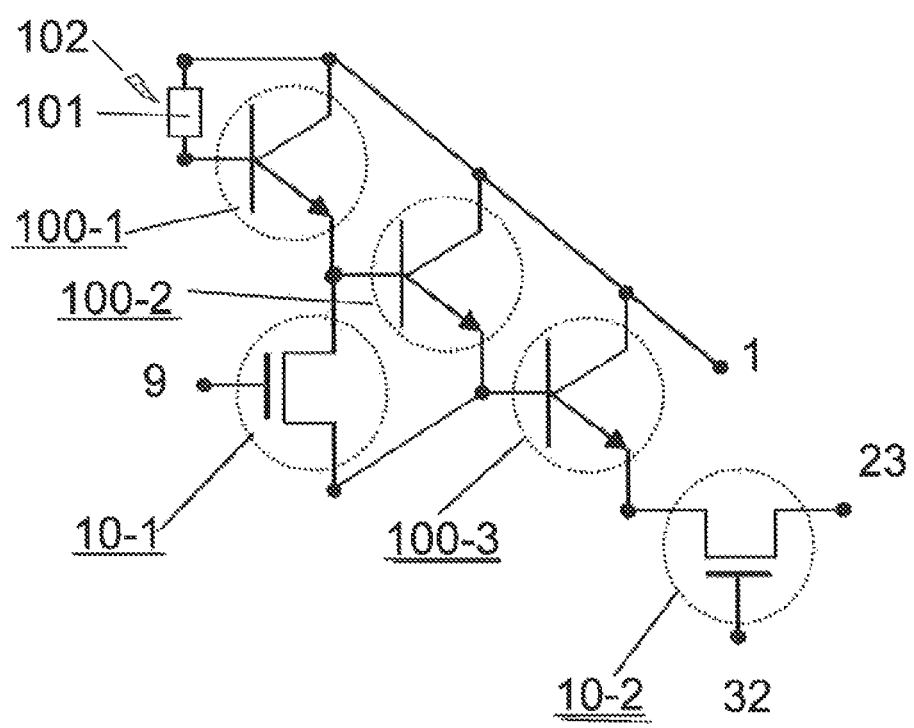
FIG. 18 is a circuit diagram of a variable gain photoelectric conversion cell as described in (18) in another embodiment according to the present invention.
Figure 19:
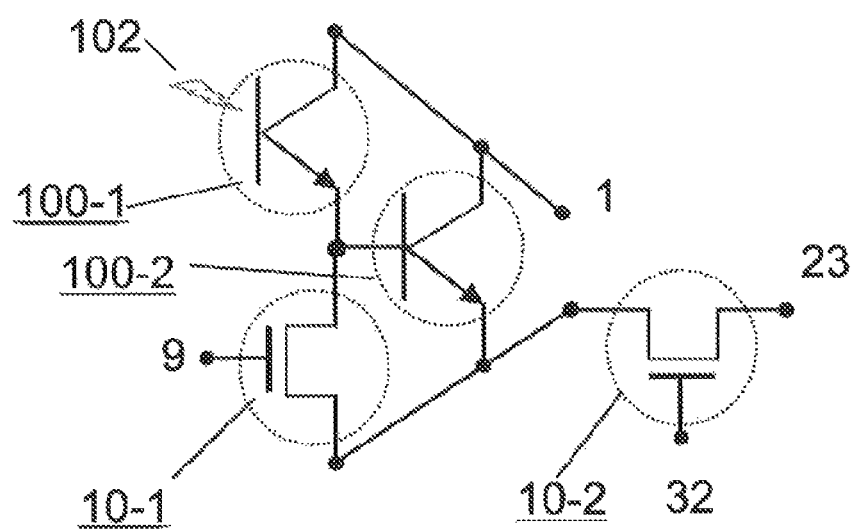
FIG. 19 is a circuit diagram of a variable gain photoelectric conversion cell as described in (18) or (19) in another embodiment according to the present invention.
Figure 20:
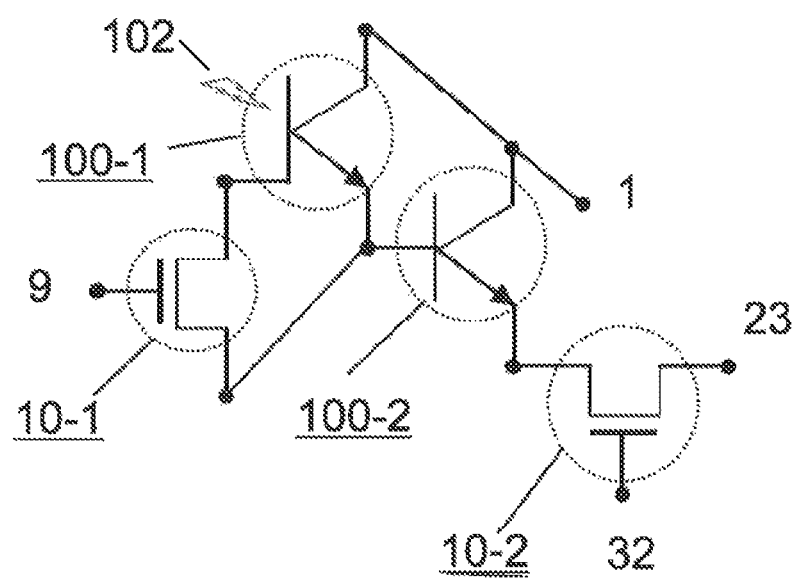
FIG. 20 is a circuit diagram of a variable gain photoelectric conversion cell as described in (18) or (19) in another embodiment according to the present invention.
Figure 21:
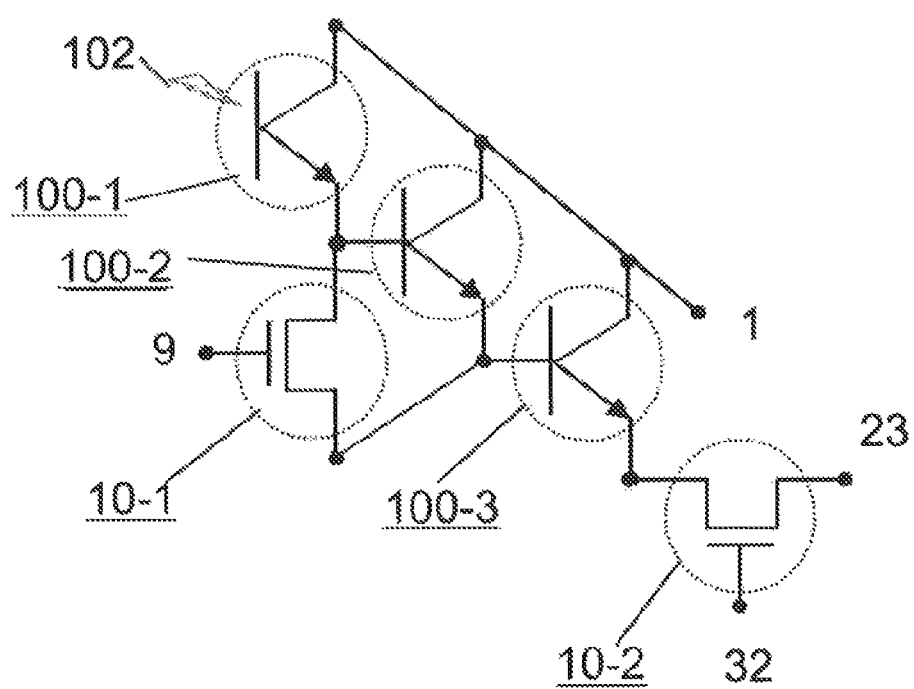
FIG. 21 is a circuit diagram of a variable gain photoelectric conversion cell as described in (18) or (19) in another embodiment according to the present invention.
Figure 22:
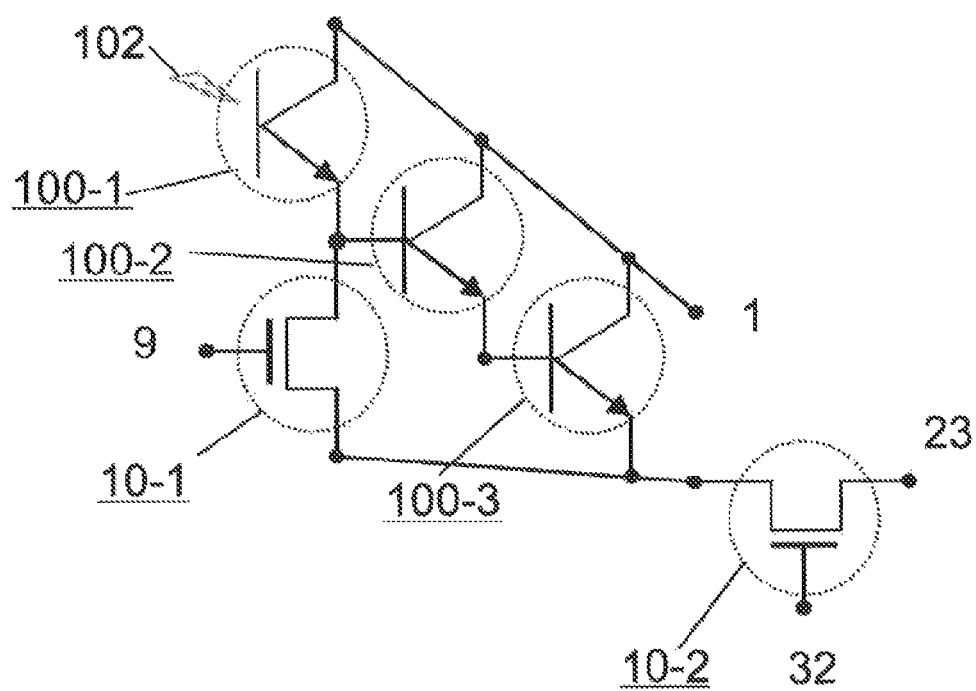
FIG. 22 is a circuit diagram of a variable gain photoelectric conversion cell as described in (18) or (19) in another embodiment according to the present invention.
Figure 23:
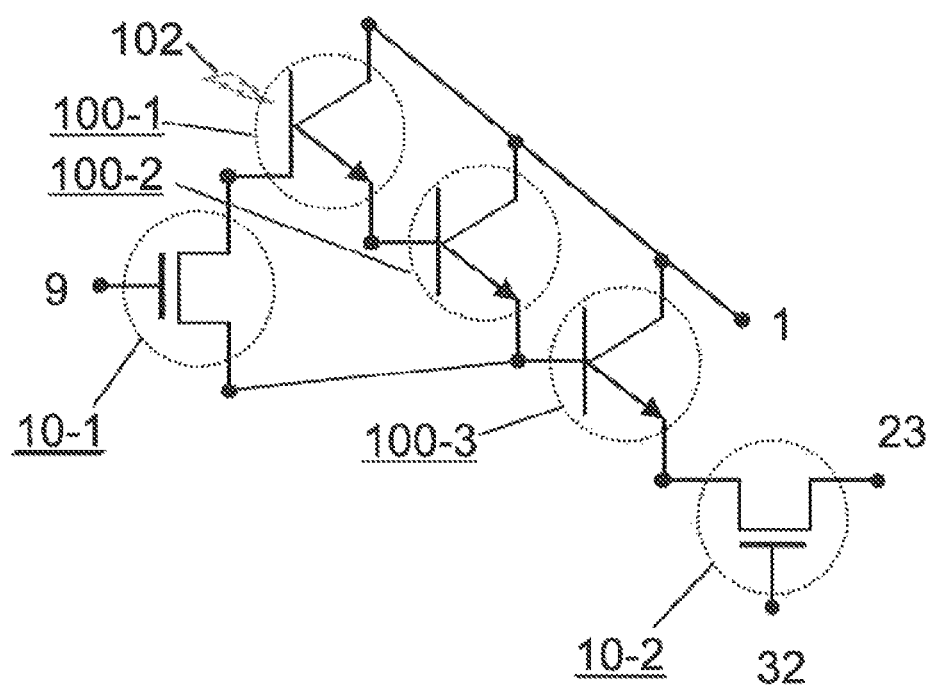
FIG. 23 is a circuit diagram of a variable gain photoelectric conversion cell as described in (18) or (19) in another embodiment according to the present invention.
Figure 24:
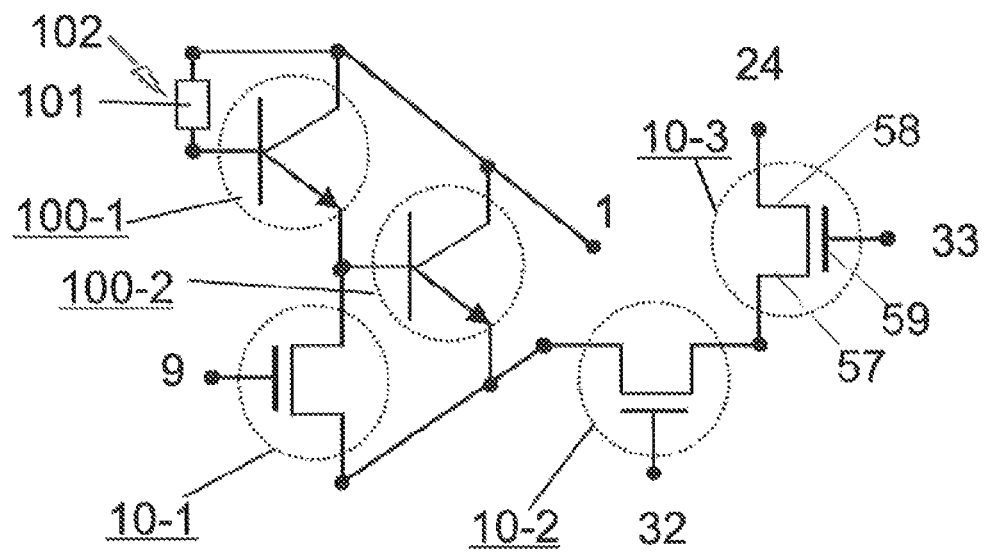
FIG. 24 is a circuit diagram of a variable gain photoelectric conversion cell as described in (20) in an embodiment according to the present invention.
Figure 25:
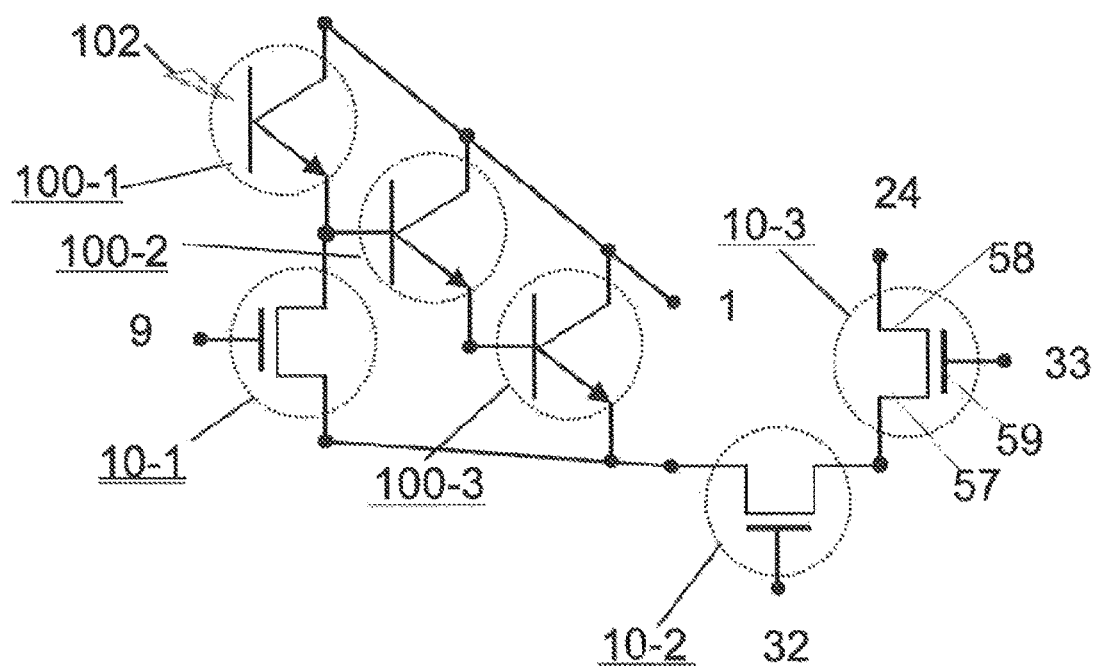
FIG. 25 is a circuit diagram of a variable gain photoelectric conversion cell as described in (20) or (21) in another embodiment according to the present invention.

FIGS. 24 and 25 illustrate a variable gain photoelectric conversion cell as described in (20) in an embodiment. In each diagram, the third cell output section of a variable gain photoelectric conversion cell as described in (18) illustrated in FIGS. 16 and 22 is connected to one 57 of a third source and third drain of a third field-effect transistor 10-3, the other 58 thereof is a fourth cell output section 24 and a third gate 59 is a third cell selection section 33. When this configuration is employed, the third field-effect transistor functions as a cell selection element as is the case with the second field-effect transistor, and therefore while the cell area increases, an array can be configured so that a cell is selected by for example connecting the second cell selection section with one of a plurality of selection lines which extend in the row direction, connecting the third cell selection section with one of a plurality of selection lines which extend in the column direction and then choosing a pair of selection lines out of the selection lines extending in the row and column directions in the array.

FIG. 25 also illustrates a variable gain photoelectric conversion cell as described in (21) in an embodiment according to the present invention. In FIG. 25, the third cell output section in FIG. 22 illustrating a variable gain photoelectric conversion cell as described in (19) is connected to one 57 of the third source and the third drain of the third field-effect transistor 10-3, the other thereof is the fourth cell output section 24 and the third gate 59 is the third cell selection section 33.

FIG. 26 illustrates an example of a sectional view of a variable gain photoelectric conversion cell as described in (18) illustrated in FIG. 16 in an embodiment. In this diagram, the reference numerals which are the same as in the sectional view of the variable gain photoelectric conversion element as described in (2) illustrated in FIG. 3 and the variable gain photoelectric conversion cell as described in (10) according to the present invention represent the same functions in the element or the cell. In the embodiment illustrated in FIG. 26, a second field-effect transistor 10-2 is provided as a cell selection field-effect transistor. The reference numerals 154 and 155 denote the regions which are provided in contact with the first semiconductor region 110 (in contact with the inside of the surface thereof in the diagram), are separated from each other and have rectifying junctions with the first semiconductor region, and are a second source region and a second drain region of the second field-effect transistor respectively. An insulating film 112 is formed on the surfaces of the parts of the regions 154 and 155 and on the surface of the first semiconductor region between the regions 154 and 155, and a second gate 156 is provided thereon across the regions 154 and 155. The second gate 156 is the second gate of the second field-effect transistor.

One 154 of the second source or the second drain of the second field-effect transistor 10-2 is continuous and electrically connected to the other 152 of the first source or the first drain of the first field-effect transistor 10-1. The other 155 of the second source or the second drain of the second field-effect transistor 10-2 forms the second cell output section 23 of the variable gain photoelectric conversion cell illustrated in FIG. 26. In FIG. 26, the second cell output section is extended to an electrode by the conductive thin film 81 and denoted by the reference numeral 23. The second gate 156 forms the second cell selection section 32 of the variable gain photoelectric conversion cell. As schematically illustrated by broken lines, the second gate may be connected to the electrode which is extended by a conductive thin film.

FIG. 27 illustrates an example of a sectional view of a variable gain photoelectric conversion cell as described in (19) illustrated in FIG. 22 in an embodiment and also illustrates a variable gain photoelectric conversion cell as described in (28) in an embodiment. In this diagram, the reference numerals which are the same as in the sectional view of the variable gain photoelectric conversion device as described in (6) and the variable gain photoelectric conversion cell as described in (22) illustrated in FIG. 13 according to the present invention represent the same functions in the element or the cell. In FIG. 27, the second field-effect transistor 10-2 is provided as a cell selection field-effect transistor. The reference numerals 154 and 155 denote the seventh region and the eighth region which are provided in contact with the first semiconductor region 110 (in contact with the inside of the surface thereof in the diagram), are separated from each other and have rectifying junctions with the first semiconductor region, and are the second source region and the second drain region of the second field-effect transistor respectively. The second insulating film 112 is formed on the surfaces of the parts of the seventh region and eighth region 154 and 155 and on the surface of the first semiconductor region between the seventh and eighth regions 154 and 155, and the second gate 156 is provided thereon across the seventh and eighth regions 154 and 155. The second gate 156 is the second gate of the second field-effect transistor.

One 154 of the second source or the second drain of the second field-effect transistor 10-2 is continuous and electrically connected to the other 152 of the first source and the first drain of the first field-effect transistor 10-1. The other 155 of the second darin or the second source of the second field-effect transistor 10-2 forms the third cell output section 23 of the variable gain photoelectric conversion cell illustrated in FIG. 27. The second gate 156 forms the second cell selection section 32 of the variable gain photoelectric conversion cell. As schematically illustrated by broken lines, the second gate may be connected to the electrode which is extended by a conductive thin film.

FIG. 28 illustrates an example of a sectional view of a variable gain photoelectric conversion cell as described in (19) illustrated in FIG. 22 in an embodiment and also illustrates a variable gain photoelectric conversion cell as described in (36) in an embodiment. In this diagram, the reference numerals which are the same as in the sectional view of the variable gain photoelectric conversion device as described in (10) illustrated in FIG. 15 and the variable gain photoelectric conversion cell as described in (24) according to the present invention represent the same functions in the element or the cell. In FIG. 28, the second field-effect transistor 10-2 is provided as a cell selection field-effect transistor. The reference numerals 154 and 155 denote the seventh region and the eighth region which are provided in contact with the fourth semiconductor region 140 (in contact with the inside of the surface thereof in the diagram), are separated from each other and have rectifying junctions with the fourth semiconductor region, and are the second source region or the second drain region of the second field-effect transistor respectively. A fifth insulating film 142 is formed on the surfaces of the parts of the seventh and eighth regions 154 and 155 and on the surface of the fourth semiconductor region between the seventh and eighth regions 154 and 155, and the second gate 156 is provided thereon across the seventh and eighth regions 154 and 155. The second gate 156 is a gate of the second field-effect transistor.

One 154 of the second source or the second drain of the second field-effect transistor 10-2 is continuous and electrically connected to the other 152 of the first source or the first drain of the first field-effect transistor 10-1. The other 155 of the second source and the second drain of the second field-effect transistor 10-2 forms the third cell output section 23 of the variable gain photoelectric conversion cell illustrated in FIG. 28. The second gate 156 forms the second cell selection section 32 of the variable gain photoelectric conversion cell. As schematically illustrated by broken lines, the second gate may be connected to the electrode which is extended by a conductive thin film.

Figure 29:
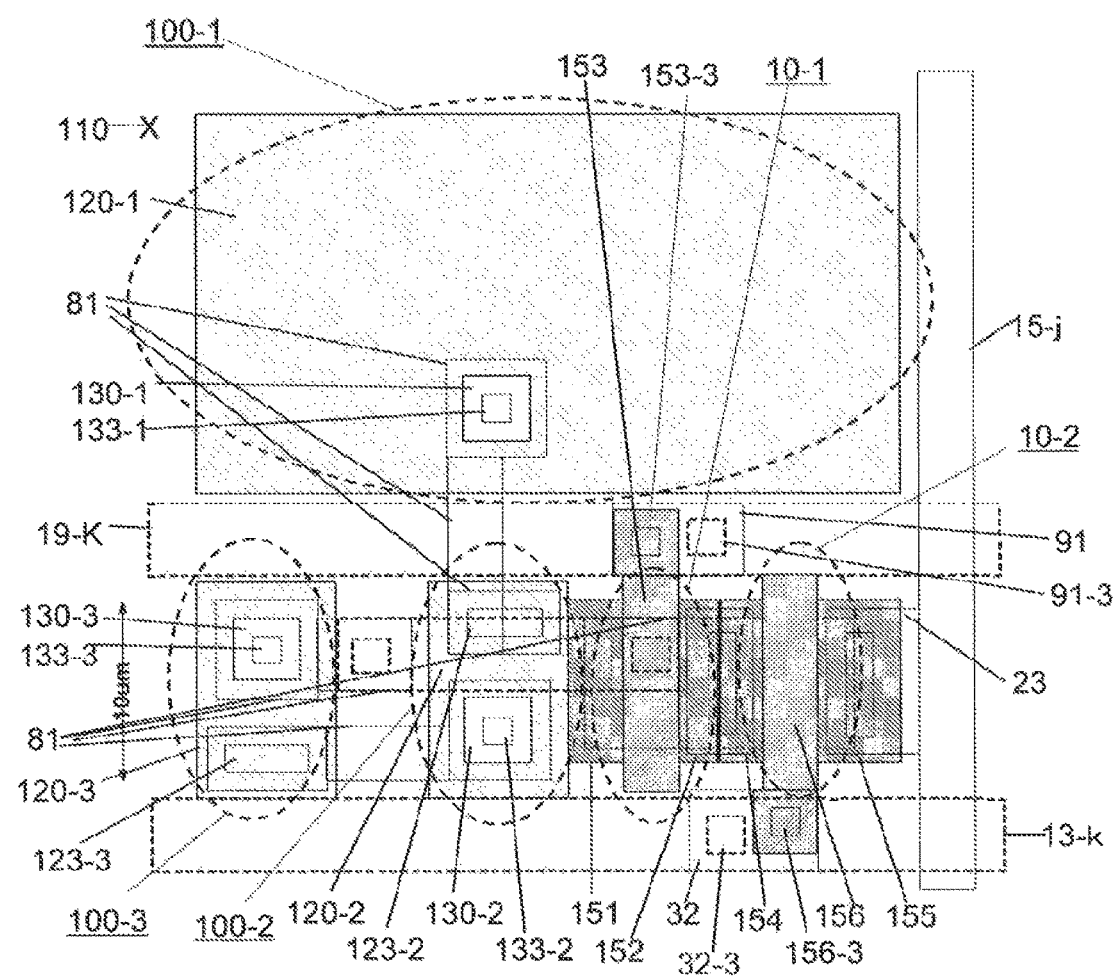
FIG. 29 is a layout plane view of a variable gain photoelectric conversion cell as described in (28) in an embodiment according to the present invention.

FIG. 29 is a plane view of an example in which a variable gain photoelectric conversion cell as described in (28) is designed with a two-micron rule. Although the cross-section thereof is similar to the sectional view in FIG. 27, the transistor 100-3 is provided in the direction opposite to the direction in FIG. 27 in regard to the first and second field-effect transistors in order to locate the devices of the cell in a square section. The reference numerals to denote each region and transistor are the same as in FIG. 27, and the reference numerals and the configurations which are not used in FIG. 27 are described below.

The reference numerals 123-2 and 123-3 denote the contact holes for the second semiconductor regions 120-2 and 120-3. The reference numerals 133-1, 133-2 and 133-3 are the contact holes for the third semiconductor regions 130-1, 130-2 and 130-3.

Since the interconnections between each region are also illustrated, the conductive thin films used for the interconnections are denoted by the reference numeral 81. The conductive thin film employs a two-layer structure in which the first layer and the second layer are defined sequentially from the surface of the first semiconductor region 110. Solid lines with reference numerals 81 denote the first layer and broken lines with reference numerals 81 denote the second layer. An interlayer insulating film is provided between the first layer and the second layer. A via hole which connects the first layer conductive thin film and the second layer conductive thin film is illustrated as a square with broken lines (denoted by the reference numerals such as 32-3 and 91-3 as described later).

FIG. 29 illustrates a cell taken out from an array configuration and also illustrates the third selection line 13-$k$, the third output line 15-$j$ and the gain control line 91. The third selection line 14-$k$ is connected through the via hole 32-3 with the second selection section 32 extended from the second gate 156. The third output line 15-$j$ is connected to the third output section 23 extended from the other 155 of the second source and the second drain of the second field-effect transistor 10-2. The gain control line 19-$k$ is connected through the via hole 91-3 with the gain control section 91 extended from the gate 153 of the first field-effect transistor 10-1.

The configuration which includes the second semiconductor region 120-1 and the first semiconductor region 110 and the junctions thereof is used as a photoelectric conversion element. Therefore, the second semiconductor region 120-1 of the transistor 100-1 is designed so as to have an area larger than the second semiconductor regions 120-2 and 120-3 of the other transistors.

Figure 30:
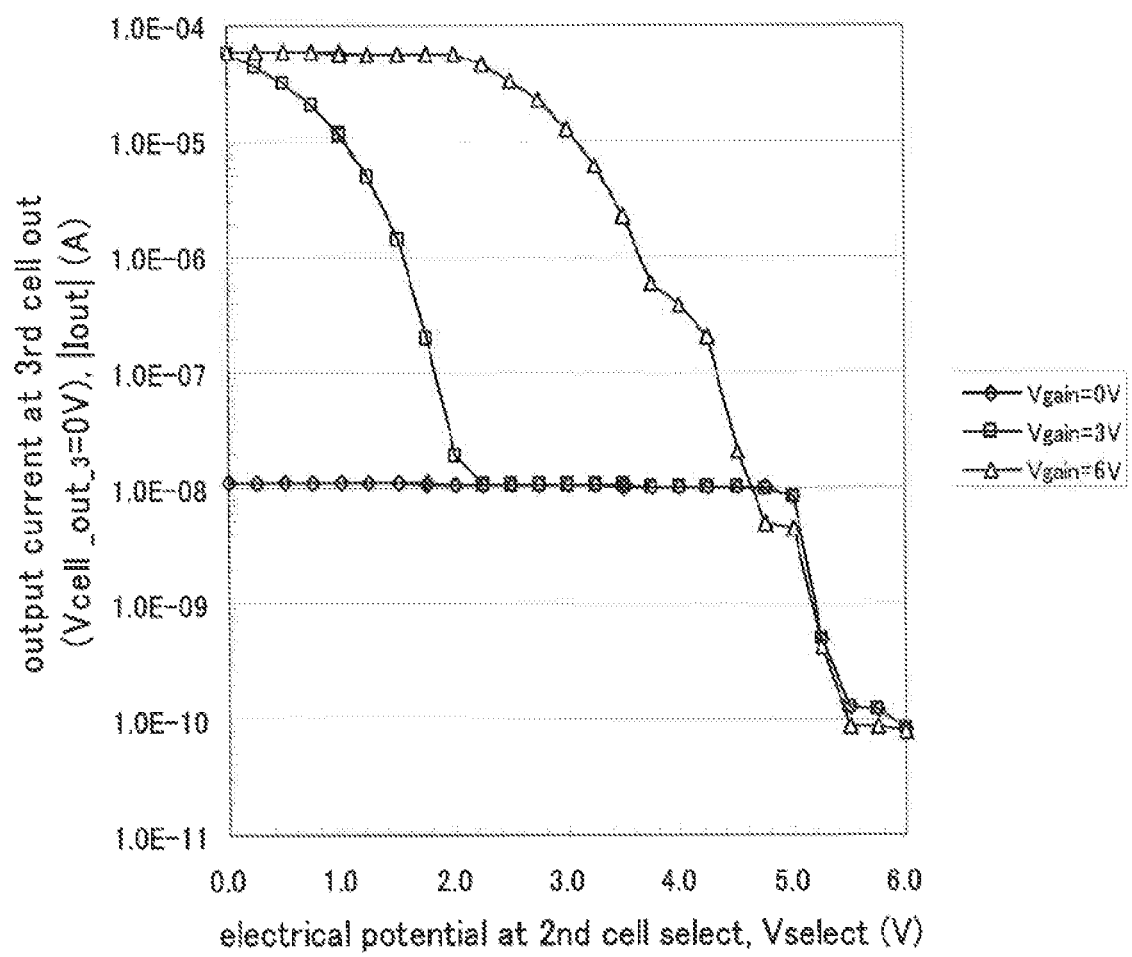
FIG. 30 illustrates the electrical characteristics of a prototype of a variable gain photoelectric conversion cell with the layout illustrated in FIG. 29 according to the present invention.

FIG. 30 illustrates the electric characteristics when a variable gain photoelectric conversion cell illustrated in FIG. 29 in an embodiment according to the present invention is configured so that:

the first semiconductor region 100 is n-type high electric resistance semiconductor region, the second semiconductor regions 120-1, 120-2 and 120-3 are p-type semiconductor regions having the surface impurity concentration of approximately 1E18 atoms/cc, the third semiconductor regions 130-1, 130-2 and 130-3 are n-type semiconductor regions having the surface impurity concentration of approximately 1E21 atoms/cc, the fifth region and sixth region are p-type semiconductor regions having the surface concentration of approximately 1E20 atoms/cc. As a result, the amplifying transistor is an npn-type bipolar transistor and the first and second field-effect transistors are p-channel type.

FIG. 30 illustrates a graph in which the absolute value |Iout| of the output electric current from the third output section (output current at the 3rd cell out) with regard to the electric potential Vselect of the second cell selection section (electrical potential at the 2nd cell select) when the electric potential Vcell_out$_3$ of the third output section is 0 V in the case of a variable gain photoelectric conversion cell illustrated in FIG. 29 in an embodiment according to the present invention. The graph illustrates three cases in which the electric potential of the first semiconductor region is 6 V and the electric potential Vgain of the gain control section is 0 V, 3 V or 6 V. In the range of Vselect>5.5 V, the output electric current Iout is blocked from the cell. In the range of Vselect<0.2 V, the value |Iout| is not subject to the gain control when Vgain is from 3 to 6 V and reaches the maximum value, which is 60 µA in an experiment and varies according to the intensity of the input light. When this cell was put in a dark box, the value |Iout| was approximately 1E-11 A. Considering the dimensions of the field-effect transistor, since this variable gain photoelectric conversion cell may sufficiently supply the output electric current to the extent of 100 µA, an approximately seven-digit dynamic rage may be achieved without the gain control. The chart illustrates that when Vgain is 0 V the value |Iout| is subject to the gain control to be decreased to approximately 1/6000 to reach approximately 1E-8 A. Since the environment in which the measurement was made was a dim room, input light having a larger intensity may be sensed by controlling the gain to be the minimum until the value |Iout| increases to reach approximately 100 µA. The intensity of the input light in this case may be four-digit larger than in case of FIG. 30.

This result shows that the variation of the light intensity may be identified in the eleven-digit range by use of the gain control configurations according to the present invention. In the present embodiments, the first source and the first drain of the first field-effect transistor bypass the second semiconductor region 120-2 of the second transistor and the third semiconductor region 130-3 of the third transistor. However, when the configurations of the interconnections are modified so as to bypass the second semiconductor region 120-1 of the first transistor and the third semiconductor region 130-3 of the third transistor, the dynamic range for the light intensity detection may be increased to a twelve-digit to thirteen-digit range.

When a two-dimensional array is configured by a variable gain photoelectric conversion cell according to the present invention and the gain control electric potentials for a plurality of cells are varied between in necessary parts and in the other parts of the array, a partial image with a high visibility within a local area of the whole image and the adjacent images among which the illuminance differs by four orders of magnitude may be simultaneously captured.

In the embodiment illustrated in FIG. 30, the first and second field-effect transistors are p-channel and when the electric potential Vselect of the second gate, which is the second cell selection section, is below Vc1-Vth2-3Vbe, electric signals may be obtained from the second cell output section. Here, Vc1 is the first cell electric potential (the electric potential applied to the first semiconductor region), Vth2 is the gate threshold voltage of the second field-effect transistor and 3Vbe is the sum of the base-emitter voltages of the first, second and third transistors. When the gain control electric potential is 0 V so that the first field-effect transistor almost-totally bypasses the base of the transistor 100-2 (the second semiconductor region 120-2) and the emitter of the transistor 100-3 (the third semiconductor region 130-3), the electric variable of the photoelectric conversion performed by the photoelectric conversion element (in this case, the photodiode configured by the second semiconductor region 120-1 and the first semiconductor region 110) is input to the base of the transistor 100-1 (the second semiconductor region 120-1), amplified by the transistor 100-1, output to the emitter of the transistor 100-1 (the third semiconductor region 130-1), flows through the bypass formed by the channel of the second field-effect transistor 10-2 and is output as electric signals from the eighth region 155 of the second field-effect transistor 10-2 (the output section 23) almost just as the electric variable is. In this state, when the electric potential of the second cell selection section is below Vc1-Vth2-Vbe, electric signals are output from the third cell output section.

In the combination of the transistors with this circuit (an npn transistor and a p-channel field-effect transistor), when the variation in pulse electric potential (for example, the variation from 6 V to 0 V and from 0 V to 6 V) is applied to the second cell selection section to read out electric signals, electric current is input to the source of the second field-effect transistor from the inside of the cell, for example the third semiconductor region 130-3, and therefore when the electric current becomes smaller, the electric resistance of the second field-effect transistor becomes larger so that the read-out time and the reset time may become longer. In order to avoid this, the voltage Vcell_out_3 of the third cell output section may be set to be closer to Vc1 than Vselect (at the time of the cell selection) −Vth2. Thus, the second field-effect transistor is put in the operation in the non-saturation region (the triode region), the electric resistance seen from the source is decreased and then the read-out time may be reduced.

In addition, in case of the pulse read-out, the electric current in regard to the low-illuminance light input is amplified with a ratio of the light input integration time divided by the read-out time, and the electric signals are obtained from the third output section (refer to paragraphs 0029 to 0031 for the details). The amplification by use of the pulse read-out may also be commonly achieved in a variable gain photoelectric conversion cell according to the present invention.

Figure 31:
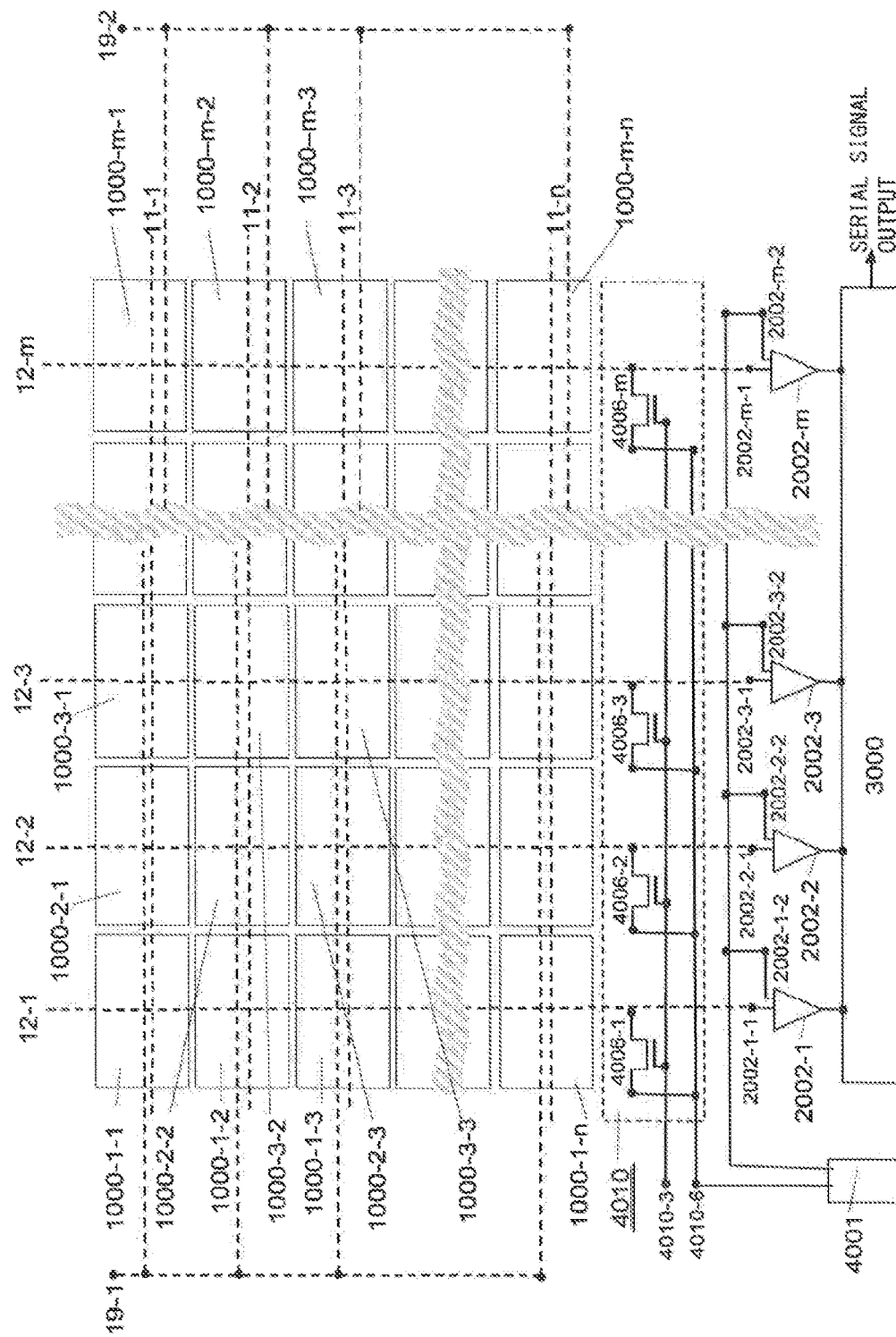
FIG. 31 illustrates an embodiment of the fourth electric potential setting circuit.

FIG. 31 illustrates a variable gain photoelectric conversion array as described in (38) and the fourth electric potential setting circuit for performing the read-out processes to the array as described in (46) in an embodiment. FIG. 31 illustrates an example of an array according to the present invention in which m variable gain photoelectric conversion cells as described in (11), (16), (22) or (26) arranged in the first direction and n variable gain photoelectric conversion cells as described in (11), (16), (22) or (26) arranged in the second direction. The number of photoelectric conversion cells in the array is m×n. In FIG. 31, the variable gain photoelectric conversion cells are denoted using the reference numeral 1000, and a hyphenated number is added to the end of the reference numeral according to the location such as 1000-1-1, 1000-2-1, 1000-3-1, 1000-4-1, . . . , 1000-$m$-1, 1000-1-2, 1000-2-2, 1000-3-2, . . . , 1000-$m$-2, 1000-1-3, 1000-2-3, 1000-3-3, . . . , 1000-$m$-3, . . . , 1000-$i$-$j$ (not illustrated), . . . , 1000-$m$-$n$.

The reference numerals 11-1, 11-2, 11-3, . . . , 11-$n$ indicate the first selection lines, which are usually provided as many as the number n of variable gain photoelectric conversion cells arranged in the second direction. Each first selection line 11-1, 11-2, 11-3, . . . , 11-$n$ is electrically connected to the first cell output section of the variable gain photoelectric conversion cell arranged in the same row.

The reference numerals 12-1, 12-2, 12-3, . . . , 12-$m$ indicate the second selection lines, which are usually provided as many as the number m of variable gain photoelectric conversion cells arranged in the first direction. Each second selection line 12-1, 12-2, 12-3, . . . , 12-$m$ is electrically connected to the second cell output section of the variable gain photoelectric conversion cell arranged in the same column.

Since the first selection lines 11-1, 11-2, 11-3, . . . , 11-*n* or the second selection lines 12-1, 12-2, 12-3, . . . , 12-*m* may not be electrically connected to a variable gain photoelectric conversion cell arranged as a dummy cell and the like, the number of photoelectric conversion cells arranged in the first direction or the second direction and the number of the first selection lines or the second selection lines are not necessarily the same.

Two gain control lines 19-1 and 19-2 is provided, and in the diagram each collective line is connected to one gain control line on the left-hand side (19-1) or the right-hand side (19-2) in order to achieve different gains on the left-hand side and the right-hand side of the variable gain photoelectric conversion cell array. For example, when an electric potential for switching on the first field-effect transistor is provided for the gain control line 19-1 and an electric potential for switching off the first field-effect transistor is provided for the gain control line 19-2, an image in which the visibility of bright parts is prevailing on the left-hand side and the details of dark parts are visible on the right-hand side may be obtained.

In order to sequentially read out the outputs from the variable gain photoelectric conversion array, the electric potential which varies from the first electric potential to the second electric potential (in the form of a normal pulse) is applied to the selected first selection line 11-*j* and the plurality of first selection lines which are not selected are maintained at the first electric potential. Thus, the electric signals from the variable gain photoelectric conversion cells which are connected to the first selection line 11-*j* are simultaneously taken via the second selection lines 12-1, 12-2, 12-3, . . . , 12-*m*.

The electric signals (parallel out) simultaneously taken from the plurality of second selection lines 12-1, 12-2, 12-3, . . . , 12-*m* are amplified (including the impedance conversions) by a plurality of sense amplifiers 2002-1, 2002-2, 2002-3, . . . , 2002-*m* which are connected to the plurality of second selection lines. In case that the electric signals are electric current or electric charge, the electric signals are transformed into voltage outputs (amplified if necessary). The electric signals which are taken in parallel and amplified or transformed are sequentially scanned by the scan circuit 3000 which is connected to the outputs of the sense amplifiers, and then can be taken out as serial signals.

When the electric signals read out from the second selection lines of a variable gain photoelectric conversion array as described in (38) according to the present invention are sensed, it is preferable for a high-accuracy read-out to set the second selection lines at the fourth electric potential before or after the electric signals are read out from the second selection lines. After the fourth electric potential is set as above, the second selection lines are put in the floating state, the electric potential of the selected first selection line 11-*j* is varied from the first electric potential to the second electric potential, and then the electric signals are detected by the sense amplifiers. In this case, differential sense amplifiers having a signal input and a reference input are used for the above sense amplifiers, the fourth electric potential is provided for the reference inputs, and the electric signal outputs are detected with the electric potentials of the signal inputs set at the fourth electric potential.

Further, when the electric potential of the selected first selection line 11-*j* is varied from the first electric potential to the second electric potential (in the form of a normal pulse), the electric signals are read out from the second selection lines, and then the electric potential of the second selection lines are reset to the fourth electric potential, the internal electric potential of the photoelectric conversion cell may be reset.

FIG. 31 also illustrates the fourth electric potential setting circuit as described in (46) in an embodiment for setting the set and reset electric potentials as described above.

In the diagram, the reference numeral 4010 denotes the setting circuit. The setting circuit 4010 includes a plurality of sixth transistors 4006-1, 4006-2, 4006-3, . . . , 4006-*j* (4006-*j* is not illustrated), . . . , 4006-*m*. The sixth transistors 4006-1, 4006-2, 4006-3, . . . , 4006-*j* (4006-*j* is not illustrated), . . . , 4006-*m* correspond to the second selection lines with the same last number 12-1, 12-2, 12-3, . . . , 12-*j* (12-*j* is not illustrated), . . . , 12-*m*. The sixth transistors 4006-1, 4006-2, 4006-3, . . . , 4006-*m* are field-effect transistors, one of the two outputs (the source and the drain) of the sixth field-effect transistor 4006-*j* (j=1, 2, 3, . . . , m) is connected to the second selection line 12-*j* (j=1, 2, 3, . . . , m) and the other thereof is connected (via the terminal 4010-4 of the setting circuit) with the fourth electric potential providing means 4001.

The signal inputs 2002-1-1, 2002-2-1, 2002-3-1, . . . , 2002-*m*-1 of the sense amplifiers 2002-1, 2002-2, 2002-3, . . . , 2002-*m* are connected to the corresponding second selection lines 12-*j* (j=1, 2, 3, . . . , m) and the one of the outputs of the corresponding sixth transistors 4006-*j* (j=1, 2, 3, . . . , m). The reference inputs 2002-1-2, 2002-2-2, 2002-3-2, . . . , 2002-*m*-2 are connected to the fourth electric potential providing means.

The gate of the sixth field-effect transistor 4006-*j* (j=1, 2, 3, . . . , m) is provided (via the terminal 4010-3 of the setting circuit) with control voltage pulses which vary from an electric potential for switching off the sixth transistor 4006-*j* (j=1, 2, 3, . . . , m) to an electric potential for switching on the sixth transistor.

The control voltage pulses for switching from off to on are applied to the gate of the sixth transistor 4006-*j* (j=1, 2, 3, . . . , m) during a part of the time when the first selection lines are at the first electric potential or before the electric potentials of the first selection lines are varied from the second electric potential to the first electric potential. The latter timing is effective for resetting the cell electric potential in the cells included in a variable gain photoelectric conversion array as described in (38), and the timing may be set in a part of the time during when the first selection lines are at the second electric potential after the signals are read out from the variable gain photoelectric conversion cells. In other words, at least a control electric potential for switching off the sixth field-effect transistor 4006-*j* (j=1, 2, 3, . . . , m) has to be applied to the gate of the sixth transistor 4006-*j* (j=1, 2, 3, . . . , m) when the electric potential of the first selection line 11-*j* is varied from the first electric potential to the second electric potential to start the sensing processes.

The control voltage pulses as described above have the electric potential variations for driving the sixth field-effect transistors from off to on and vice versa, and are provided at the necessary timings as described above from the control pulse providing block which includes pulse generating circuits such as conventional shift registers for example. A circuit in which the fourth electric potential providing means is connected to the setting circuit 4010 is referred to as the fourth electric potential setting circuit.

The second electric potential setting circuit as described in (45) in an embodiment includes the following configurations.

One of the two outputs (the source and the drain) of the sixth field-effect transistor 4006-$j$ ($j$=1, 2, 3, ..., n) in the setting circuit is connected to the first selection line 11-$j$ ($j$=1, 2, 3, ..., n), and the other thereof is connected (via the terminal 4010-4 of the setting circuit) with the second electric potential providing means (replacing the fourth electric potential providing means 4001; not illustrated).

The signal inputs 2002-1-1, 2002-2-1, 2002-3-1, ..., 2002-$n$-1 of the sense amplifiers 2002-1, 2002-2, 2002-3, ..., 2002-$n$ are connected to the corresponding first selection line 11-$j$ ($j$=1, 2, 3, ..., n) and one of the outputs of the sixth transistor 4006-$j$ ($j$=1, 2, 3, ..., n). The reference inputs 2002-1-2, 2002-2-2, 2002-3-2, ..., 2002-$n$-2 of the sense amplifiers are connected to the second electric potential providing means.

The operations of the sixth field-effect transistor may be explained by exchanging the first selection lines with the second selection lines, the first electric potential and the third electric potential, and the second electric potential and the fourth electric potential in the above explanations of the fourth electric potential setting circuit.

Figure 32:
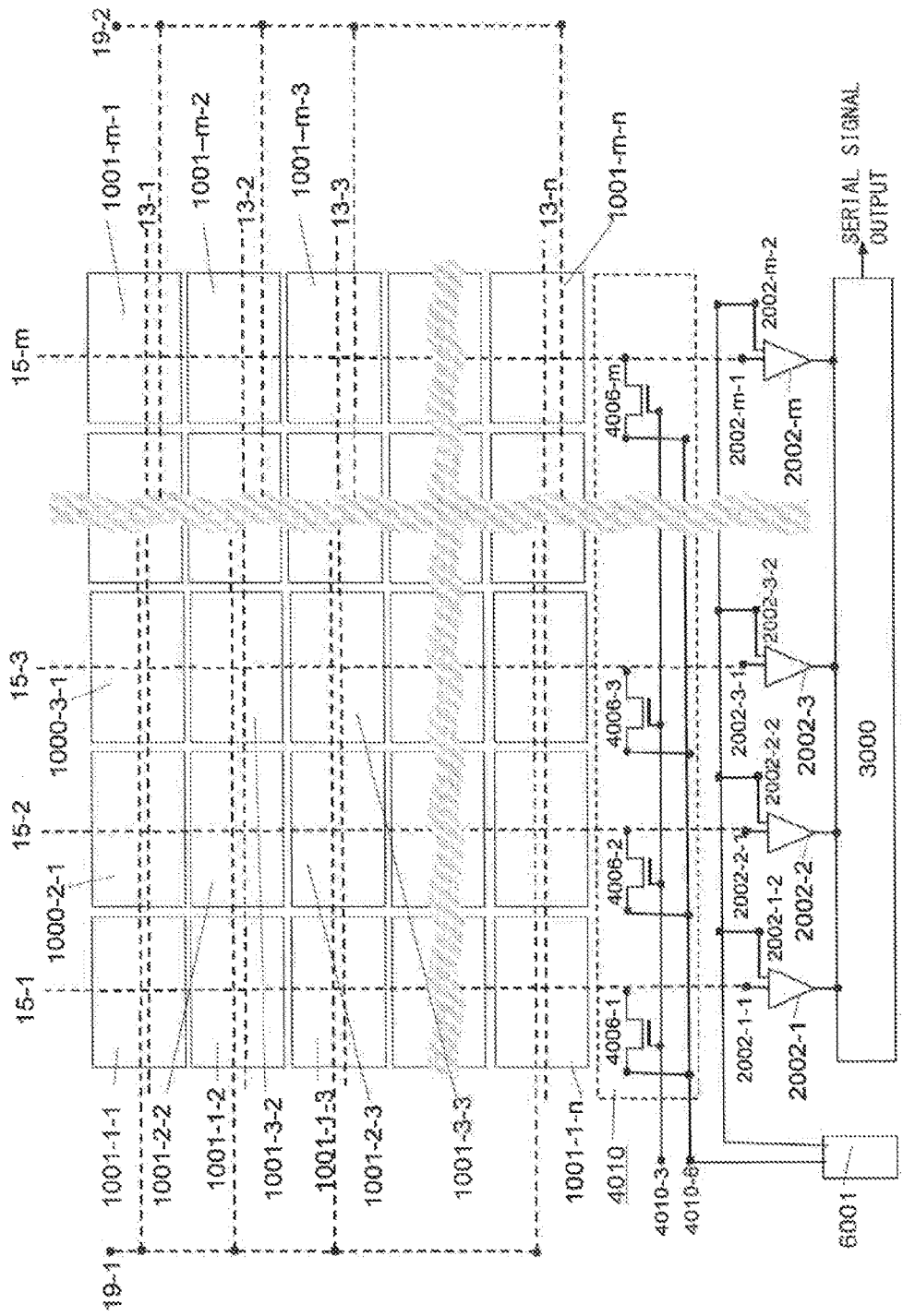
FIG. 32 illustrates an embodiment of the sixth electric potential setting circuit as described in (47).

FIG. 32 illustrates a variable gain photoelectric conversion array as described in (39) and the sixth electric potential setting circuit 1 as described in (47) for performing the read-out processes to the array. And FIG. 32 illustrates an example of an array in which m variable gain photoelectric conversion cells as described in (18), (19), (28) or (36) according to the present invention are arranged in the first direction and n variable gain photoelectric conversion cells as described in (18), (19), (28) or (36) according to the present invention are arranged in the second direction. The number of variable gain photoelectric conversion cells in the array is m×n. In FIG. 32, the variable gain photoelectric conversion cells are denoted using the reference numeral 1001, and a hyphenated number is added to the end of the reference numeral according to the location such as 1001-1-1, 1001-2-1, 1001-3-1, 1001-4-1, ..., 1001-$m$-1, 1001-1-2, 1001-2-2, 1001-3-2, ..., 1001-$m$-2, 1001-1-3, 1001-2-3, 1001-3-3, ..., 1001-$m$-3, ..., 1001-$i$-$j$ (not illustrated), ..., 1001-$m$-$n$.

The reference numerals 13-1, 13-2, 13-3, ..., 13-$n$ indicate the third selection lines, which are usually provided as many as the number n of variable gain photoelectric conversion cells as described in (39) arranged in the second direction. Each third selection line 13-1, 13-2, 13-3, ..., 13-$n$ is electrically connected to the second cell selection section of the variable gain photoelectric conversion cell arranged in the same row.

The reference numerals 15-1, 15-2, 15-3, ..., 15-$m$ indicate the third output lines, which are usually provided as many as the number m of variable gain photoelectric conversion cells arranged in the first direction. Each third output line 15-1, 15-2, 15-3, ..., 15-$m$ is electrically connected to the third first cell output section of the variable gain photoelectric conversion cell arranged in the same column.

Since the third selection lines 13-1, 13-2, 13-3, ..., 13-$n$ or the third output lines 15-1, 15-2, 15-3, ..., 15-$m$ may not be electrically connected to a variable gain photoelectric conversion cell arranged as a dummy cell and the like, the number of photoelectric conversion cells arranged in the second direction or the first direction and the number of the third selection lines or the third output lines are not necessarily the same.

Two groups of gain control lines 19-1 and 19-2 are provided, and in the diagram each collective line is connected to one group of gain control lines on the left-hand side (19-1) and to another group of gain control lines on the right-hand side (19-2) in order to achieve different gains on the left-hand side and the right-hand side of the variable gain photoelectric conversion cell array. For example, when an electric potential for switching on the first field-effect transistor is provided for the gain control line 19-1 and an electric potential for switching off the first field-effect transistor is provided for the gain control line 19-2, an image in which the visibility of bright parts is prevailing on the left-hand side and the details of dark parts are visible on the right-hand side may be obtained.

In order to sequentially read out the outputs from the variable gain photoelectric conversion array, the electric potential which varies from the first selection electric potential to the second selection electric potential (in the form of a normal pulse) is applied to the selected third selection line 13-$j$ and the plurality of third selection lines 13-1, 13-2, 13-3, ..., 13-$n$ which are not selected are maintained at the first selection electric potential. Thus, the electric signals from the variable gain photoelectric conversion cells which are connected to the third selection line 13-$j$ are simultaneously taken via the third output lines 15-1, 15-2, 15-3, ..., 15-$m$.

The electric signals (parallel out) simultaneously taken from the plurality of third output lines 15-1, 15-2, 15-3, ..., 15-$m$ are amplified (including the impedance conversions) by a plurality of sense amplifiers 2002-1, 2002-2, 2002-3, ..., 2002-$m$ which are connected to the plurality of third output lines. In case that the electric signals are electric current or electric charge, the electric signals are transformed into voltage outputs (amplified if necessary). The electric signals which are taken in parallel and amplified or transformed are sequentially scanned by the scan circuit 3000 which is connected to the outputs of the sense amplifiers, and then may be taken as serial signals.

When the electric signals read out from the third output lines of a variable gain photoelectric conversion array as described in (39) according to the present invention are sensed, it is preferable for a high-accuracy read-out to set the third output lines at the sixth electric potential before or after the electric signals are read out from the third output lines. After the sixth electric potential is set as above, the third output lines are put in the floating state, the electric potential of the selected third selection line 13-$j$ is varied from the first electric potential to the second electric potential, and then the electric signals are detected by the sense amplifiers. In this case, differential sense amplifiers having a signal input and a reference input are used for the above sense amplifiers, the sixth electric potential is provided for the reference inputs, and the electric signal outputs are detected with the electric potentials of the signal inputs set at the sixth electric potential.

Further, when the electric potential of the selected third output line 13-$j$ is varied from the first selection electric potential to the second selection electric potential (in the form of a normal pulse), the electric signals are read out from the third output lines, and then the electric potential of the third selection lines are reset to the sixth electric potential, the internal electric potential of the photoelectric conversion cell may be reset.

When the seventh region and eighth region of the second field-effect transistor is provided so as to be in contact with the first semiconductor region 110 (the second field-effect transistor 10-1 is p-channel type when the first semiconductor region 110 is n-type), the second field-effect transistor drives the internal cell electric potential in a source follower mode. Therefore, when the cell internal electric potential comes close to the reset electric potential, the source of the second field-effect transistor is put in a high impedance state, and therefore the reset processes take time and it remains in an internal cell incomplete reset state when the reset processes are aborted after specified time elapses. In order to complete the reset processes within a limited time period, it is important to decide the relation between the second selection electric potential and the sixth electric potential.

For this purpose, it is preferable to set the sixth electric potential to be a value which is closer to the first selection electric potential than (the second selection electric potential)–(Vth2). On the other hand, when it is required to preferentially determine the sixth electric potential for the convenience of the circuit configurations of the whole system, it is preferable to set the second selection electric potential to be further from the first selection electric potential than (the sixth electric potential)+Vth2. In addition, Vth2 is the gate threshold voltage of the second field-effect transistor, the sign of Vth2 is negative in case that the second field-effect transistor is p-channel and the sign thereof is positive in case that the second field-effect transistor is n-channel.

FIG. 32 also illustrates the sixth electric potential setting circuit 1 as described in (47) in an embodiment for setting the set and reset electric potentials as described above.

In the diagram, the reference numeral 4010 denotes the setting circuit 1. The setting circuit 1 (4010) includes a plurality of sixth field-effect transistors 4006-1, 4006-2, 4006-3, . . . , 4006-$j$ (4006-$j$ is not illustrated), . . . , 4006-$m$. The sixth field-effect transistors 4006-1, 4006-2, 4006-3, . . . , 4006-$j$ (4006-$j$ is not illustrated), . . . , 4006-$m$ correspond to the third output lines with the same last number 15-1, 15-2, 15-3, . . . , 15-$j$ (15-$j$ is not illustrated), . . . , 15-$m$. One of the two outputs (the source and the drain) of the sixth field-effect transistor 4006-$j$ ($j$=1, 2, 3, . . . , m) is connected to the third output line 15-$j$ ($j$=1, 2, 3, . . . , m) and the other thereof is connected (via the terminal 4010-6 of the setting circuit 1) with the sixth electric potential providing means 6001.

The signal inputs 2002-1-1, 2002-2-1, 2002-3-1, . . . , 2002-$m$-1 of the sense amplifiers 2002-1, 2002-2, 2002-3, . . . , 2002-$m$ are connected to the corresponding third output lines 12-$j$ ($j$=1, 2, 3, . . . , m) and the one of the outputs of the corresponding sixth field-effect transistors 4006-$j$ ($j$=1, 2, 3, . . . , m). The reference inputs 2002-1-2, 2002-2-2, 2002-3-2, . . . , 2002-$m$-2 are connected to the sixth electric potential providing means 6001.

The gate of the sixth field-effect transistor 4006-$j$ ($j$=1, 2, 3, . . . , m) is provided (via the terminal 4010-3 of the setting circuit 1) with control voltage pulses which vary from an electric potential for switching off the sixth field-effect transistor 4006-$j$ ($j$=1, 2, 3, . . . , m) to an electric potential for switching on the sixth field-effect transistor.

The control voltage pulses for switching the transistor from off to on are applied to the gate of the sixth field-effect transistor 4006-$j$ ($j$=1, 2, 3, . . . , m) during a part of the time when the third selection lines are at the first selection electric potential or before the electric potentials of the third selection lines are varied from the second selection electric potential to the first selection electric potential. The latter timing is effective for resetting the cell electric potential in the cells included in a variable gain photoelectric conversion array as described in (38), and the timing may be set in a part of the time during when the third selection lines are at the second selection electric potential after the signals are read out from the variable gain photoelectric conversion cells. In other words, at least a control electric potential for switching off the sixth field-effect transistor 4006-$j$ ($j$=1, 2, 3, . . . , m) has to be applied to the gate of the sixth transistor 4006-$j$ ($j$=1, 2, 3, . . . , m) when the electric potential of the third selection line 13-$j$ is varied from the first selection electric potential to the second selection electric potential to start the sensing processes.

The control voltage pulses as described above have the electric potential variations for driving the sixth field-effect transistors from off to on and vice versa, and are provided at the necessary timings as described above from a control pulse providing block which includes pulse generating circuits such as conventional shift registers for example. A circuit in which the sixth electric potential providing means 6001 is connected to the setting circuit 1 is referred to as the sixth electric potential setting circuit 1.

Figure 33:
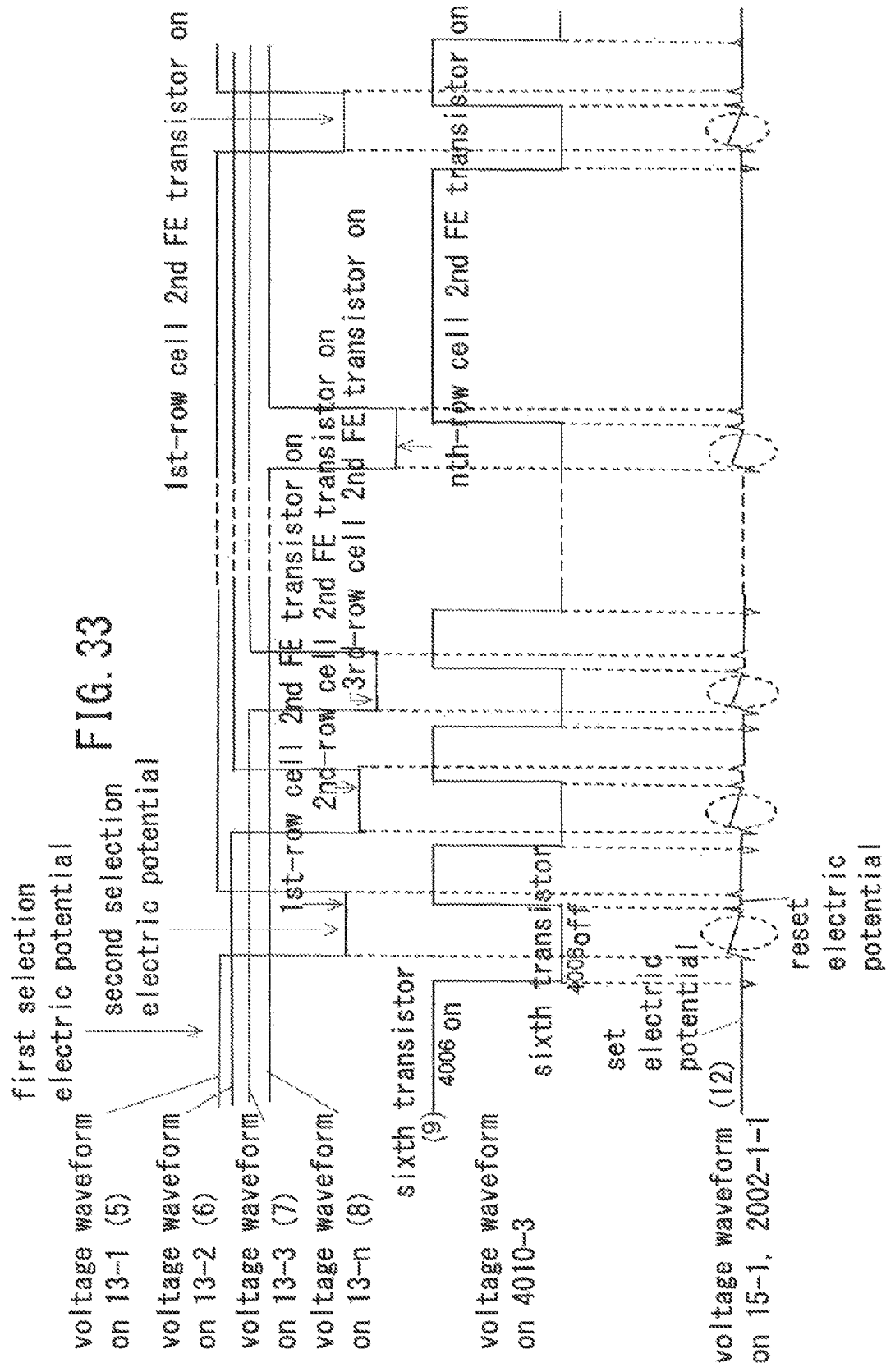
FIG. 33 illustrates the waves of the operating voltage in an embodiment of the sixth electric potential setting circuit illustrated in FIG. 32.

FIG. 33 illustrates an example of voltage waveforms illustrating the operations of the sixth electric potential setting circuit 1. As illustrated by waveforms (5), (6), (7) and (8), the third selection lines 13-$j$ ($j$=1, 2, 3, . . . , m) ($j$ is not illustrated) are driven by voltage pulses which vary sequentially from the first selection electric potential to the second selection electric potential to the first selection electric potential, the electric signals of the variable gain photoelectric conversion cells which are connected to the third selection lines 13-$j$ are read out. The waveforms (5) to (8) illustrate polarities when the second field-effect transistors are p-channel. In this case, the gate of the sixth transistor 4006-$j$ ($j$=1, 2, 3, . . . , m) (not illustrated) of the setting circuit 4010 is driven by a control pulse with a voltage waveform illustrated by (9). This waveform is illustrated with a polarity in case that the sixth transistor is n-channel. The gate is provided with a control pulse for switching on the sixth field-effect transistor 4006-$j$ ($j$=1, 2, 3, . . . , m) at the phase in which the electric potential of the third selection line 13-$j$ ($j$=1, 2, 3, . . . , m) is driven to be the first selection electric potential. It is illustrated in the diagram that the gate is provided with a control pulse for switching on the sixth field-effect transistor 4006-$j$ ($j$=1, 2, 3, . . . , m) even in the latter part of the range in which the electric potential of the third selection line is driven to be the second selection electric potential.

The voltage waveform (12) illustrates the voltage waveform on the third output line 15-1 and the signal input 2002-1-1 of the sense amplifier 2002. Sensing processes are performed at the parts indicated by dotted circles. The same is true for the third output line 15-$j$ ($j$=1, 2, 3, . . . , m) and the input 2002-1-$j$ ($j$=1, 2, 3, . . . , m) of the sense amplifier 2002. The diagram illustrates the polarity of the voltage waveform in case that the sixth field-effect transistors are n-channel.

Figure 34:
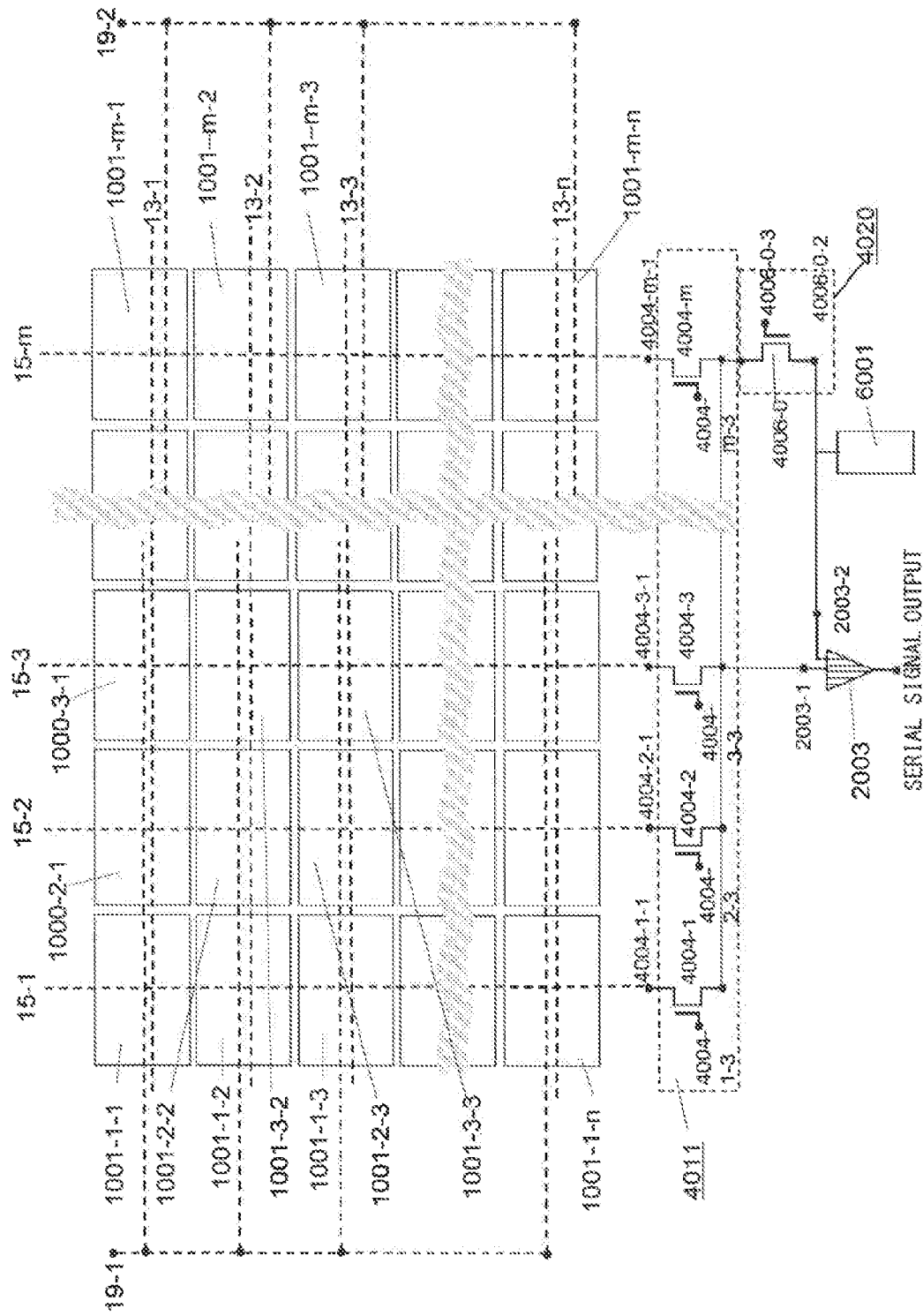
FIG. 34 illustrates an embodiment of the sixth electric potential setting circuit as described in (49).

The circuit diagram using transistor marks in FIG. 34 illustrates a specific example of a sixth electric potential setting circuit as described in (49) used in a variable gain photoelectric conversion array as described in (39). The configurations of the variable gain photoelectric conversion array as described in (39) and the numerals used for the components thereof are the same in FIG. 32.

The reference numeral 4011 denotes a connection circuit. The connection circuit 4011 includes the fourth field-effect transistors 4004-1, 4004-2, 4004-3, . . . , 4004-$m$ and the setting circuit 4020 includes the sixth transistor 4006-0. The connection circuit 4011, the setting circuit 4020 and the sixth electric potential providing means 6001 configure the sixth electric potential setting circuit.

Ones (4004-1-1, 4004-2-1, 4004-3-1, . . . , 4004-$m$-1) of the two outputs (the source or the drain) of the fourth field-effect transistors 4004-1, 4004-2, 4004-3, . . . , 4004-$m$ are each connected to the third output lines 15-1, 15-2, 15-3, . . . , 15-*m* respectively. The others of the outputs of the fourth field-effect transistors 4004-1, 4004-2, 4004-3, . . . , 4004-*m* are all connected to the signal input 2003-1 of the sense amplifier 2003. One (the source or the drain) of the two outputs of the sixth field-effect transistor 4006-0 is connected to the others of the outputs of the plurality of fourth field-effect transistors 4004-1, 4004-2, 4004-3, . . . , 4004-*m* and the other 4006-0-2 of the two outputs is connected to the sixth electric potential providing means 6001. In addition, the sense amplifier 2003 includes a reference input 2003-2 which is connected to the sixth electric potential providing means 6001.

Control voltage pulses for sequentially switching off, on and off the plurality of fourth field-effect transistors are sequentially provided for the gates of the plurality of fourth field-effect transistors, the gate of the sixth field-effect transistor is provided with a control voltage pulse for switching on the sixth field-effect transistor when the fourth transistor is switched off or before the fourth transistor is switched from on to off. In other words, a control electric potential for switching off the sixth field-effect transistor is applied to the gate of the sixth transistor at least when one of the plurality of fourth field-effect transistor is switched from off to on to start the sensing processes.

The control voltage pulses as described above have electric potential variations for driving the fourth field-effect transistor or the sixth field-effect transistor from off to on and vice versa, and are provided at the necessary timings as described above from the control pulse providing block which includes pulse generating circuits such as conventional shift registers for example.

Figure 35:
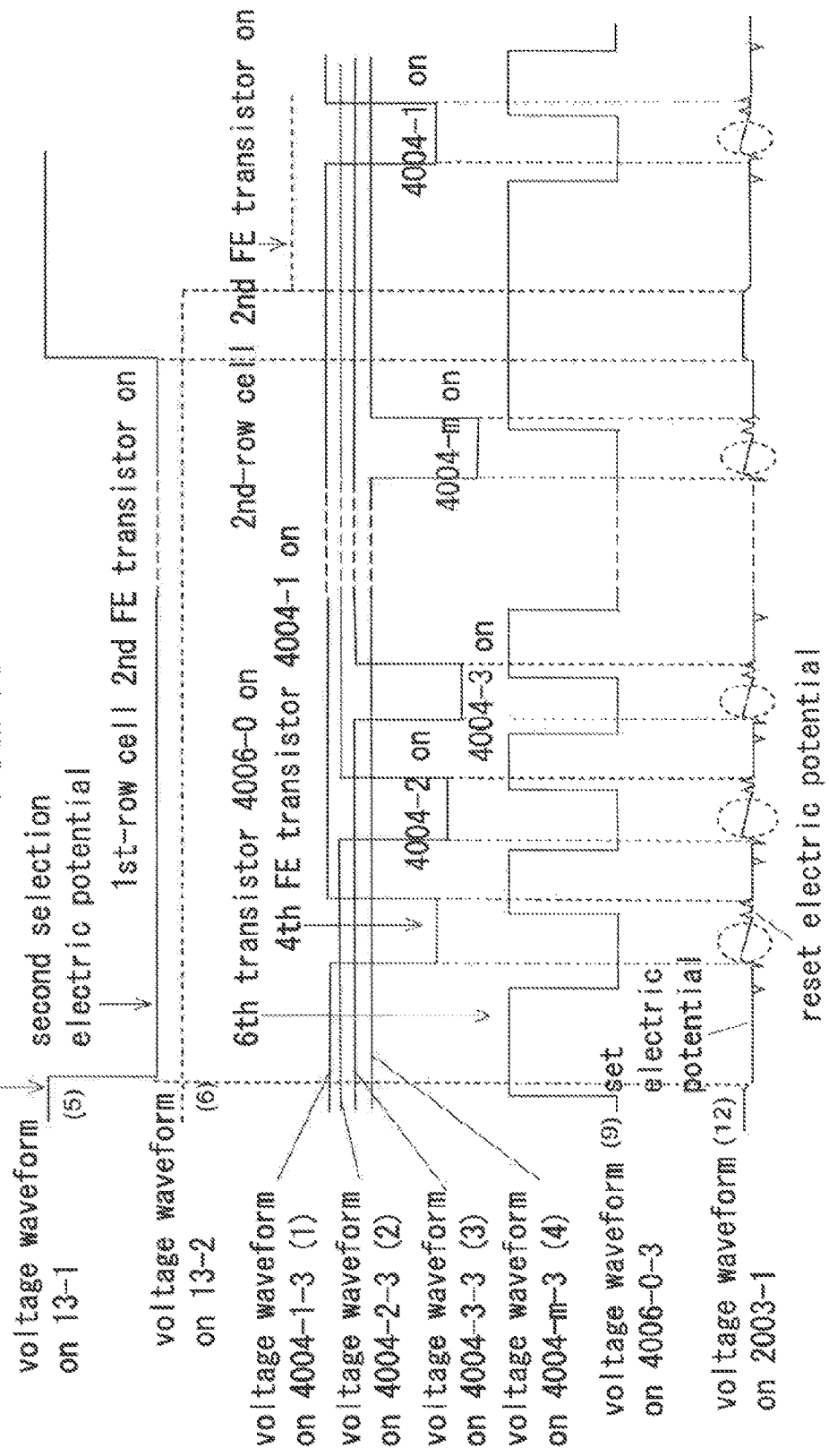
FIG. 35 illustrates the waves of the operating voltage in an embodiment of the sixth electric potential setting circuit illustrated in FIG. 34.

FIG. 35 is an example of voltage waveforms illustrating the operations of the sixth electric potential setting circuit 3. In order to read out electric signals from the variable gain photoelectric cells, first, one of the third selection lines 13-*i* (i=1, 2, 3, . . . , n) is driven from the first selection electric potential to the second selection electric potential. The waveforms (5) and (6) in the diagram illustrates that the third selection line 13-1 is driven and then the third selection line 13-2 is driven.

When one of the third selection lines 13-*i* is driven to the second selection electric potential, voltage pulses for switching the fourth field-effect transistor 4004-*j* from off to on to off are sequentially applied to the gates of the fourth transistors 4004-*j* (j=1, 2, 3, . . . , m) as illustrated by waveforms (1), (2), (3) and (4). Thus, the third output lines 15-*j* (j=1, 2, 3, . . . , m) are sequentially connected to the signal input 2003-1 of the sense amplifier 2003, and then electric signals are read out from the variable gain photoelectric conversion cell located at the intersection point of the third selection line 13-*i* and one of the third output lines 15-*j*. When the fourth field-effect transistor 4004-*j* is in the off state and a gate electric potential is applied to switch on the sixth field-effect transistor, the sixth electric potential is used as a base point and electric signals of the photoelectric conversion cells are transmitted to the signal input of the sense amplifier. The voltage waveform (9) is a waveform with which the sixth field-effect transistor is switched on in the latter part of the range in which the fourth field-effect transistor 4004-*j* is switched on. In this case, the internal cell electric potentials of the variable gain photoelectric conversion cells may be reset after the electric signals are read out.

In the diagram, the polarities of the waveforms are illustrated assuming that the fourth field-effect transistors 4004-*j* are p-channel transistors and the sixth field-effect transistors 4006-0 is n-channel transistors. Although the waveforms and electric potential levels are changed, the polarities of p-channel and n-channel may be interchanged. In the example of FIG. 34, a sense amplifier which may perform a charge amplification to amplify the accumulated electric charge read out to the third output lines at the initial stage of the operation is employed as the sense amplifier 2003. In case of the sixth electric potential setting circuit 3, the time period in which the internal cell electric potentials of the photoelectric conversion cells are reset is limited to the time period in which one of the fourth field-effect transistors is switched on. In order to ensure a long reset time period, the sixth electric potential setting circuit 4 may be configured so that the setting circuit 1 is formed on the other side of the connection circuit in regard to the sense amplifier. One of the source and the drain of one 4006-*j* of the plurality of sixth field-effect transistors is connected to the one of the third output lines 15-*j*, and the other thereof is connected to the sixth electric potential providing means. In this configuration, since the sixth field-effect transistor 4006-*j* may not be switched on in the off state of the fourth field-effect transistor 4004-*j* just before it is switched on, the setting circuit 2 may be necessary for setting the sixth electric potential of the third output line 15-*j* just before the read-out processes are performed. However, setting the sixth electric potential of the third output line 15-*j* may be performed when the reset processes are performed after the off state following the on state of the fourth field-effect transistor 4004-*j*. Therefore, the setting circuit 2 is not always needed if the third output line is maintained at the sixth electric potential until the next read-out process.

Figure 36:
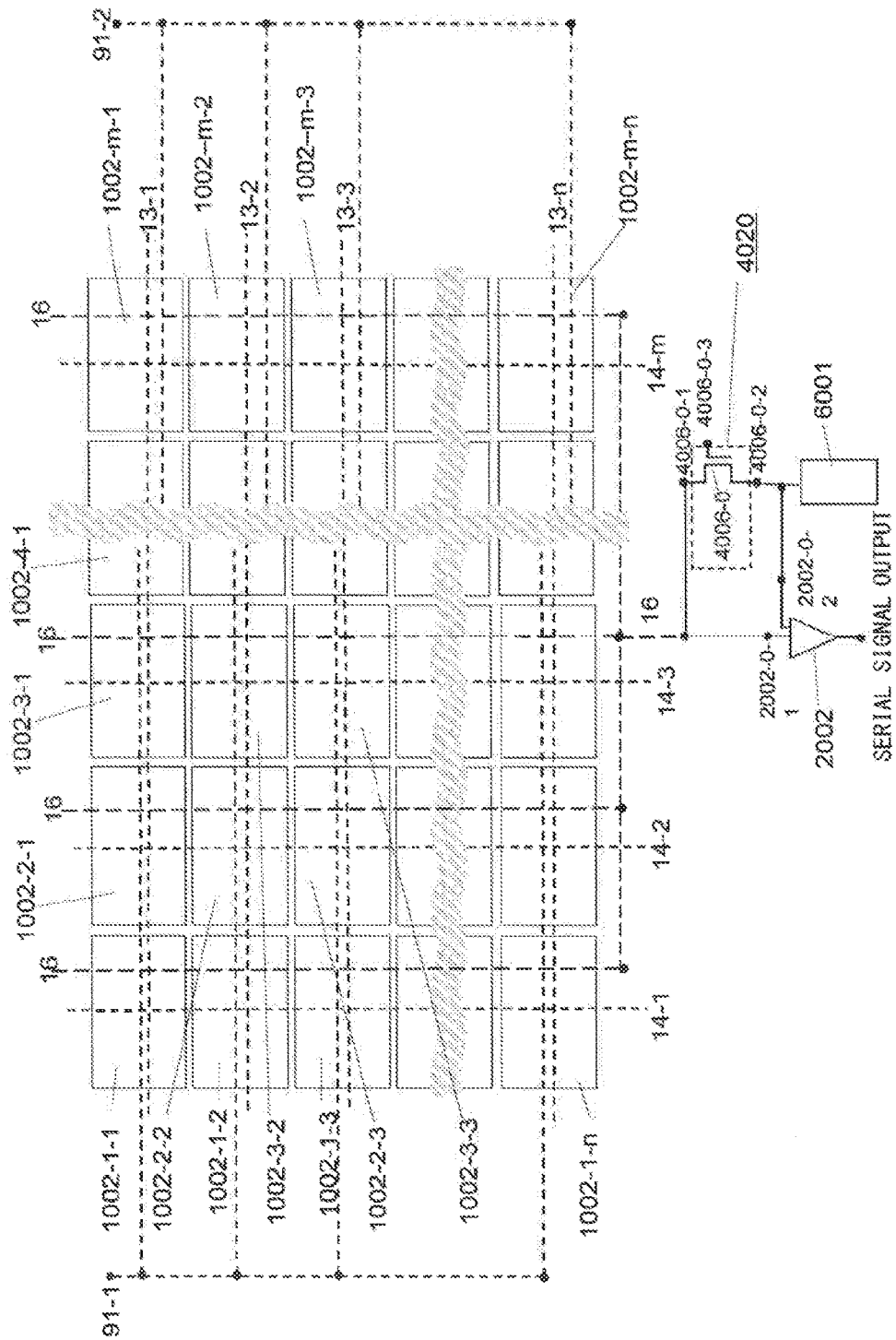
FIG. 36 illustrates an embodiment of the sixth electric potential setting circuit as described in (48).

FIG. 36 illustrates a specific example of the sixth electric potential setting circuit 2 as described in (48) for a variable gain photoelectric conversion array as described in (40).

In the diagram, the reference numerals 1002-*i*-*j* (i=1, 2, 3, . . . , m; j=1, 2, 3, . . . , n; 1002-*i*-*j* itself in not illustrated) denote variable gain photoelectric conversion cells included in a variable gain photoelectric conversion array as described in (40), and the reference numerals 13-*j* (j=1, 2, 3, . . . , n; 13-*j* itself is not illustrated) denote the third selection lines, the reference numerals 14-*i* (i=1, 2, 3, . . . , m; 14-*i* itself is not illustrated) denote the fourth selection lines, and the reference numerals 16 denote the fourth output lines.

The setting circuit 2 (4020) includes the sixth field-effect transistor 4006-0. One output 4006-0-1 of the two outputs (the source and the drain) of the sixth field-effect transistor 4006-0 is connected to the fourth output lines 16, and the other output 4006-0-2 thereof is connected to the sixth electric potential providing means 6001.

The signal input 2002-0-1 of the sense amplifier is connected to the fourth output lines 16 and one 4006-0-1 of the outputs of the sixth field-effect transistor. The reference input 2002-0-2 of the sense amplifier 2002 is connected to the sixth electric potential providing means 6001.

The fourth output lines may be divided into groups such as 16-1, 16-2 and 16-3 each of which includes a plurality of fourth output lines so that a variable gain photoelectric conversion array as described in (40) is divided into several parts to simultaneously read out electric signals from the divided parts. In this case, the setting circuits 2 are provided for each fourth output line group 16-1, 16-2, 16-3, . . . respectively. The sixth electric potential setting circuit 2 includes the setting circuit 2 and the sixth electric providing means.

Control voltage pulses for switching on and off the sixth field-effect transistor are provided for the gate 4006-0-3 of the sixth field-effect transistor.

The control voltage pulse for the switching-on is provided within a part of the time period when the third selection line is at the first selection electric potential and the fourth selection line is at the third selection electric potential. The fourth output line is set in this timing to the sixth electric potential. At a stage before the electric potential of the third selection line is varied from the second selection electric potential to the first selection electric potential when the fourth selection line is set at the fourth selection electric potential or before the electric potential of the fourth selection line is varied from the fourth selection electric potential to the third selection electric potential when the third selection line is set at the second selection electric potential, the control voltage pulse for the switching-on is provided for the gate of the sixth transistor. The latter case is effective for resetting the cell electric potentials in the photoelectric conversion cells.

The control voltage pulses as described above have the electric potential variations for driving the sixth transistor from off to on and vice versa, and are provided at the necessary timings as described above from the control pulse providing block which includes pulse generating circuits such as conventional shift registers for example.

Figure 37:
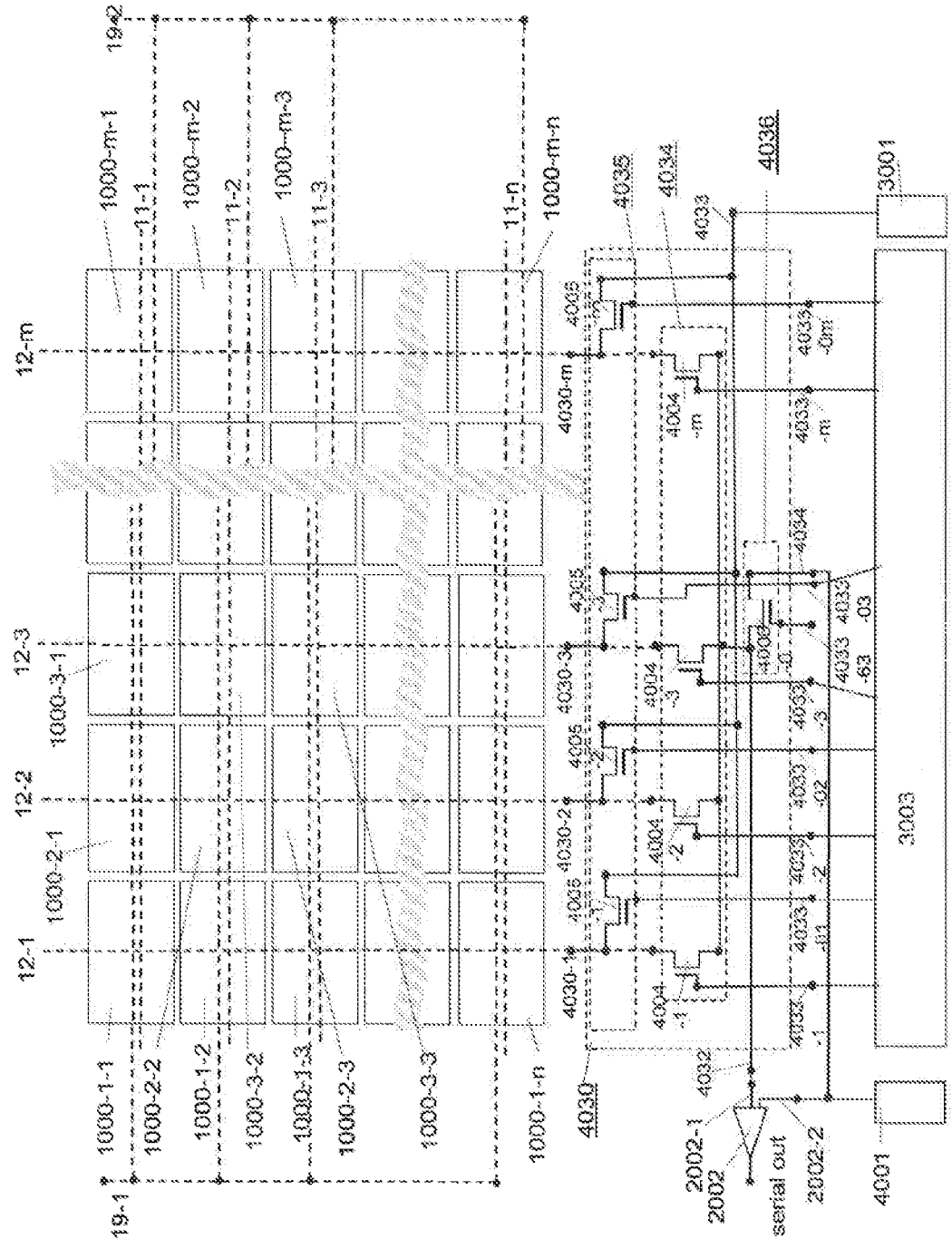
FIG. 37 is a circuit diagram in an embodiment of an electric signal sensing control circuit as described in (51).

FIG. 37 illustrates an example in which an electric signal sensing control circuit as described in (51) is illustrated at a transistor circuit level. The electric signal sensing control circuit is denoted by the reference numeral 4030.

In FIG. 37, the reference numerals 1000-$i$-$j$ ($i$=1, 2, 3, . . . , m; $j$=1, 2, 3, . . . , n) denote variable gain photoelectric conversion cells included in a variable gain photoelectric conversion array as described in (38), and the reference numerals 11-$j$ ($j$=1, 2, 3, . . . , n) and 12-$i$ ($i$=1, 2, 3, . . . , m) respectively denote the first selection lines and the second selection lines. The reference numerals 4004-1, 4004-2, 4004-3, . . . , 4004-$m$ denote a plurality of fourth field-effect transistors for sequentially connecting and cutting-off between the plurality of second selection lines 12-1, 12-2, 12-3, . . . , 12-$m$ in the variable gain photoelectric conversion array and the sense amplifier 2002, and the fourth field-effect transistors are included in the connection circuit 4034. One of the two output sections (the source and the drain) of the fourth field-effect transistor is connected to the second selection line (12-1, 12-2, 12-3, . . . or 12-$m$) in the variable gain conversion array via the terminal 4030-1, 4030-2, 4030-3, . . . , or 4030-$m$ of the electric signal sensing control circuit 4030. And the other of the output sections of the fourth field-effect transistor 4004-1, 4004-2, 4004-3, . . . , or 4004-$m$ is connected together with the output terminal 4032-0 of the electric signal sensing control circuit 4030 and connected to the signal input terminal 2002-1 of the sense amplifier 2002 via the output terminal 4032.

The reference numerals 4005-1, 4005-2, 4005-3, . . . , 4005-$m$ denote a plurality of fifth transistors for sequentially connecting and blocking between a plurality of second selection lines 12-1, 12-2, 12-3, . . . , 12-$m$ in a variable gain photoelectric conversion array as described in (38) and the third electric potential providing means 3001, and field-effect transistors or bipolar transistors are employed for the fifth transistors, and the fifth transistors are included in an output deselect electric potential setting circuit 4035. One of the two output sections (the source and drain or the emitter and collector) of the fifth transistor 4005-1, 4005-2, 4005-3, . . . , or 4005-$m$ is connected to the second selection line 12-1, 12-2, 12-3, . . . , or 12-$m$ via the terminal 4030-1, 4030-2, 4030-3, . . . , 4030-$m$ of the electric signal sensing control circuit 4030. And the other of the output sections of the fifth field-effect transistor 4005-1, 4005-2, 4005-3, . . . , or 4005-$m$ is connected together with the third electric potential providing means 3001 via the terminal 4033 of the electric signal sensing control circuit 4030.

Pulses for controlling the sequential switching-on and -off of the fourth field-effect transistors 4004-1, 4004-2, 4004-3, . . . , 4004-$m$ and the fifth field-effect transistors 4005-1, 4005-2, 4005-3, . . . , 4005-$m$ are provided from the shift register circuit 3003 for the gates of the fourth field-effect transistors 4004-1, 4004-2, 4004-3, . . . , 4004-$m$ via the terminals 4033-1, 4033-2, 4033-3, . . . , 4033-$m$ respectively, or for the gates or bases of the fifth transistors 4005-1, 4005-2, 4005-3, . . . , 4005-$m$ via the terminals 4033-01, 4033-02, 4033-03, . . . , 4033-0$m$ respectively.

When the combinations of the reference numerals 4004-1 and 4005-1, 4004-2 and 4005-2, 4004-3 and 4005-3, . . . , 4004-$m$ and 4005-$m$, which are the combination of the fourth field-effect transistors 4004-1, 4004-2, 4004-3, . . . , 4004-$m$ and the fifth transistors 4005-1, 4005-2, 4005-3, . . . , 4005-$m$, denote complementary transistors, it is more preferable because the number of pulses provided for the gate or base of the transistor in each combination may be reduced from two to one.

The sixth transistor 4006-0 is a field-effect transistor and included in an output select electric potential setting circuit 4036, one of the two outputs (the source and the drain) thereof is connected to the fourth electric potential providing means 4001 via the terminal 4034 of the electric signal sensing control circuit 4030, and the other thereof is connected to the other of the output sections of the plurality of fourth field-effect transistors 4004-1, 4004-2, 4004-3, . . . , 4004-$m$ and with the signal input 2002-1 of the sense amplifier 2002 via the terminal 4032 of the electric signal sensing control circuit 4030.

The sixth transistor 4006-0 is controlled so as to be switched on by control pulses provided for the gate thereof via the terminal 4033-63 in a part of the time period before one of the plurality of first selection lines is varied from the first electric potential to the second electric potential or after the electric signals are sensed when the electric potential is varied from the first electric potential to the second electric potential. Therefore, setting the electric potentials before the read-out processes are performed to the second selection lines and resetting the internal cell electric potentials in a variable gain photoelectric conversion array as described in (38) may be achieved. When all the first selection lines are set at the first electric potential, any cells are not selected in the variable gain photoelectric conversion array.

It is preferable that the sense amplifier includes the reference input 2002-2 as well as the signal input 2002-1. The reference input 2002-2 is provided with the fourth electric potential from the fourth electric potential providing means 4001 and the signal inputs are sensed at a point near the fourth electric potential in case of the electric current sensing or the electric charge sensing. Thus, it is preferable that the electric signal sensing control circuit 4030 includes a function for setting the input of the sense amplifier to the fourth electric potential in a phase in which no signal is input.

In addition, when each terminal of the electric signal sensing control circuit 4030, the terminal of the sense amplifier 2002, the terminal of the third electric potential providing means 3001 and the terminal of the fourth electric potential providing means 4001 are integrated on the same chip as a variable gain photoelectric conversion array as described in (38) and the like, each terminal may not have a shape of a terminal and is provided in the form in which each part or each block is connected by a continuous conductive thin film. Here, The "terminal" was used to show a boundary of functional blocks for descriptive purpose and the terminals may be intangible in many cases. The terminals are connection points in the circuit diagrams.

On an integrated circuit, the second electric potential providing means, the third electric potential providing means 3001 or the fourth electric potential providing means 4001, and the sixth electric potential providing means 6001 may be a thin film wiring for providing the second electric potential, the third electric potential, the fourth electric potential or the sixth electric potential from an external pad, or may be an power supply circuit for generating the second electric potential, the third electric potential, the fourth electric potential or the sixth electric potential.

INDUSTRIAL USAGE

According to one aspect of the present invention, a silicon LSI technology is employed to achieve a high sensitive, high dynamic range and variable gain photoelectric conversion element, cell and array. Thus, since it is possible to not only improve the performances of general digital cameras but also advantageously image an object having a high contrast ratio as well as image an dark object with a partial high sensitivity with real time. Observation means which is conventionally required in the course of scientific and technological development to visualize the details of a part having a high contrast ratio and a dark part and a security camera and the like may be achieved at low cost.

DESCRIPTION OF REFERENCE NUMERALS

1: First output section
2: Second output section
9: Gain control section
10-1: First field-effect transistor
10-2: Second field-effect transistor
10-3: Third field-effect transistor
11-1, 11-2, 11-3, . . . , 11-$n$: First selection line
12-1, 12-2, 12-3, . . . , 12-$m$: Second selection line
13-1, 13-2, 13-3, . . . , 13-$k$, . . . , 13-$n$: Third selection line
14-1, 14-2, 14-3, . . . , 14-$k$, . . . , 14-$m$: Fourth selection line
15-1, 15-2, 15-3, . . . , 15-$j$, . . . , 15-$m$: Third output line
16: Fourth output line
19-1, 19-2, 19-$k$: Gain control line
23: Third cell output section
24: Fourth cell output section
32: Second cell selection section
33: Third cell selection section
57: One of the third source and the third drain of the third field-effect transistor
58: The other of the third source and the third drain of the third field-effect transistor
59: Third gate of the third field-effect transistor
81: Conductive thin film
90: Supporting substrate
91: Gain control section
100: Amplifying photoelectric conversion part
100-1: First transistor or transistor 100-1
100-2: Transistor 100-2
100-3: Transistor 100-3
101: Photoelectric conversion element
102: Input light
110: First semiconductor region
111: First insulating film
112: Second insulating film
114: Region having the first conductivity type and a higher impurity density
120-1, 120-2, 120-3: Second semiconductor region
123: Contact hole to the second semiconductor region
130-1, 130-2, 130-3: Third semiconductor region
133: Contact hole to the third semiconductor region
140: Fourth semiconductor region
141: Fourth insulating film
142: Fifth insulating film
151: Fifth region
152: Sixth region
153: First gate
154: Seventh region
155: Eighth region
156: Second gate
1000-$i$-$j$: Variable gain photoelectric conversion cell included in a variable gain photoelectric conversion array as described in (38)
1001-$i$-$j$: Variable gain photoelectric conversion cell included in a variable gain photoelectric conversion array as described in (39)
1002-$i$-$j$: Variable gain photoelectric conversion cell included in a variable gain photoelectric conversion array as described in (40)
2002: Sense amplifier with reference input
2003: Sense amplifier with reference input
2010: First cell electric potential
3000: Scan circuit
3001: Third electric potential providing means
3003: Scan circuit such as shift register
4001: Fourth electric potential providing means
4004-1, 4004-2, 4004-3, . . . , 4004-$m$: Fourth field-effect transistor
4005-1, 4005-2, 4005-3, . . . , 4005-$m$: Fifth transistor
4006-0, 4006-1, 4006-2, 4006-3, . . . , 4006-$m$: Sixth field-effect transistor
4010: Setting circuit
4011: Connection circuit
4020: Setting circuit
4030: Electric signal sensing control circuit
4034: Connection circuit
4035: Output deselect electric potential setting circuit
4036: Output select electric potential setting circuit
6001: Sixth electric potential providing means

What is claimed is:
1. A method of varying gain of an amplifying photoelectric conversion device, an amplifying photoelectric conversion cell or an amplifying photoelectric conversion array which includes:
an amplifying photoelectric conversion part including a photoelectric conversion element and one or a plurality of transistor(s) each having a collector, a base and an emitter,
the photoelectric conversion element being connected to a base of a transistor selected from the one or plurality of transistor(s),
the photoelectric conversion element being an element which performs photoelectric conversion of optical information input including light intensity or light wavelength to an electric variable including electric current, electric charge, voltage or electric resistance variation,
at least one of the collector(s) of the one or plurality of transistor(s) being a first output section,
one of the emitter(s) of the one or plurality of transistor(s) being a second output section, the emitter(s) of the one or plurality of transistors other than the second output section being connected to the base(s) of the other transistor(s) further excluding the selected transistor, to the base of which the photoelectric conversion element is connected, and the electric variable resulting from the photoelectric conversion being obtained from the first output section or the second output section as an electric signal in the form of an amplified electric current or electric charge, or transformed and amplified electric current or electric charge, the method comprising:

a step of providing the amplifying photoelectric conversion part with at least a first field-effect transistor having a first source, a first drain and a first gate, and the first source and the first drain of the first field-effect transistor being connected between the emitter of the one or plurality of transistor(s) and the base of the one or plurality of transistor(s), a step of applying a gain control electric potential to the first gate to vary gain of the electric signal obtained from the first output section or the second output section, wherein the first gate of the first field-effect transistor is not connected with the collectors of the one or plurality of transistor(s).

2. A variable gain photoelectric conversion device comprising:

an amplifying photoelectric conversion part including a photoelectric conversion element and one or a plurality of transistor(s) each having a collector, a base and an emitter, the photoelectric conversion element being connected to a base of a transistor selected from the one or plurality of transistor(s), the photoelectric conversion element being an element which performs photoelectric conversion of optical information input including light intensity or light wavelength to an electric variable including electric current, electric charge, voltage or electric resistance variation, at least one of the collector(s) of the one or plurality of transistor(s) being a first output section, one of the emitter(s) of the one or plurality of transistor(s) being a second output section, the emitter(s) of one or plurality of transistors other than the second output section being connected to the bases of the other transistors further excluding the selected transistor, to the base of which the photoelectric conversion element is connected, and the electric variable resulting from the photoelectric conversion being obtained from the first output section or the second output section as an electric signal in the form of an amplified electric current or electric charge, or transformed and amplified electric current or electric charge; and at least a first field-effect transistor having a first source, a first drain and a first gate, the first source and the first drain of the first field-effect transistors being connected between the emitter of the one or plurality of transistor(s) and the base of the one or plurality of transistor(s), wherein a gain control electric potential is applied to the first gate to vary gain of the electric signal obtained from the first output section or the second output section, and the first gate of the first field-effect transistor is not connected with the collectors of the one or plurality of transistor(s).

3. The variable gain photoelectric conversion device according to claim 2, wherein the photoelectric conversion element is a photodiode.

4. The variable gain photoelectric conversion device according to claim 2, wherein the photoelectric conversion element is a photodiode including a collector and a base of the selected transistor.

5. The variable gain photoelectric conversion device according to claim 2, wherein the photoelectric conversion element is a variable photoresistance device of which the electric resistance varies according to the optical information input.

\* \* \* \* \*